United States Patent [19]
Hsia

[11] Patent Number: 5,880,462
[45] Date of Patent: Mar. 9, 1999

[54] KEYING APPARATUS WITH THUMB GAP

[76] Inventor: Chih-Yu Hsia, 301 Warren Way, Arcadia, Calif. 91006

[21] Appl. No.: 518,680

[22] Filed: Aug. 24, 1995

[51] Int. Cl.[6] .................................................. G01V 9/04
[52] U.S. Cl. ......................... 250/221; 250/553; 345/168; 341/22
[58] Field of Search ............................... 250/221, 222.1, 250/227.22, 553; 340/555–557; 345/168, 173; 341/22

[56] References Cited

U.S. PATENT DOCUMENTS

| | | | |
|---|---|---|---|
| 4,384,201 | 5/1983 | Carroll et al. | 250/221 |
| 4,998,014 | 3/1991 | Hasegawa | 250/221 |
| 5,136,156 | 8/1992 | Nounen et al. | 250/221 |
| 5,477,223 | 12/1995 | Destremps | 250/221 |

*Primary Examiner*—Que Le
*Attorney, Agent, or Firm*—William W. Haefliger

[57] ABSTRACT

A photoelectric keyboard switch apparatus comprising a first structure to produce and detect laterally directed and longitudinally spaced first light beams at a first level in a simulated keyboard area, which is open; a second structure to produce and detect longitudinally directed, laterally spaced second light beams at or proximate to the first level, in the area, whereby the first and second light beams produce a grid-like pattern having cross-over nodes; a third structure to produce and detect third light beams at a second level or levels, whereby user's finger interruption of a third beam occurs in conjunction with finger interruption of the first and second beam at or near one or more nodes.

18 Claims, 58 Drawing Sheets

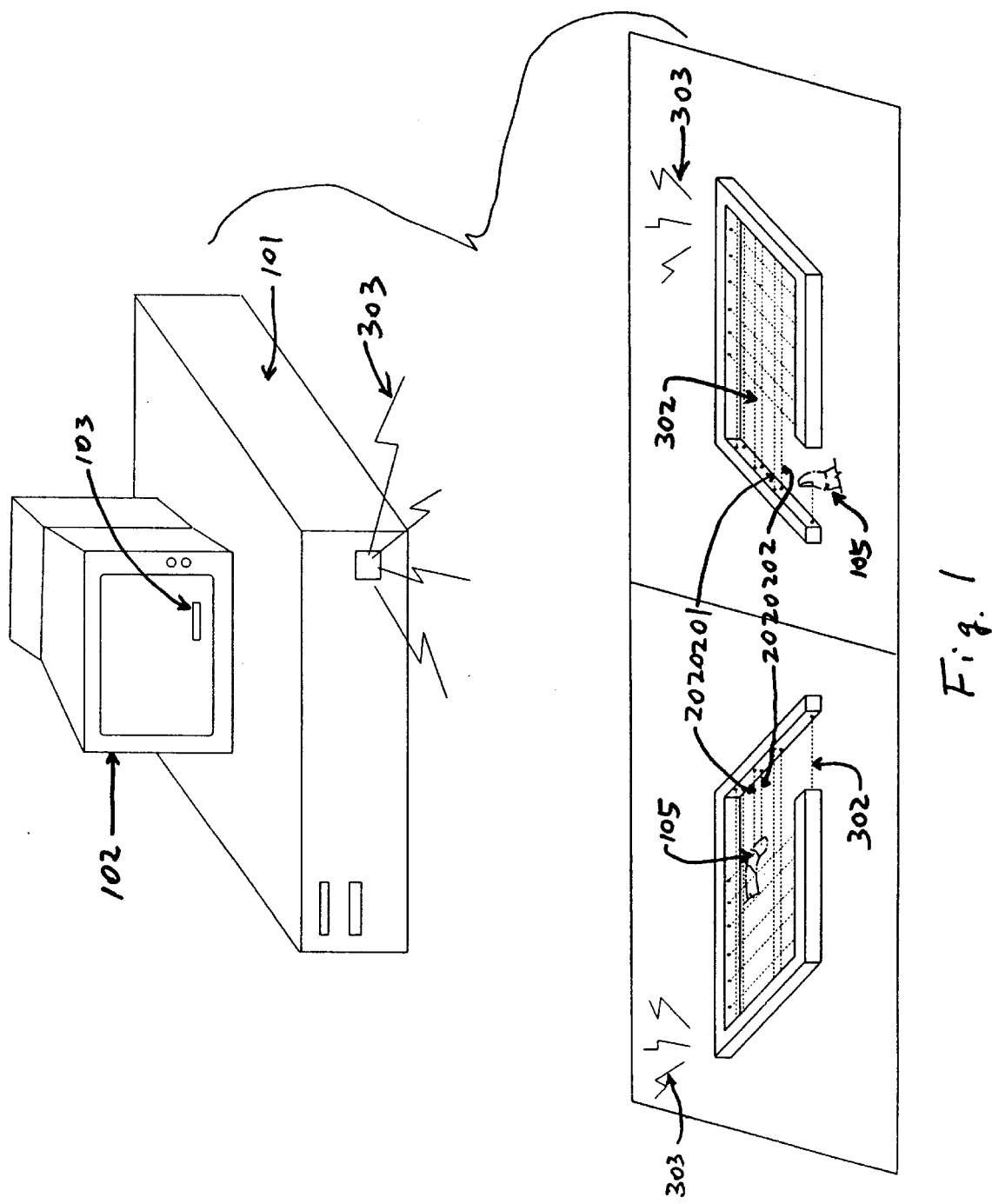

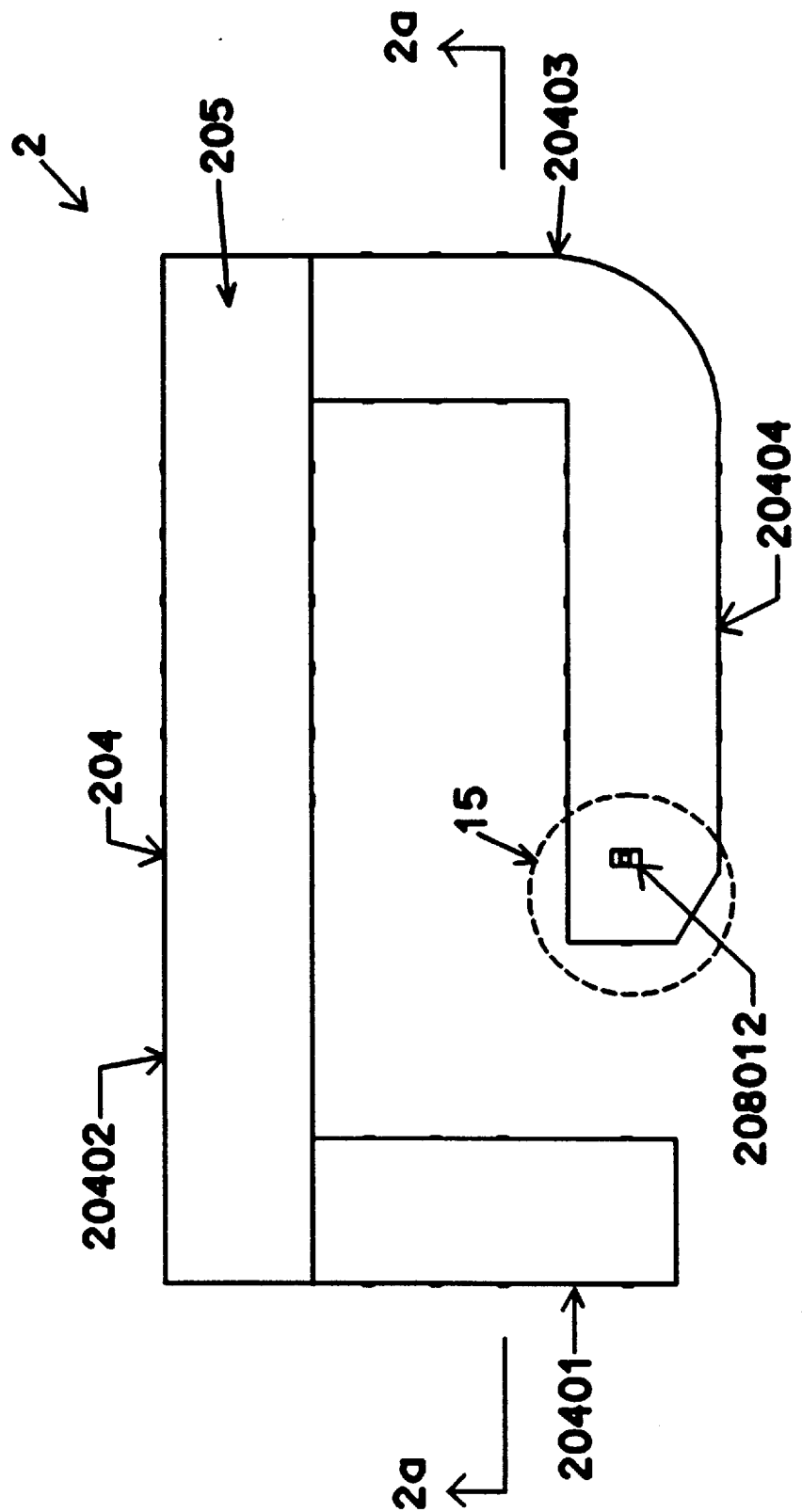

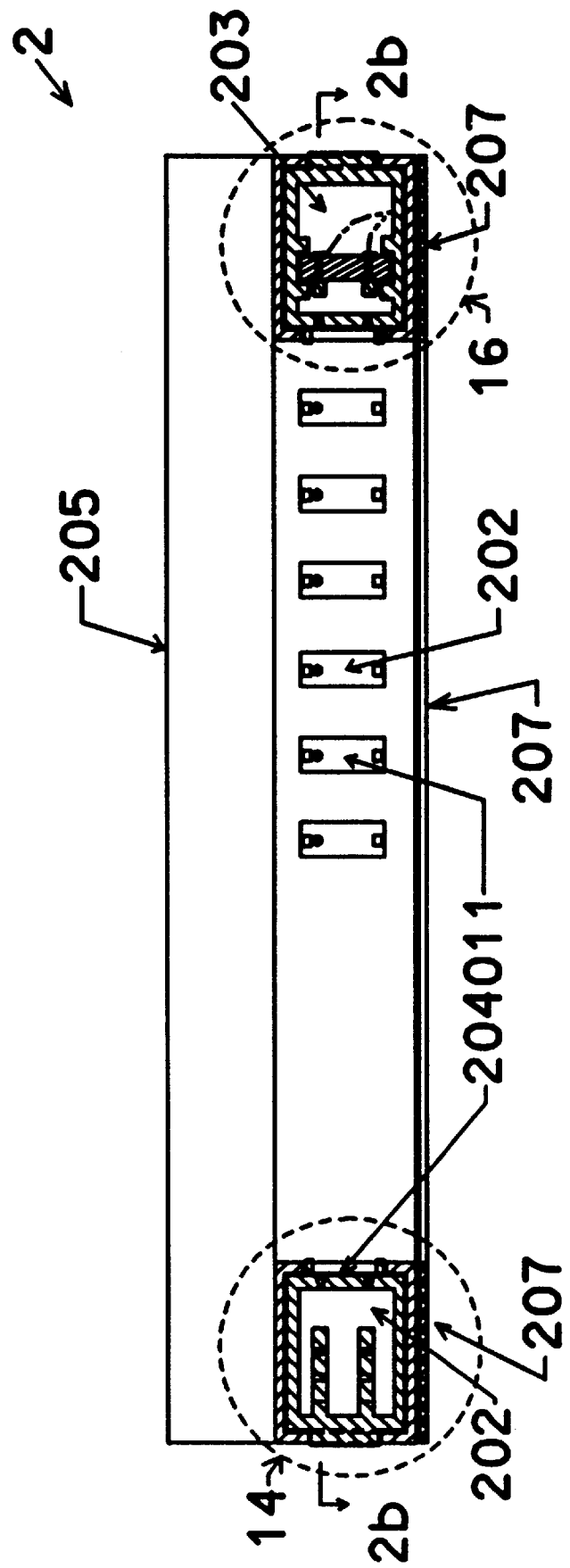

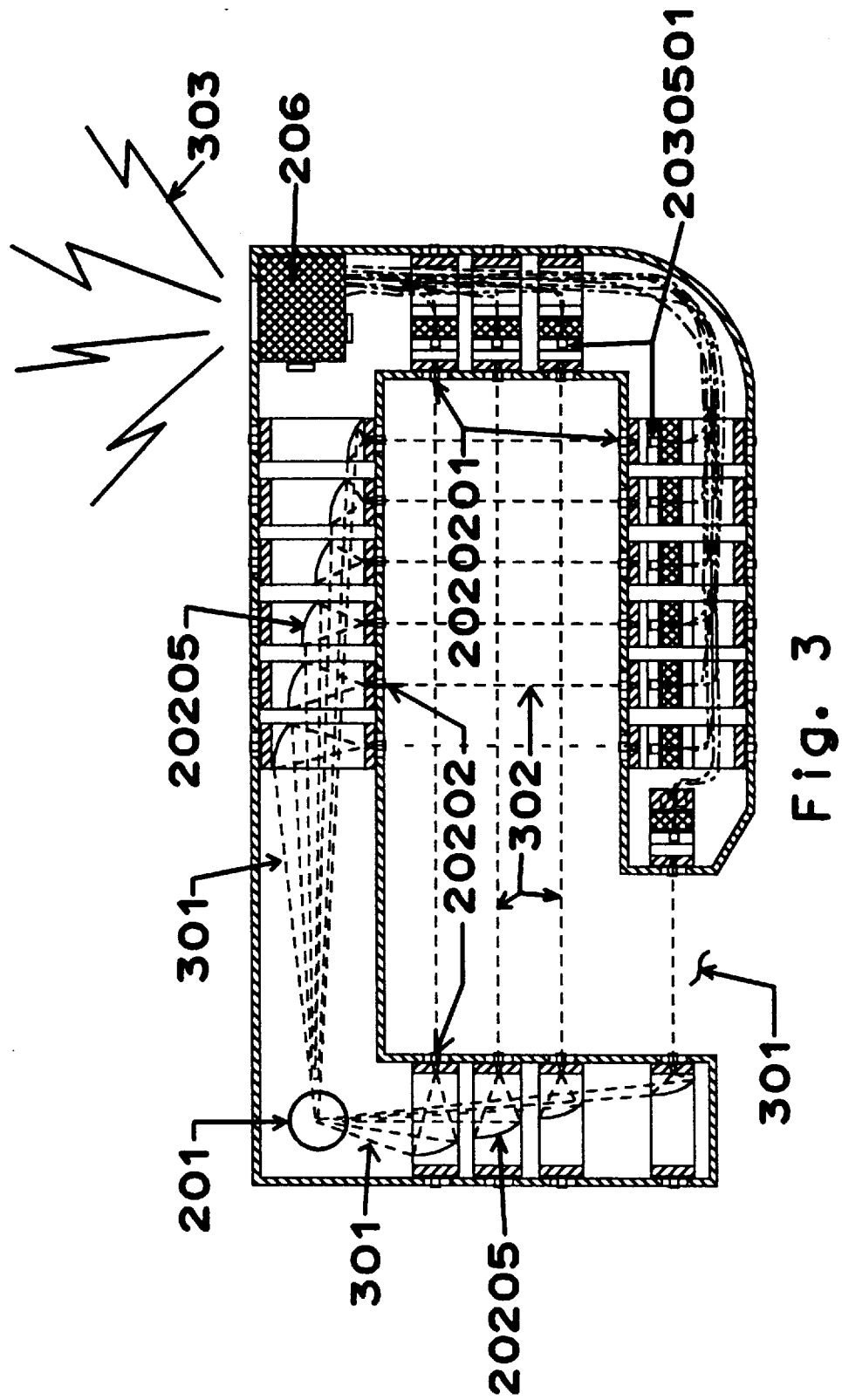

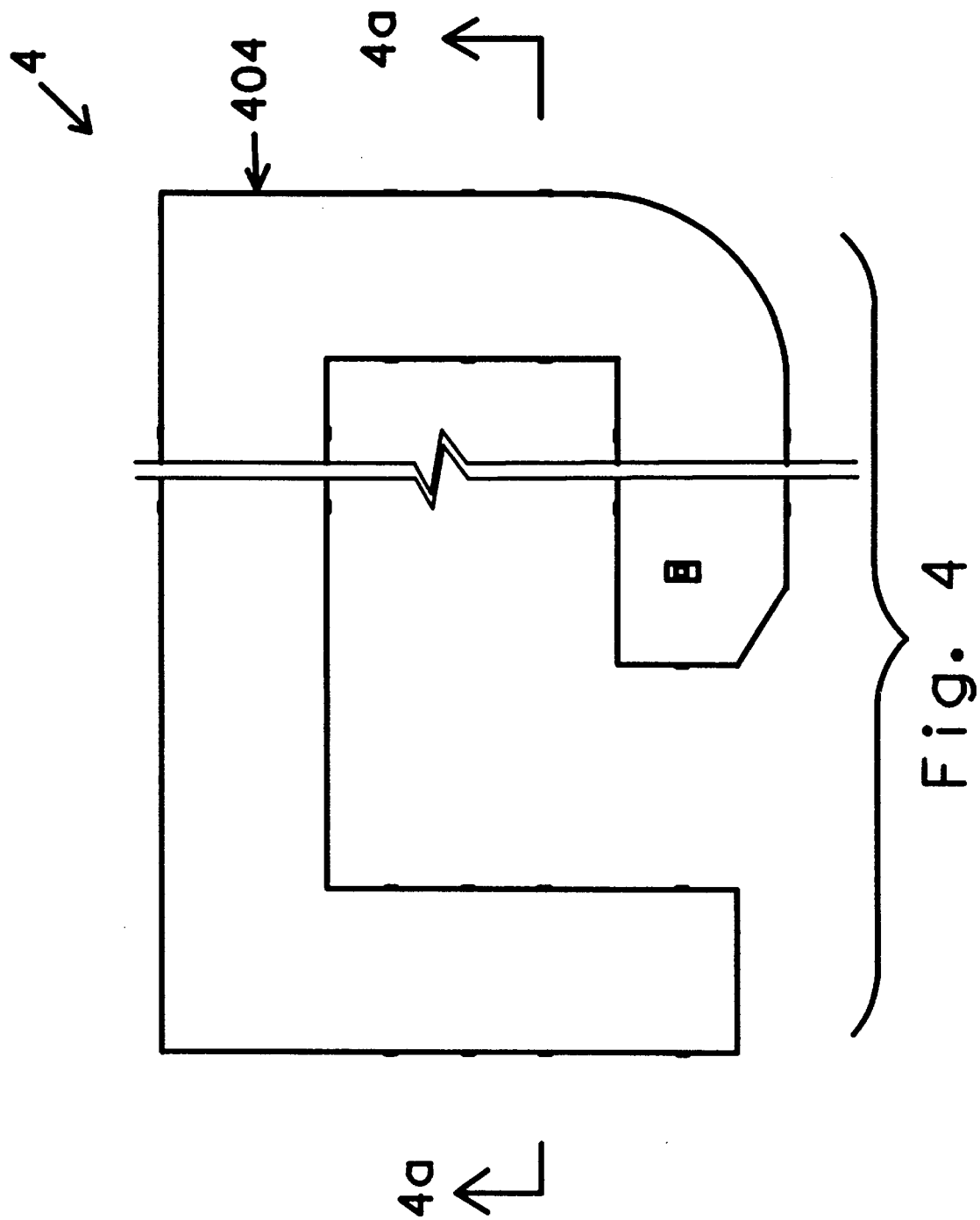

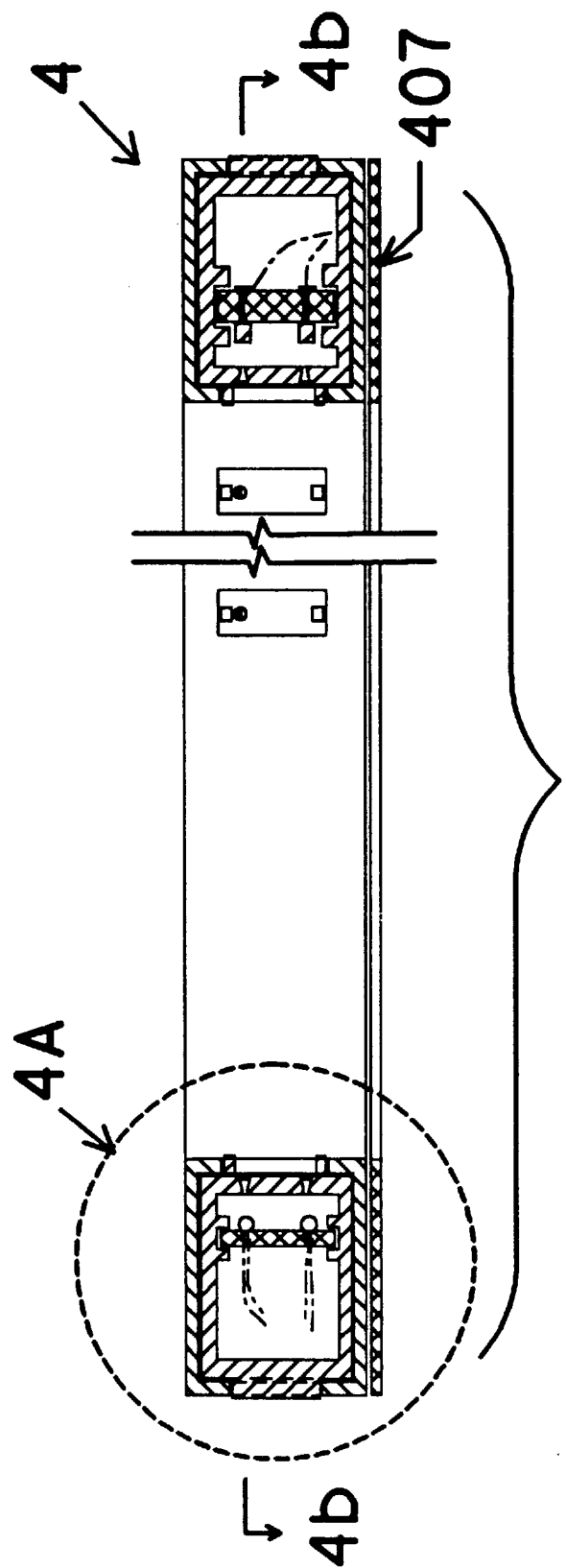

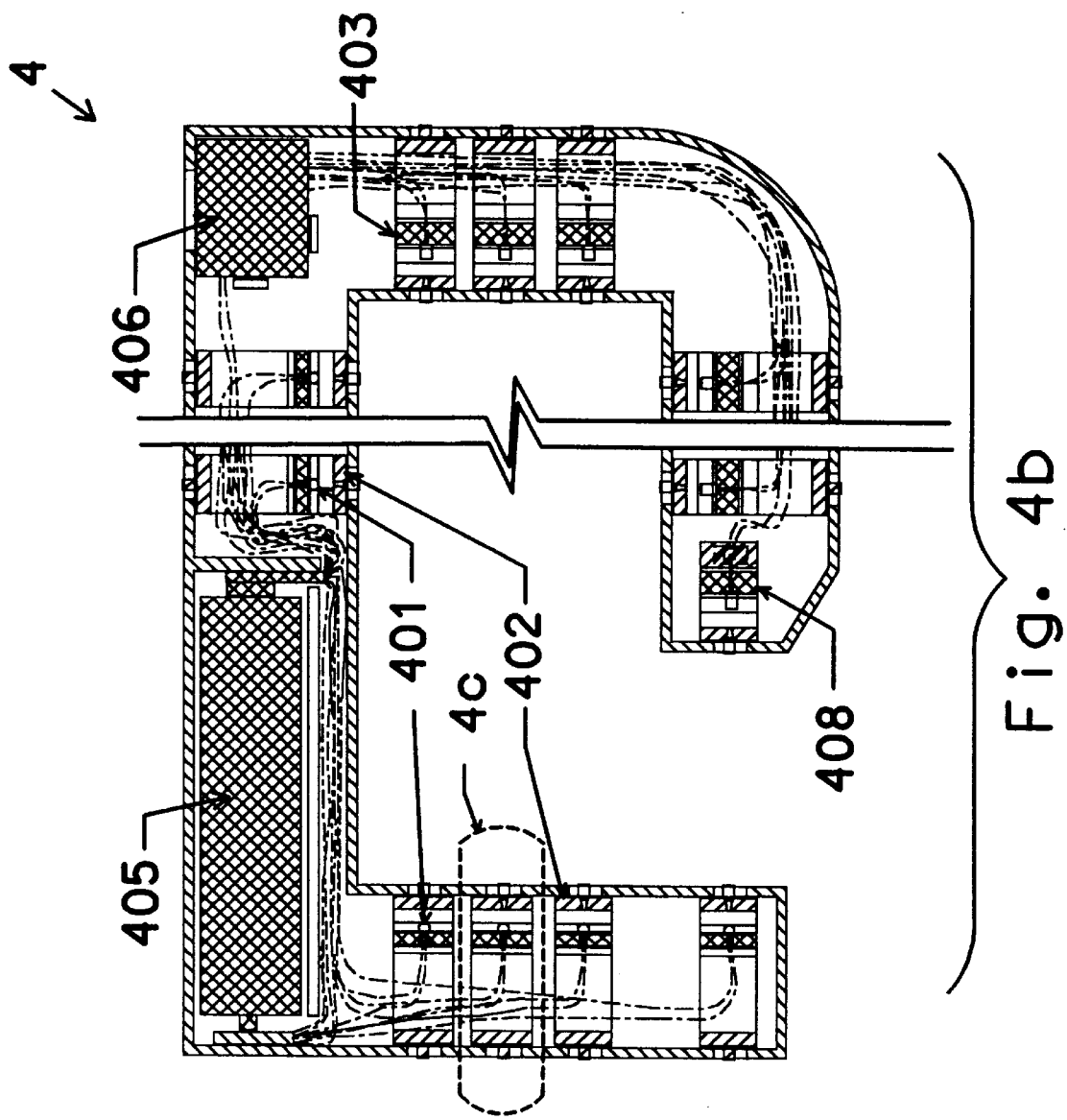

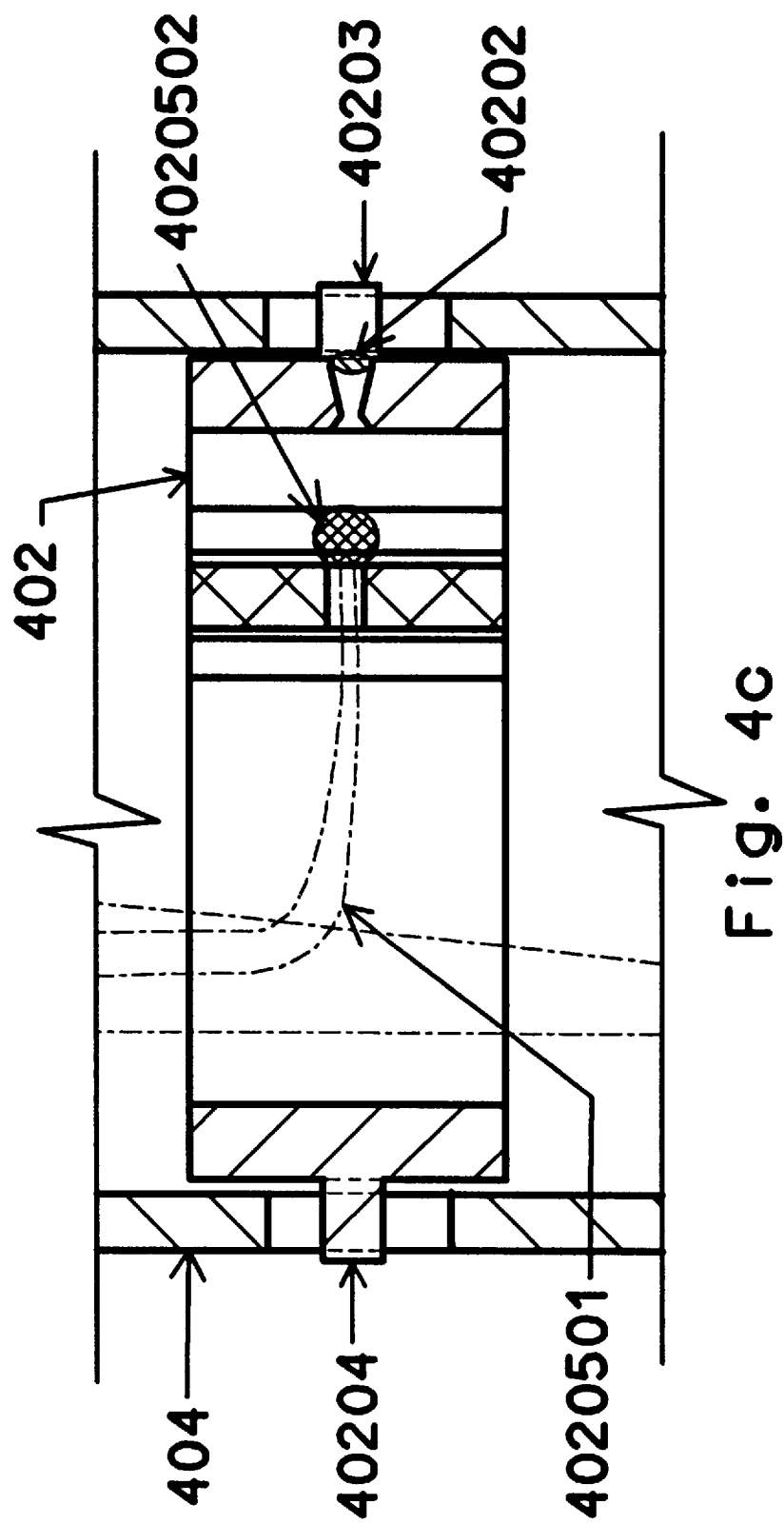

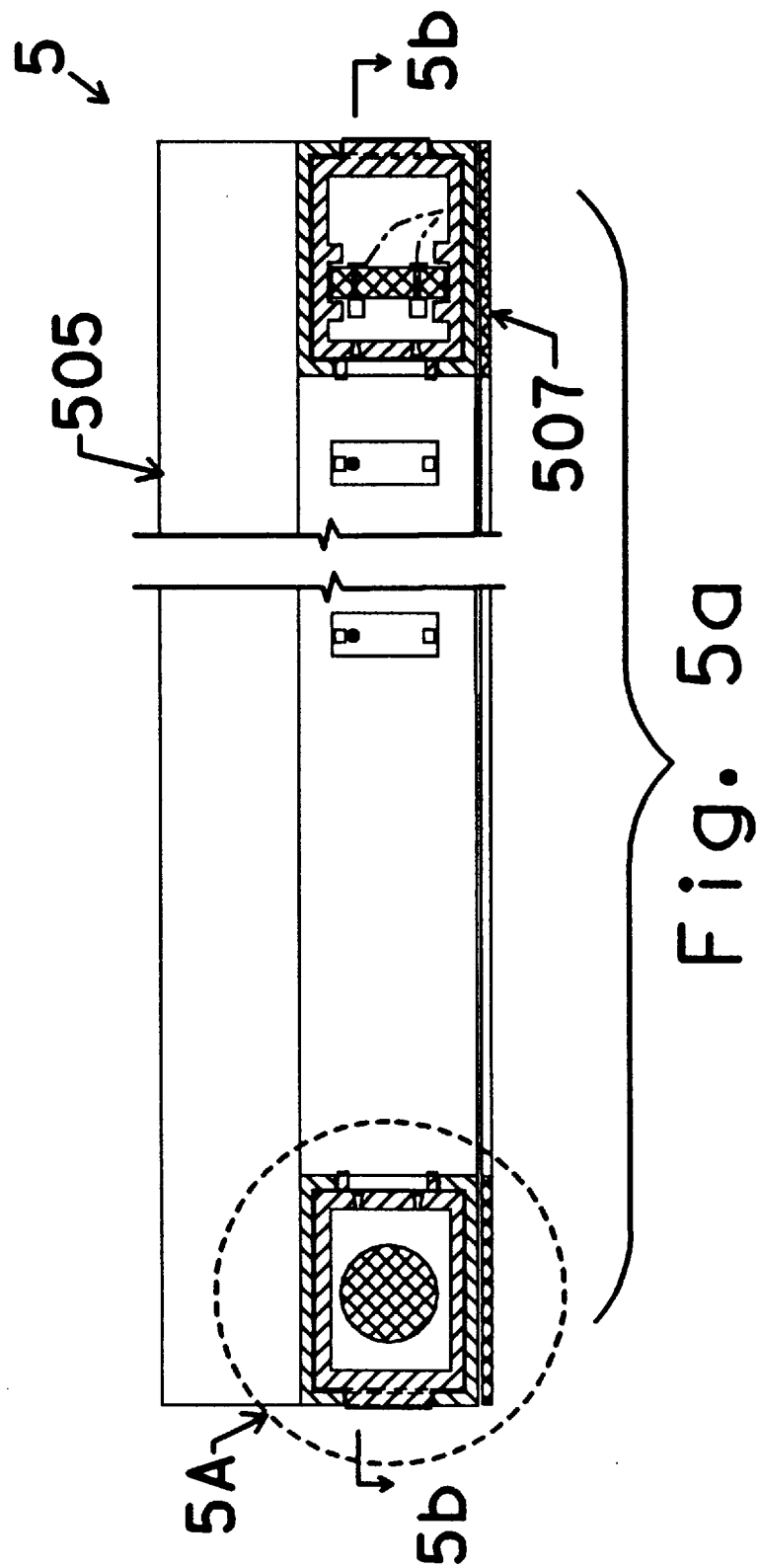

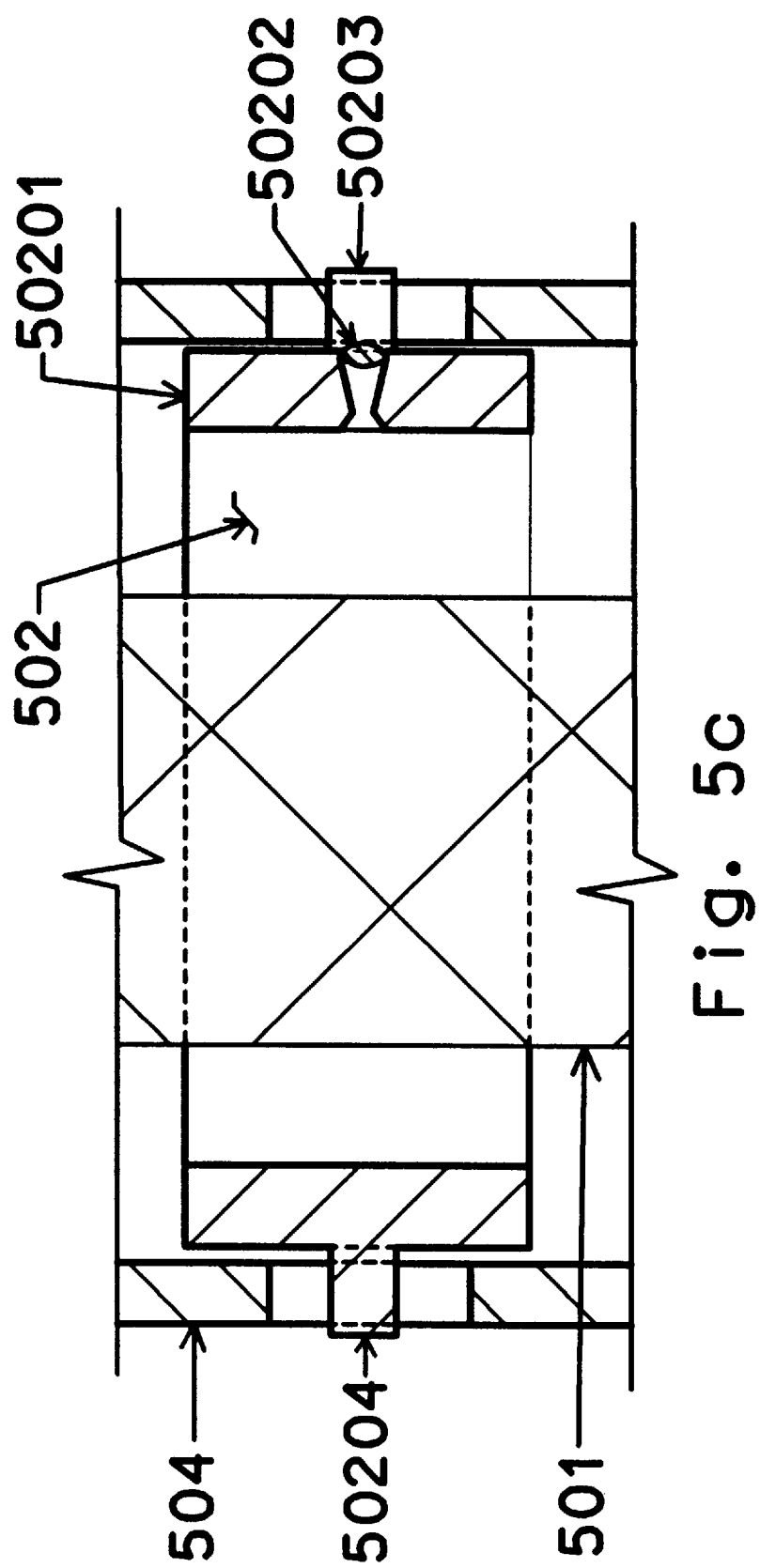

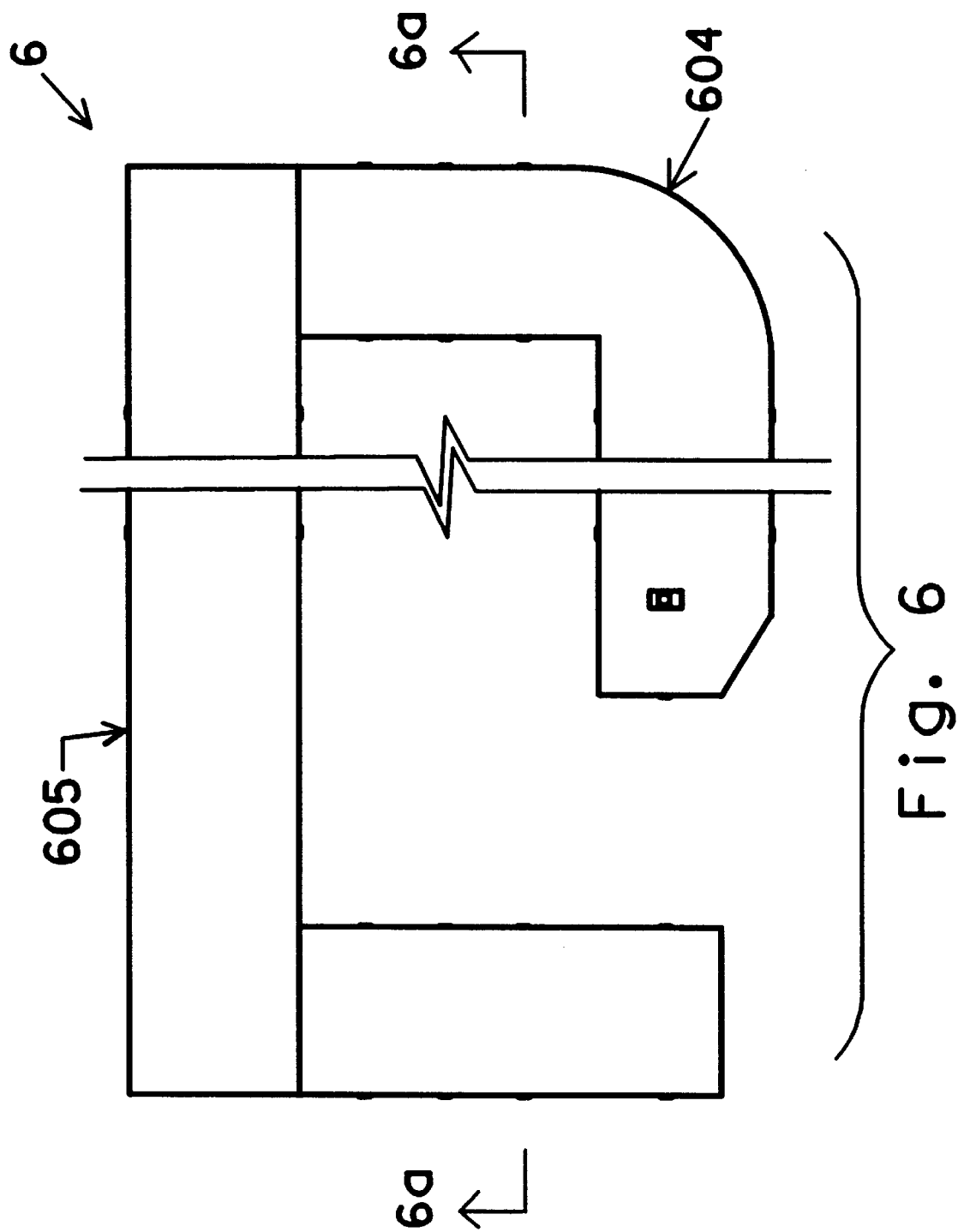

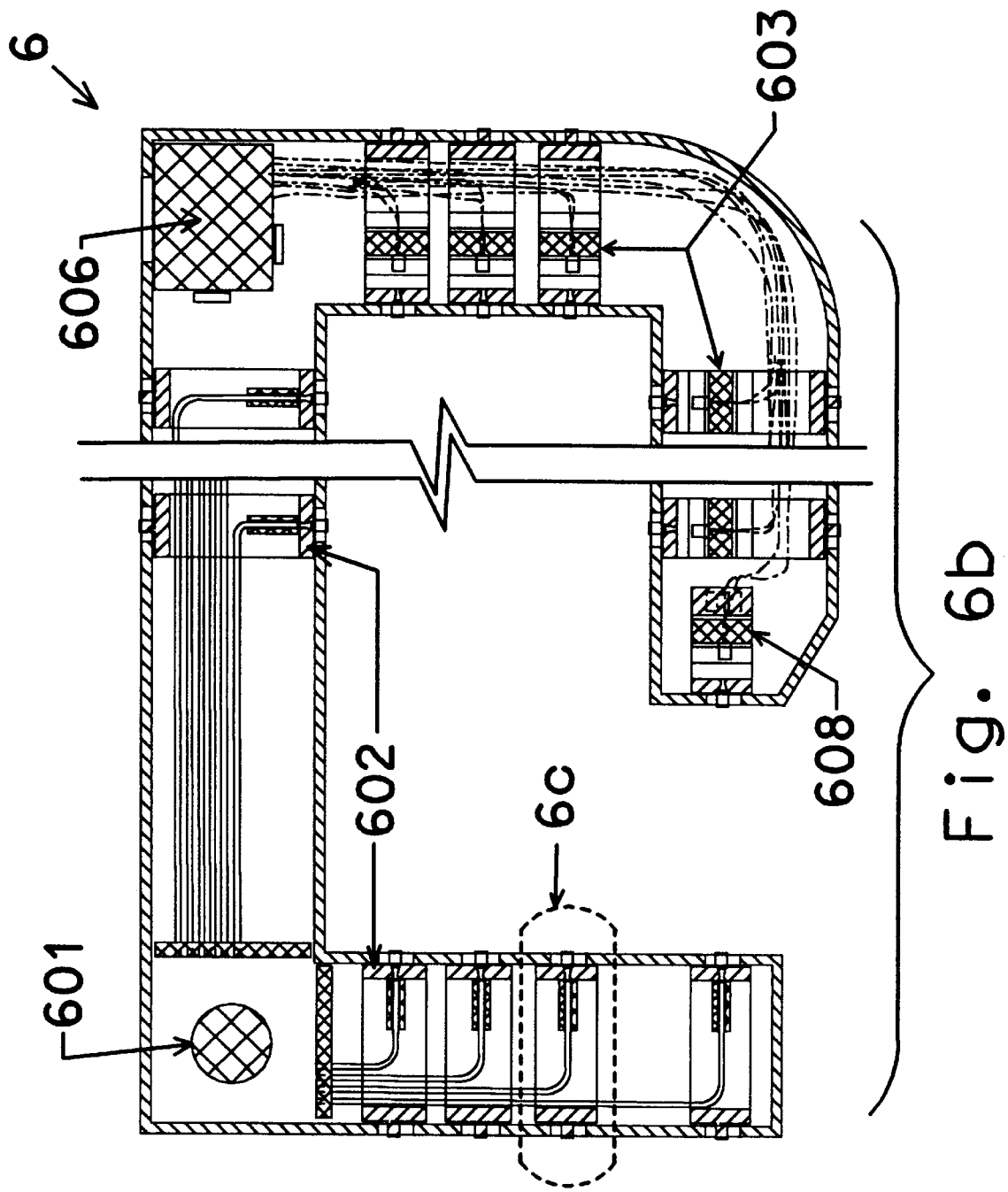

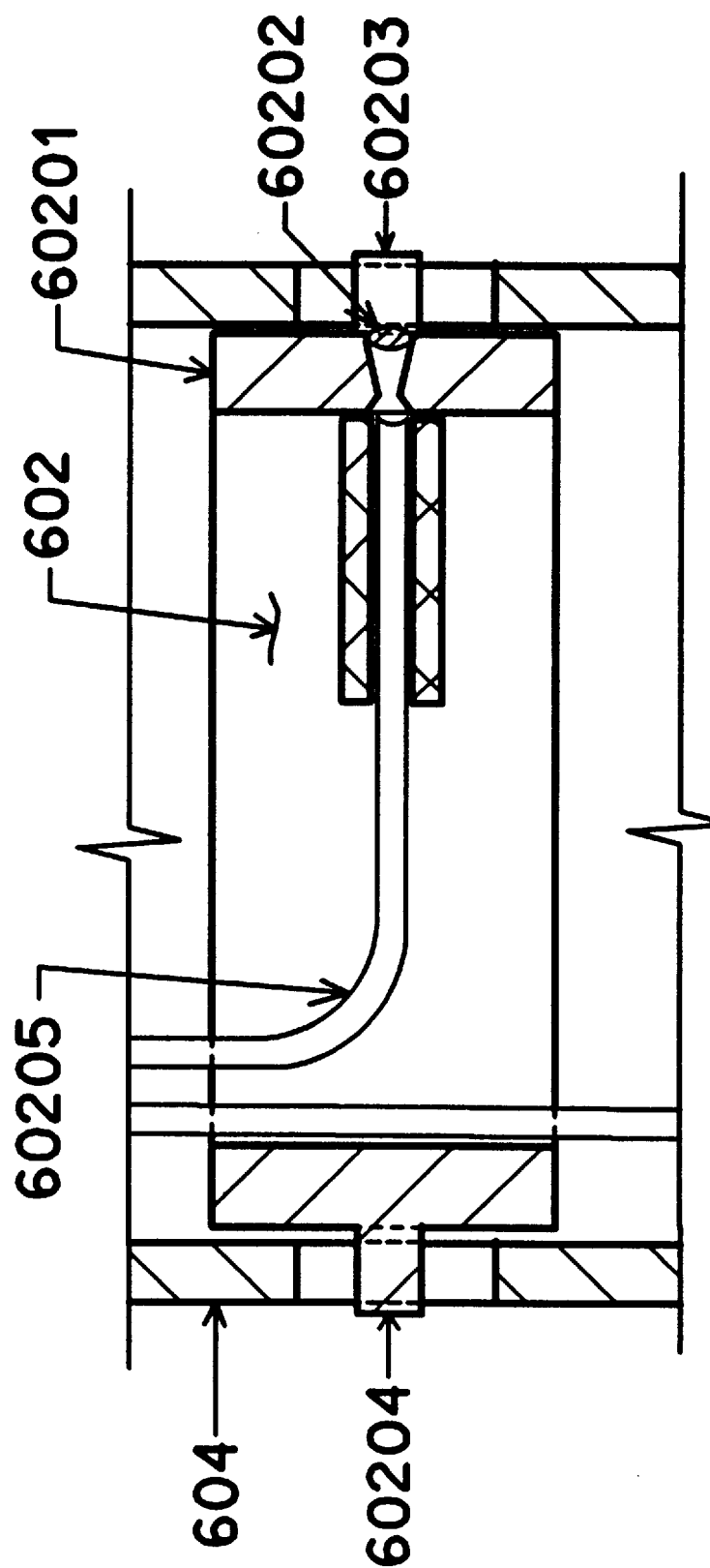

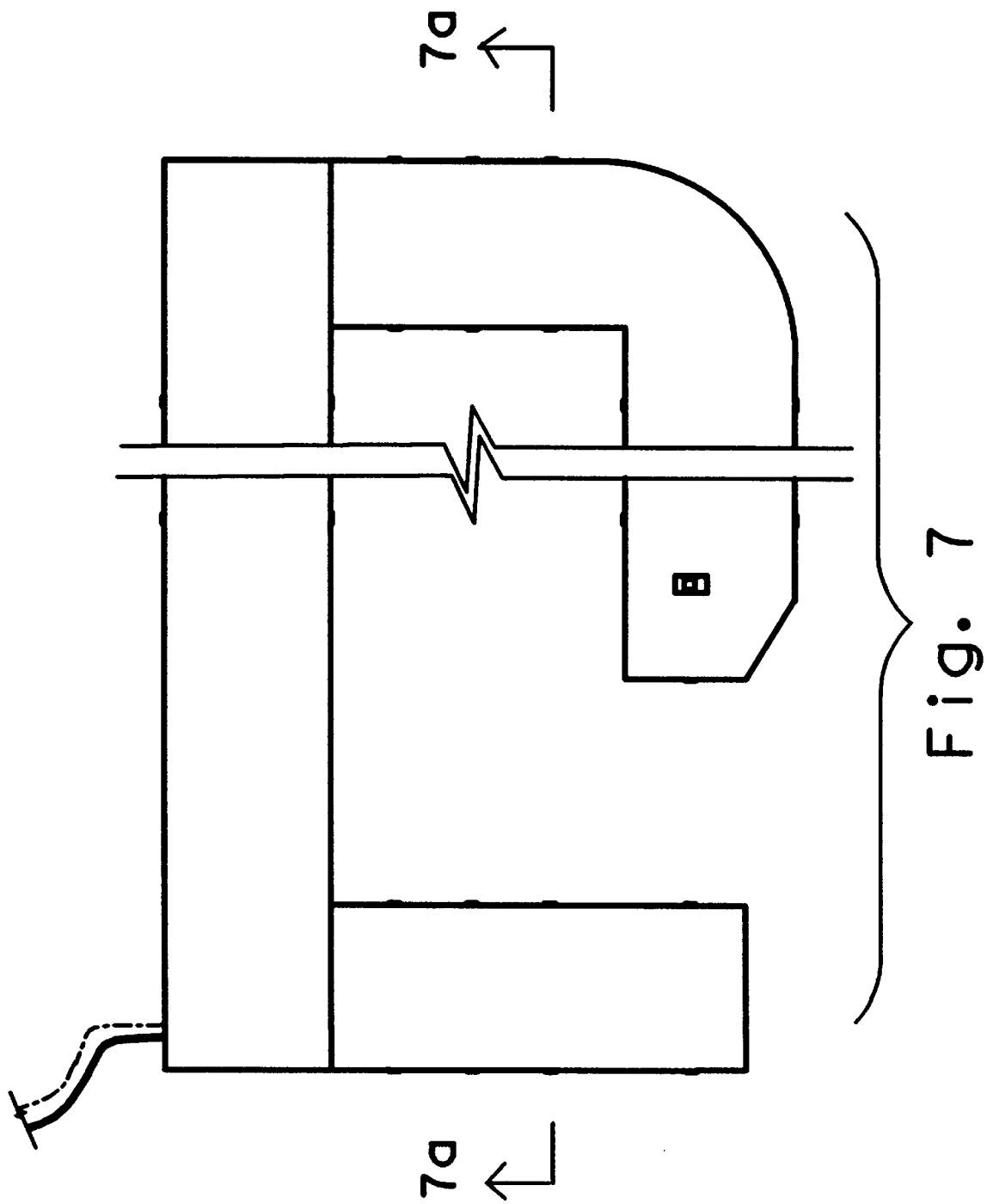

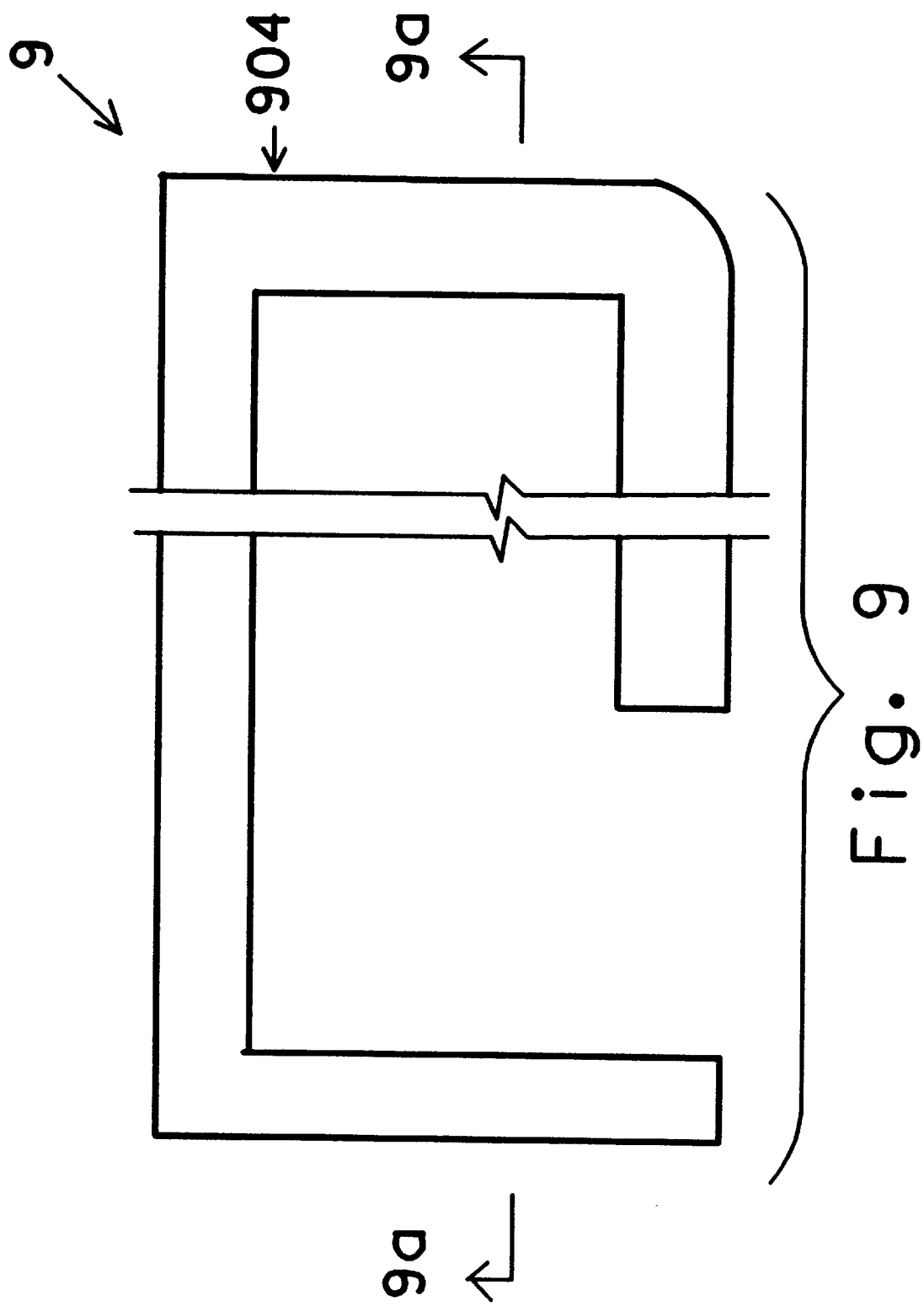

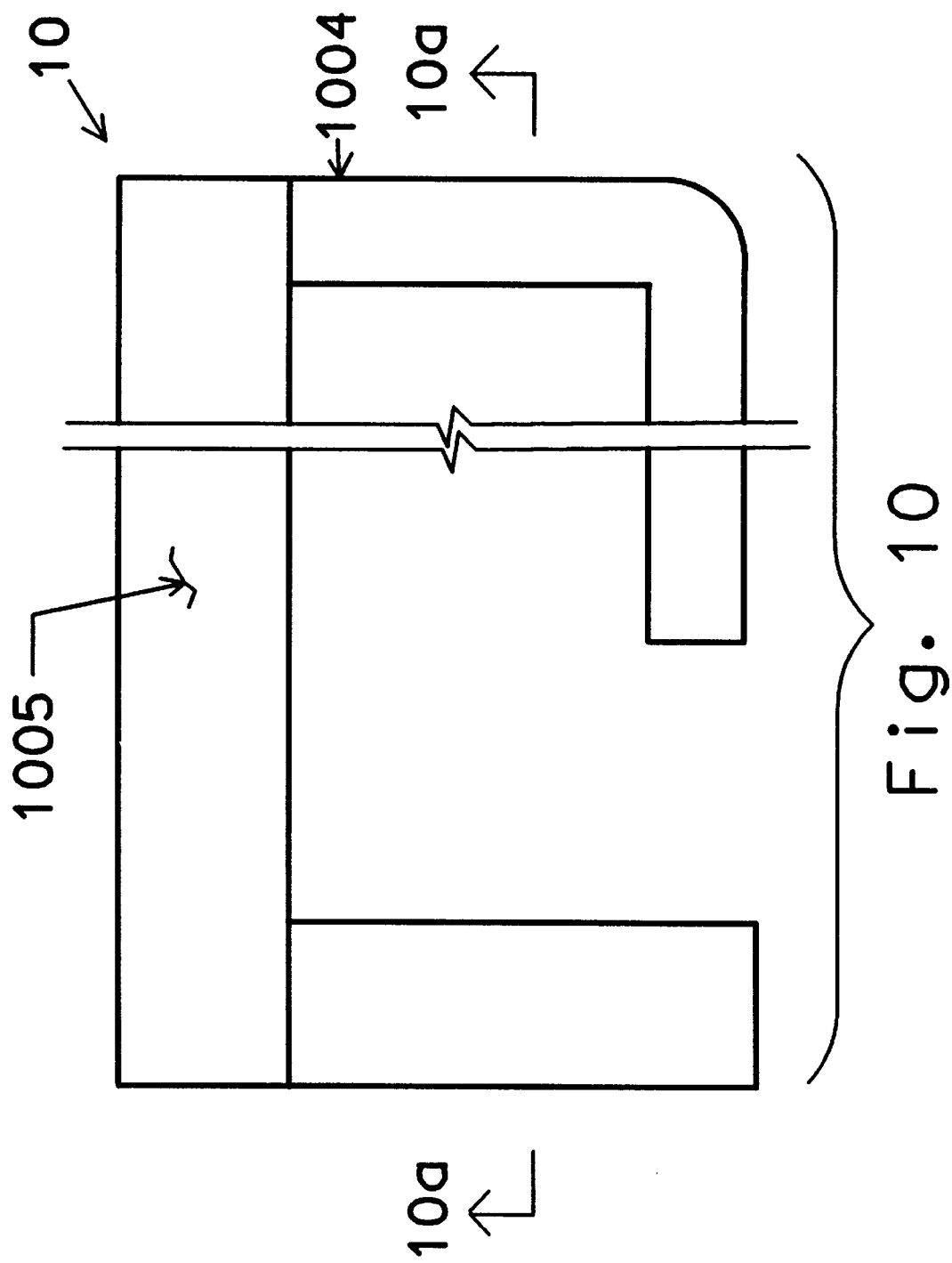

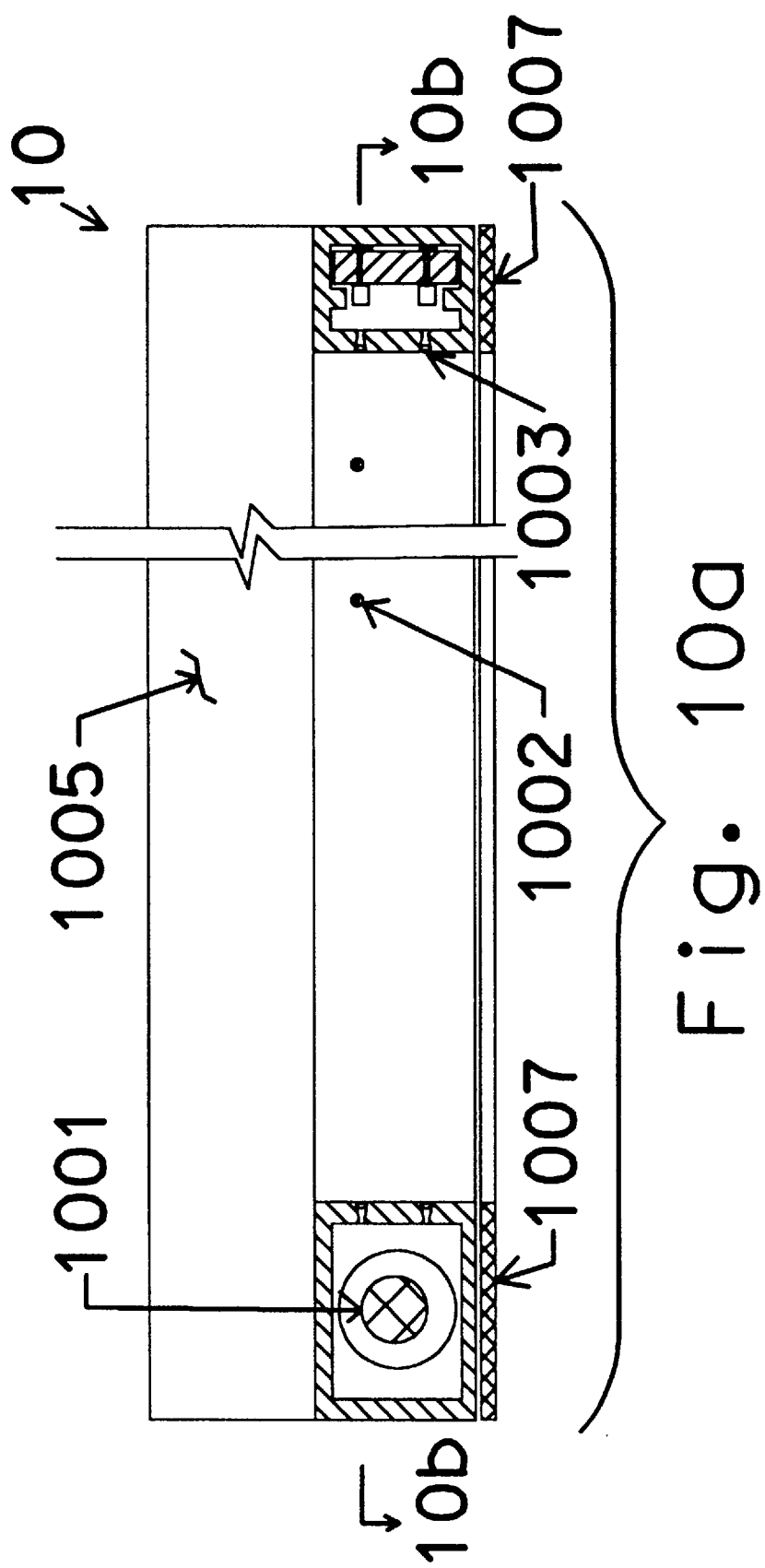

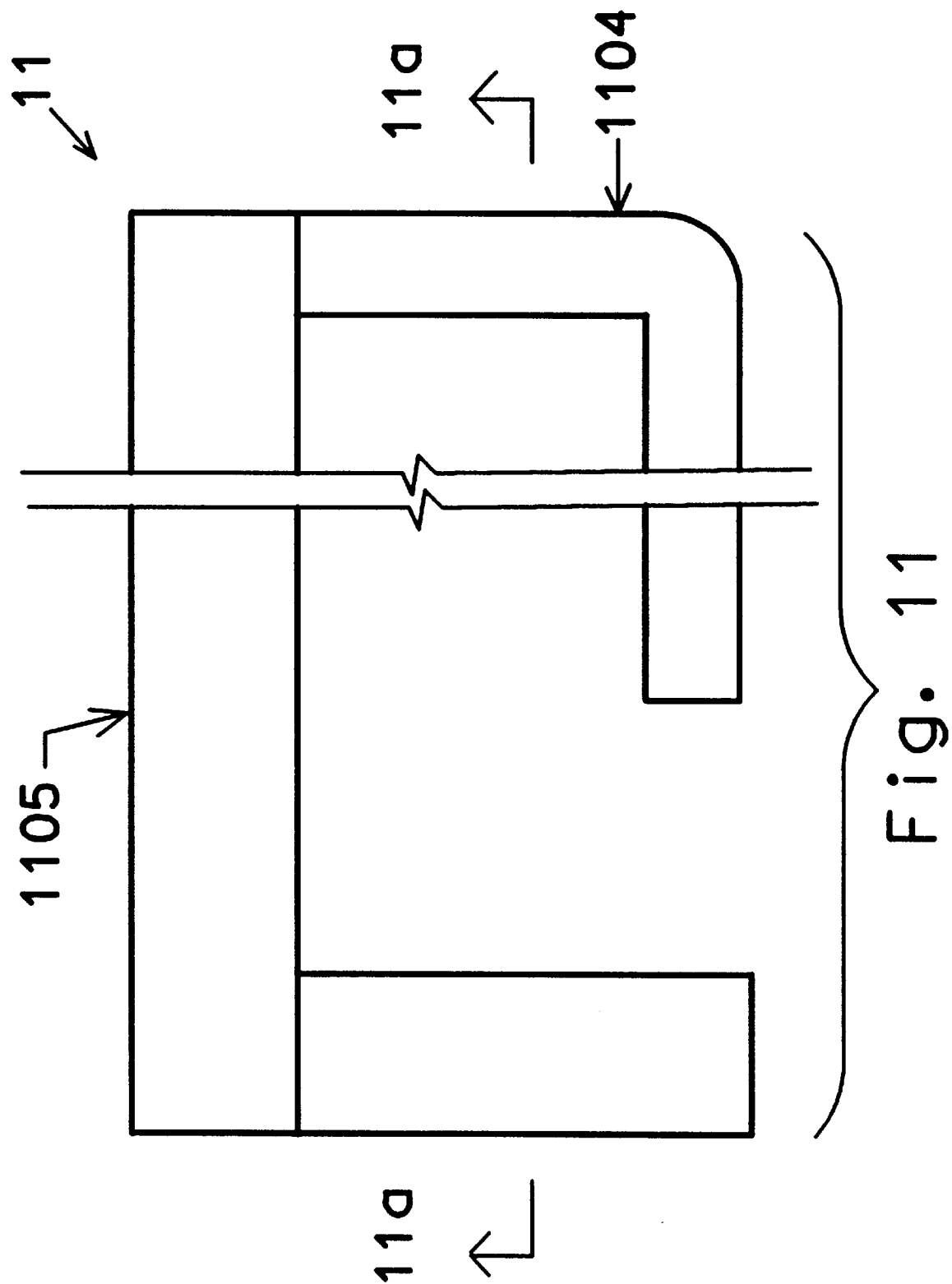

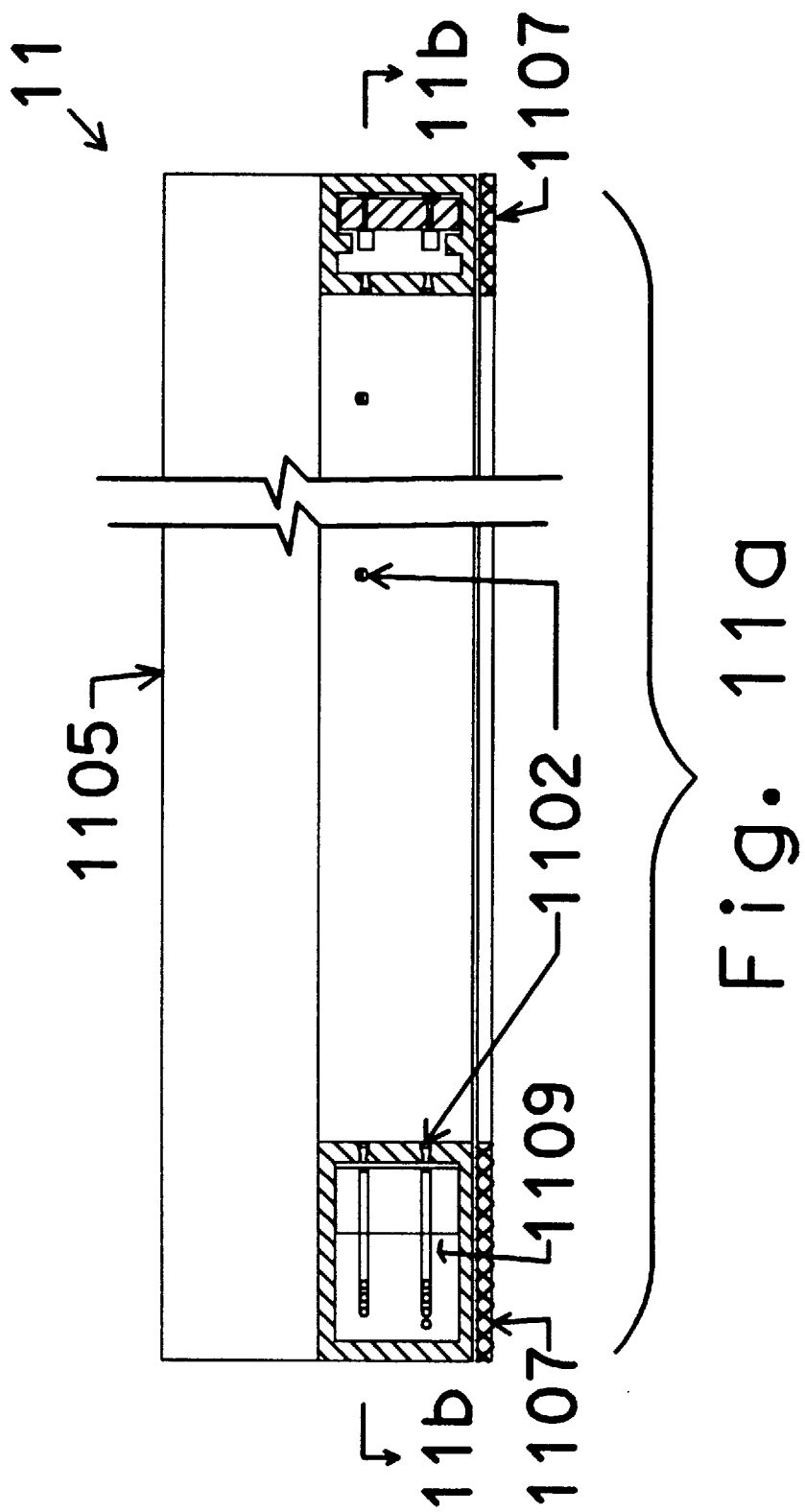

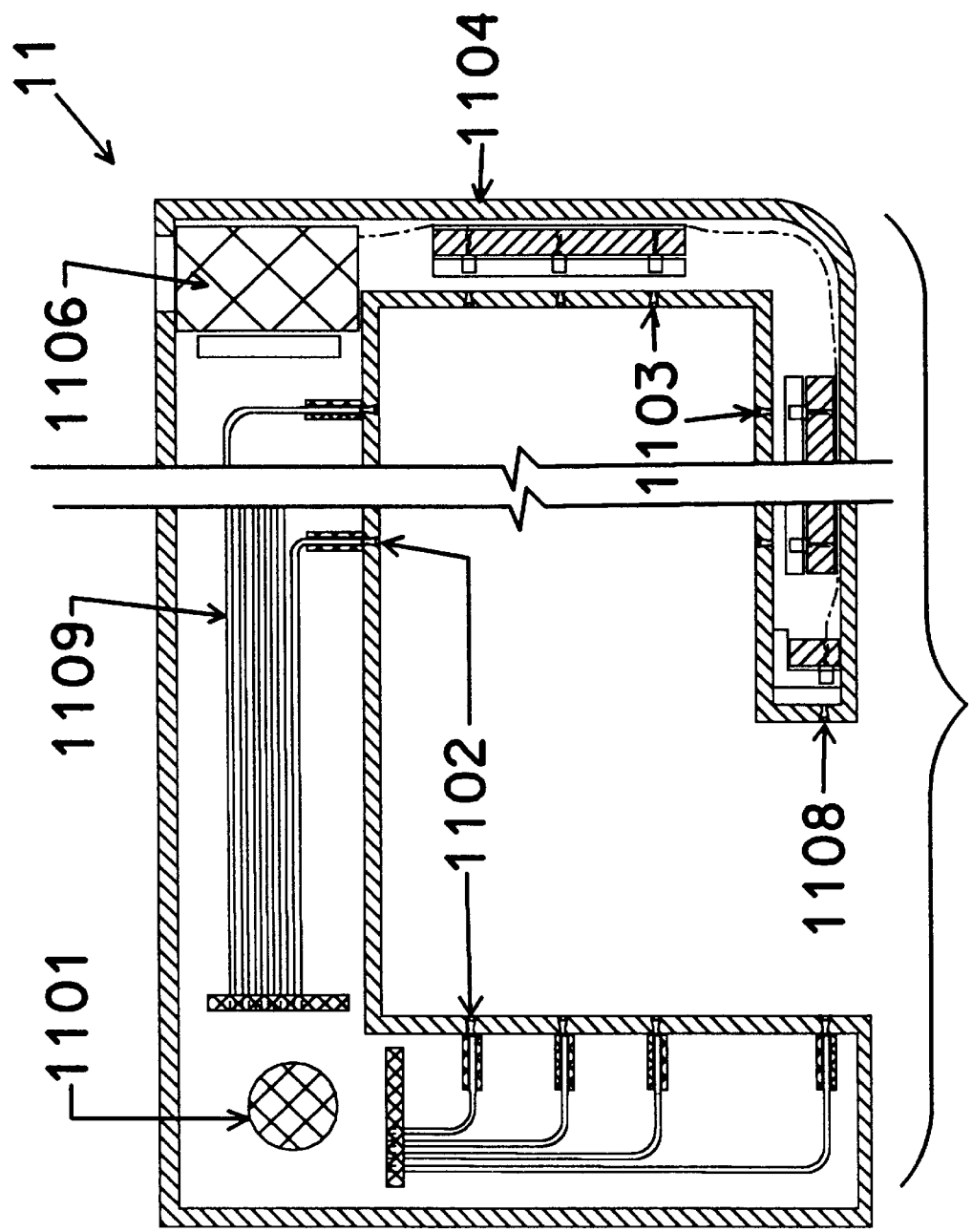

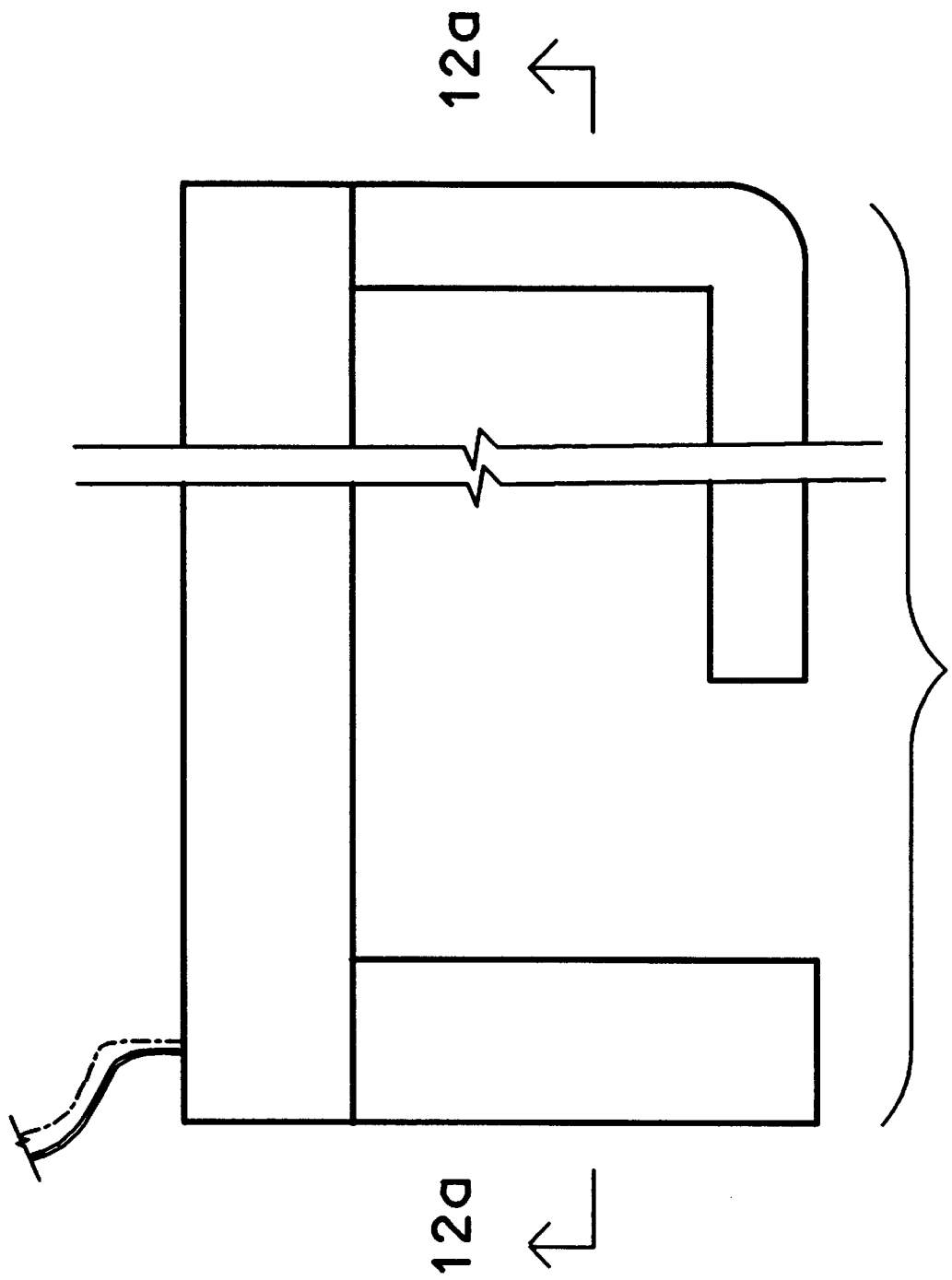

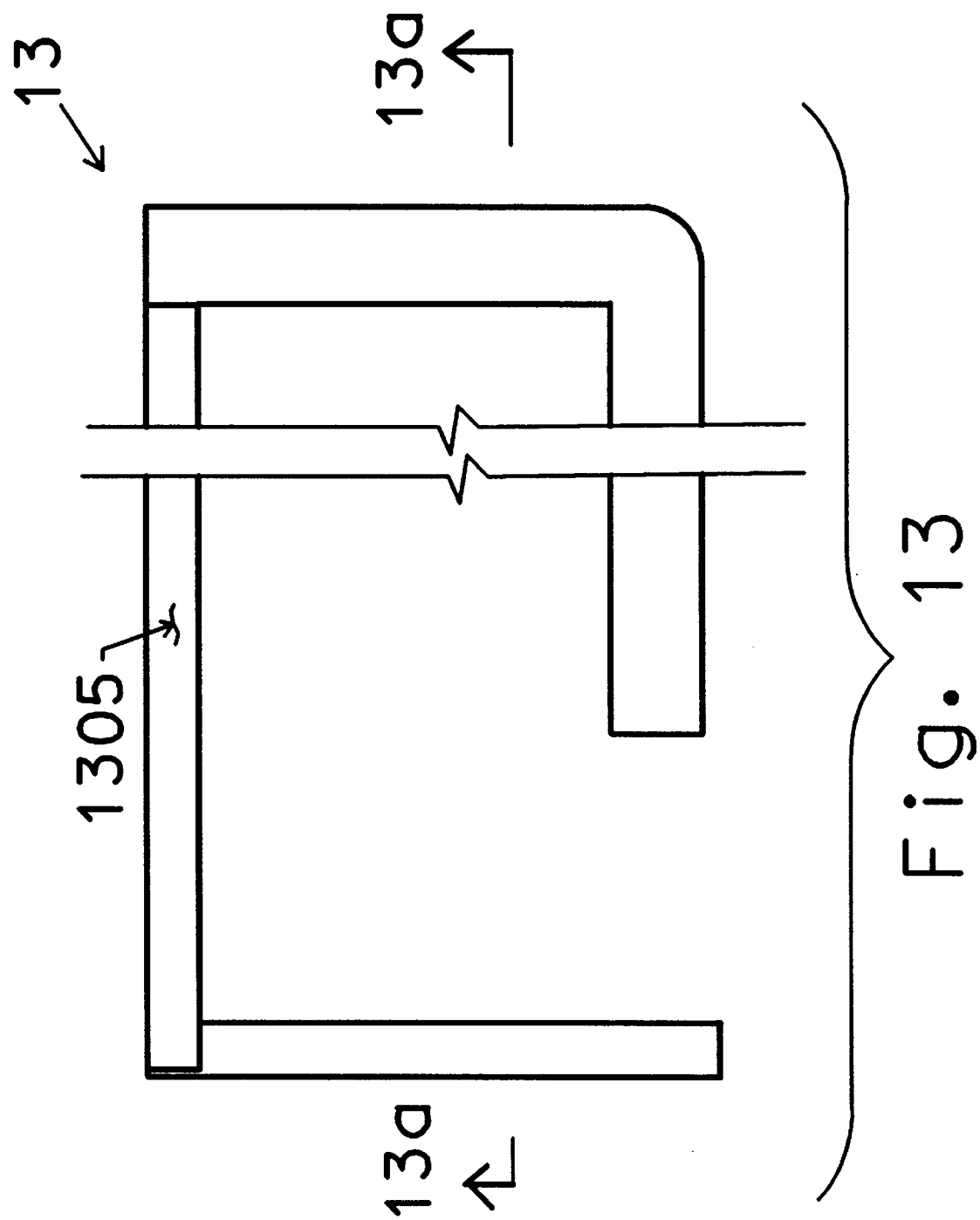

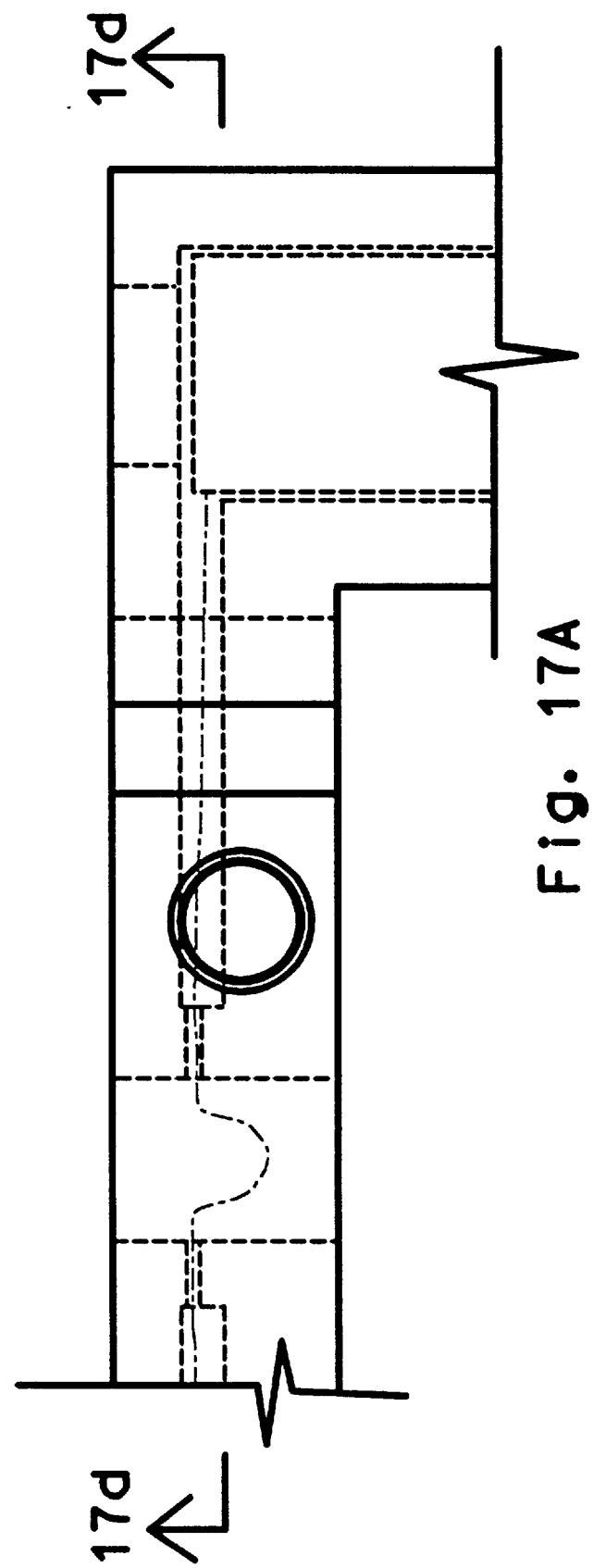

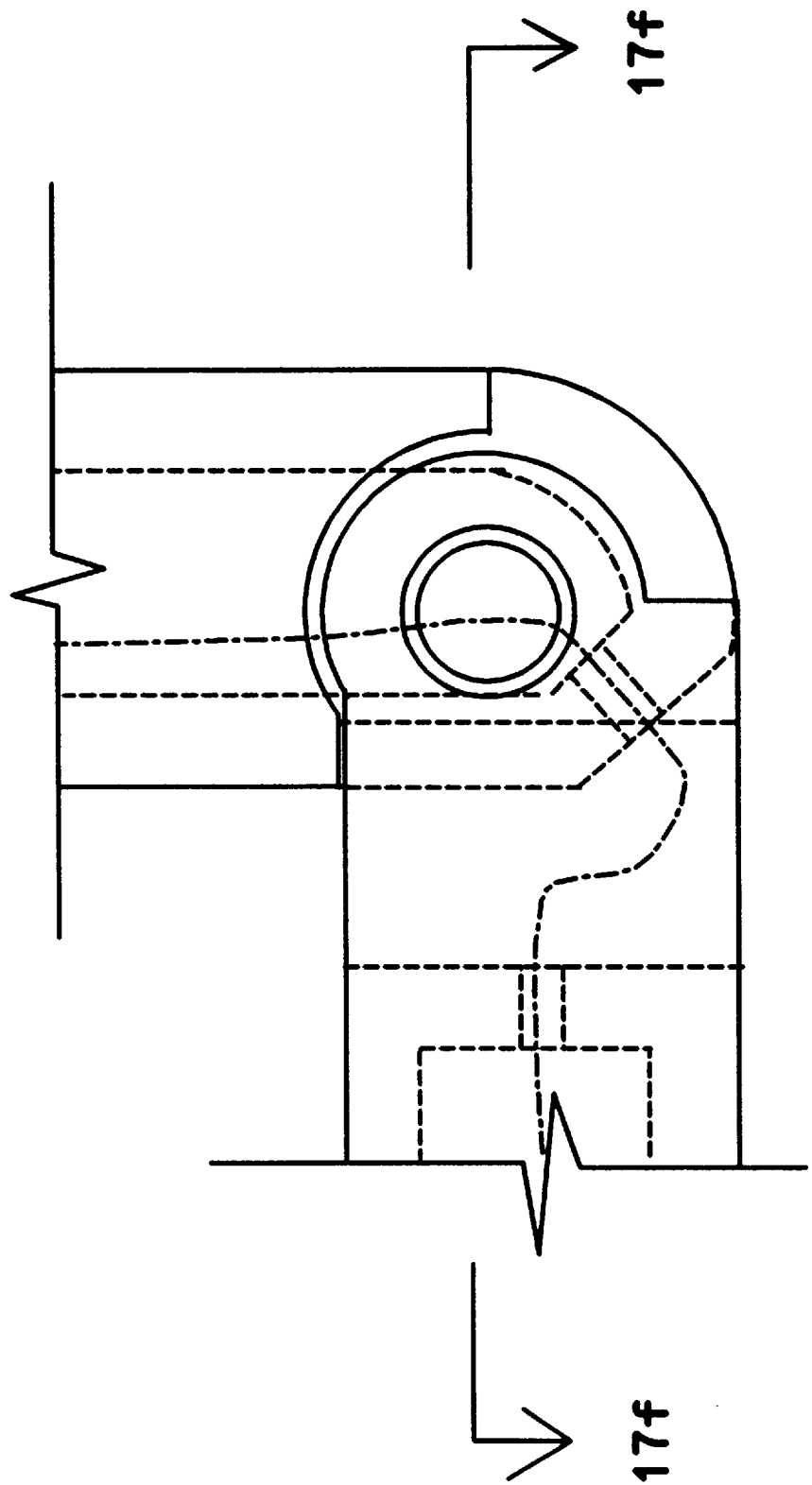

KEYING APPARATUS WITH THUMB GAP

BACKGROUND OF THE INVENTION

The present invention relates to photoelectric keyboard switches for a computer.

U.S. Pat. No. 5,136,156 to Nounen et al. discloses a photoelectric switching device, which comprises a four-sided frame, three pairs of arrays of light-emitting elements, photo-detecting elements, and a control means. Each array of the light-emitting elements is mounted on a side of the frame. Each of the photo-detecting elements is mounted on an opposite side of the frame from which the light-emitting elements are mounted.

Three pairs of the arrays of the light-emitting elements and photo-detecting elements together provide a matrix of regions inside the frame. When the light paths between the light-emitting elements and the photo-detecting elements are blocked by a stylus, such as a finger, sensed, blocked signals are transmitted to a control means, such as a computer, which discriminates the coordinates of the stylus on the switch device, and displays a pattern having several regions allocated for control of optional equipment.

The Nounen device does not provide a convenient flexibility for a thumb to operate the device, together with other fingers. Generally speaking, joint operation of a thumb and other four fingers of a hand is needed for regular typing operations. The device disclosed herein provides improved means for a thumb to work together with the other four fingers of a hand, to do typing.

SUMMARY OF THE INVENTION

Basically, the keyboard apparatus of the invention comprises:

a) first means to produce and detect laterally directed and longitudinally spaced first light beams at a first level in a simulated keyboard area, which is open, b) second means to produce and detect longitudinally directed, laterally spaced second light beams at or proximate to the first level, in the area, whereby the first and second light beams produce a grid-like pattern having cross-over nodes, c) third means to produce and detect third light beams at a second level or levels, whereby user's finger interruption of a third beam occurs in conjunction with finger interruption of the first and second beam at or near one or more nodes.

Another object is to provide a frame bounding the area, and defining a gap sized to receive up and down motion of the user's thumb.

Yet another object is to provide the means to record beam interruption to include light emitters and detectors carried by the frame.

A further object is to provide means to record beam interruption to include a CRT having a display screen to display beam interruption.

A further object is to provide said means to record beam interruption to include a computer having a display screen.

Yet another object is to provide the frame to have legs carrying the means to produce and detect light beams, and there being means to accommodate shifting of the positions of that means relative to said legs, to adjust the positions of the light beams to the user's finger spacings.

Further objects include provision of VELCRO-type attachment means on the frame; a frame having legs which have pivoted interconnection; and means to adjust the spacing between said beam levels.

An additional object includes provision of keyless keying apparatus comprising a) a frame defining an open, generally rectangular keying area, which is open, b) there being a gap through the frame extending between said open keying area and the exterior of the frame, c) and light beam sources and light beam detectors carried by the frame to produce light beams crossing said area and said gap, for impingement on the detectors, whereby interruption of said beams by a user's finger reception in said area or a user's thumb reception in said gap may be detected by said detectors.

As will be seen, the open area has four corners, the gap located proximate one of said corners. Also, the beams include first lateral and longitudinal beams at a first level, in said area, and second longitudinal beams located generally beneath the first longitudinal beams and at a second level in said area. In this configuration, the beam sensors and beam detectors are carried to be relatively shiftable in at least one of the following nodes:

i) generally parallel to a plane defined by said first beams, ii) generally perpendicular to a plane defined by said first beams.

These and other objects and advantages of the invention, as well as the details of an illustrative embodiment, will be more fully understood from the following specification and drawings, in which:

DRAWING DESCRIPTION

FIG. 1 is an isometric view, which illustrates uses of the device;

FIGS. 2, and 2a and 2b are a plan view, a sectional elevation view and a sectional plan view, respectively, of one variation of the device, of which the horizontal locations of the light-emitting elements and the photo-detecting elements can be slightly adjusted. For this device, only one light bulb is used as a light source for the light-emitting elements;

FIG. 3 illustrates functions of the device shown in FIG. 2;

FIGS. 4, 4a and 4b are a plan view, a sectional elevation view and a sectional plan view, respectively, of a variation of the device, wherein the horizontal locations of the light-emitting elements and the photo-detecting elements can be slightly adjusted. For this device, each light-emitting element has its own light source;

FIGS. 4A and 4C are cross sections;

FIGS. 5, 5a and 5b are a plan view, a sectional elevation view and a sectional plan view, respectively, of another variation of the device, wherein the horizontal locations of the light-emitting elements and the photo-detecting elements can be slightly adjusted. For this device, two light bulbs are used as light sources for the light-emitting elements;

FIGS. 5A and 5C are cross sections;

Figure 6A:
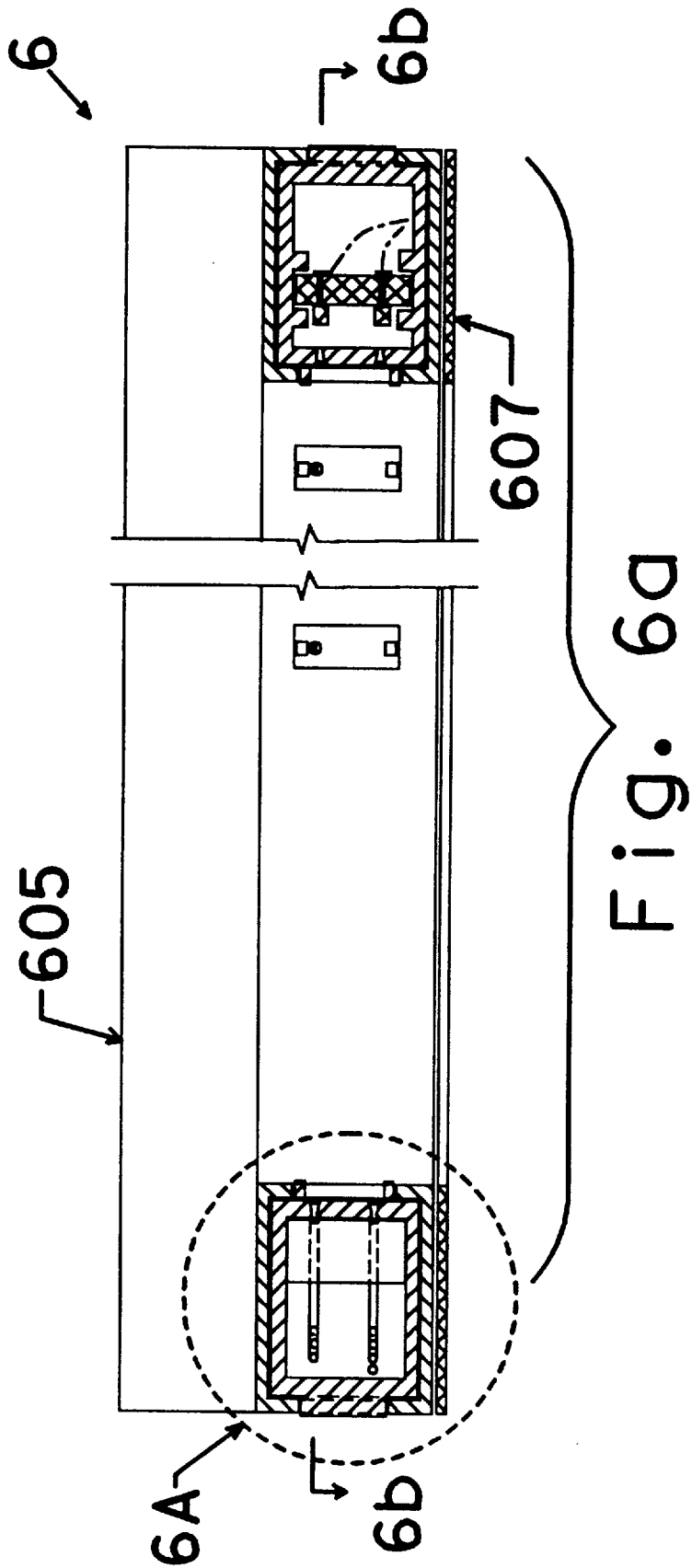
Figure 7A:
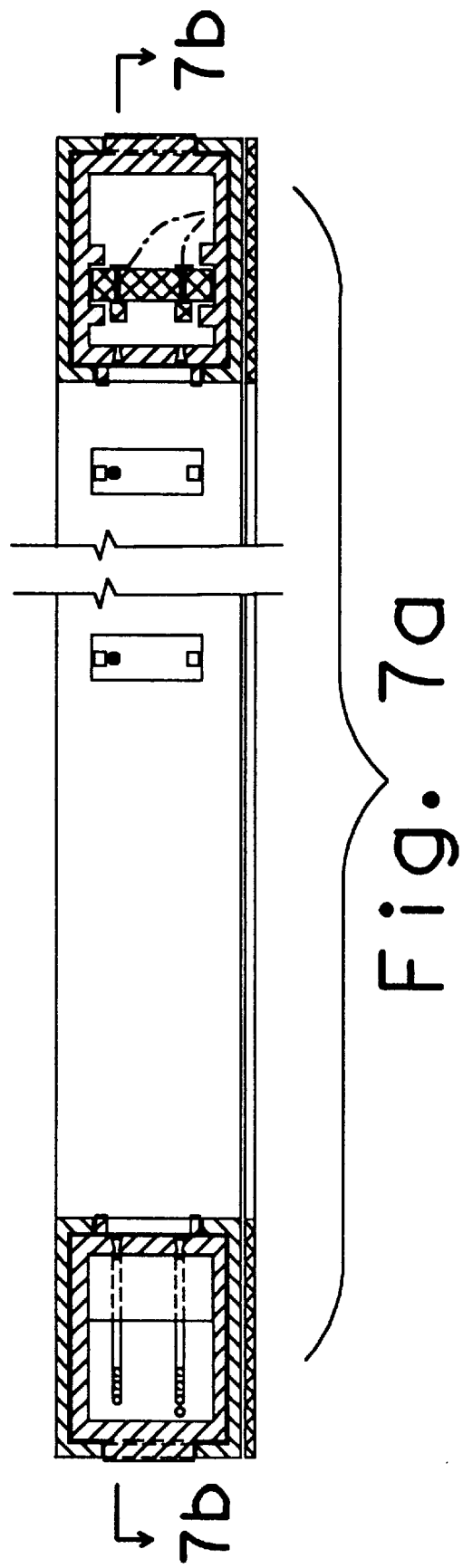
Figure 7B:
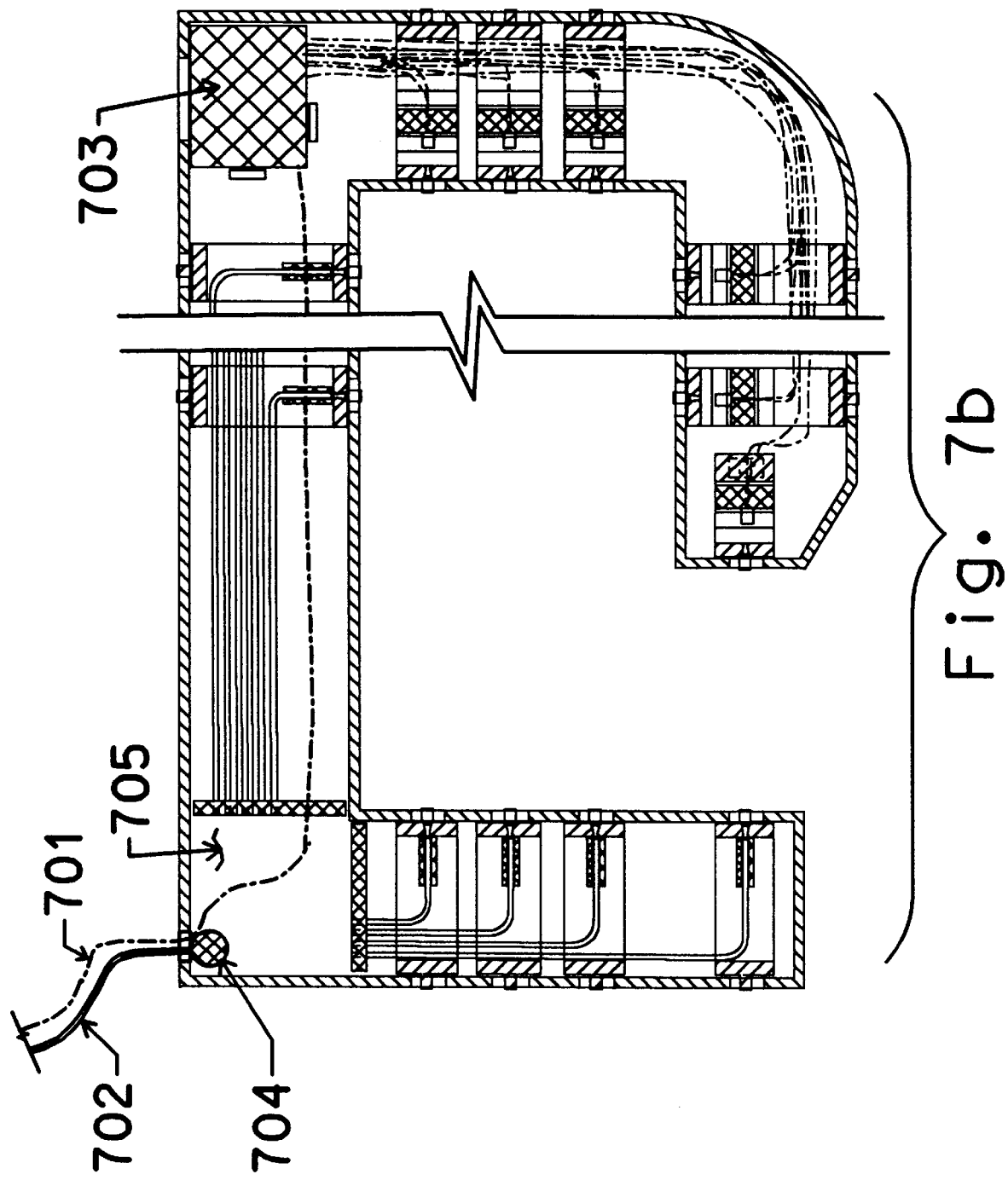
Figure 8:
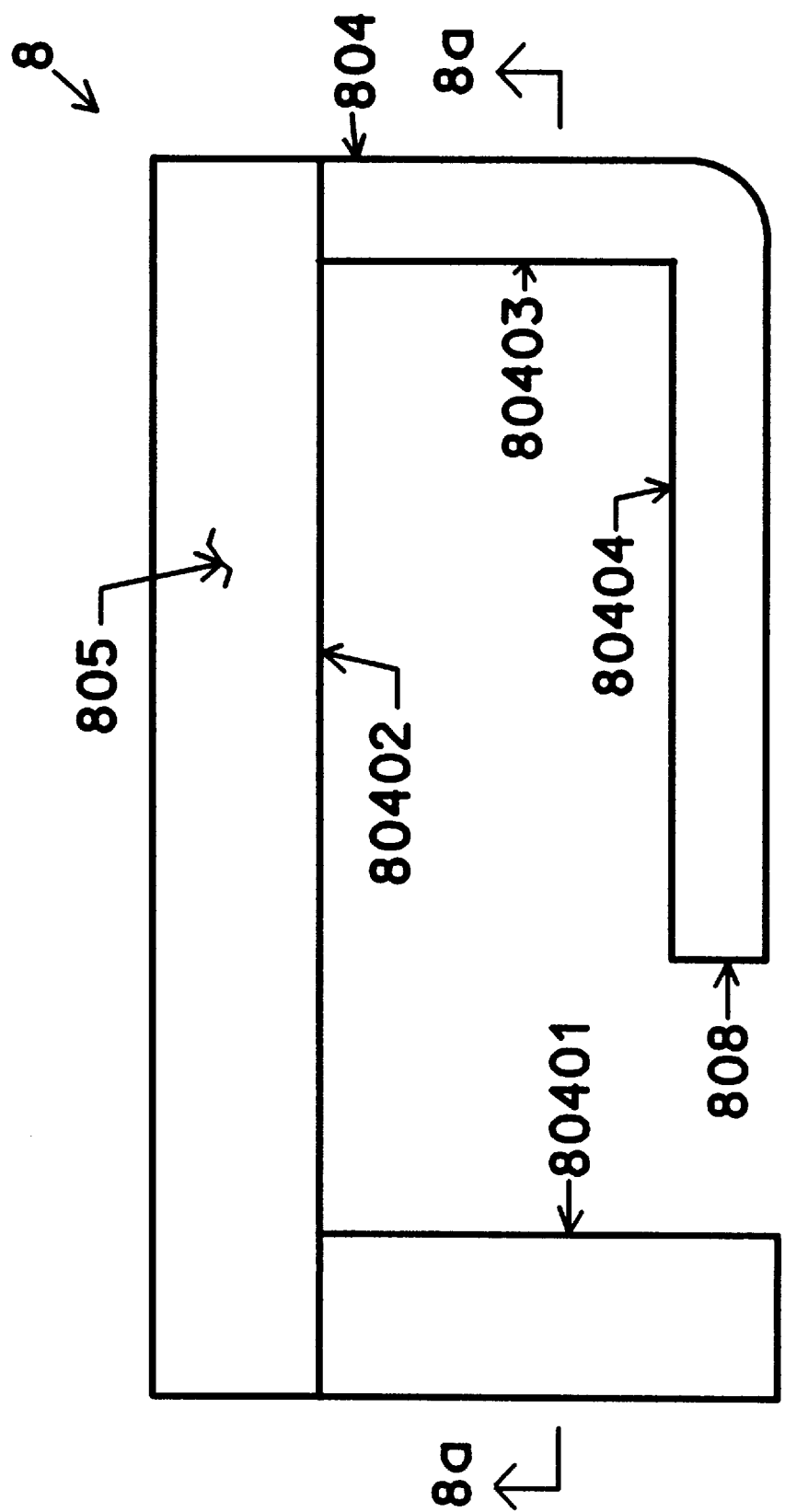
Figure 8A:
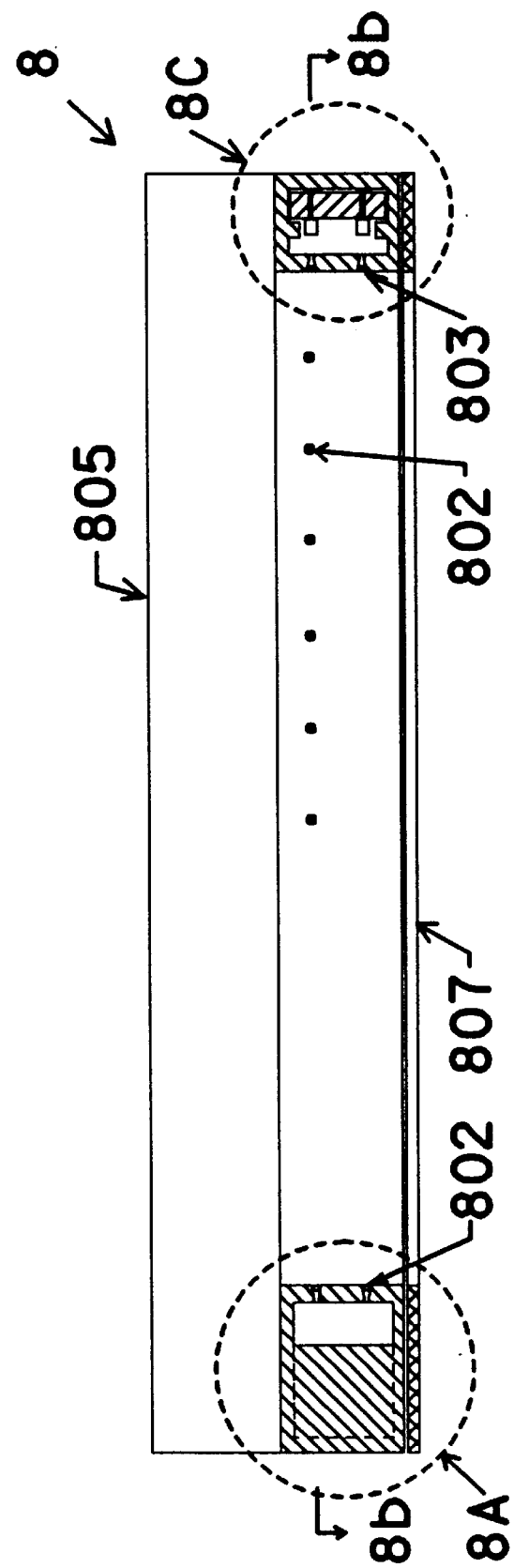
Figure 8B:
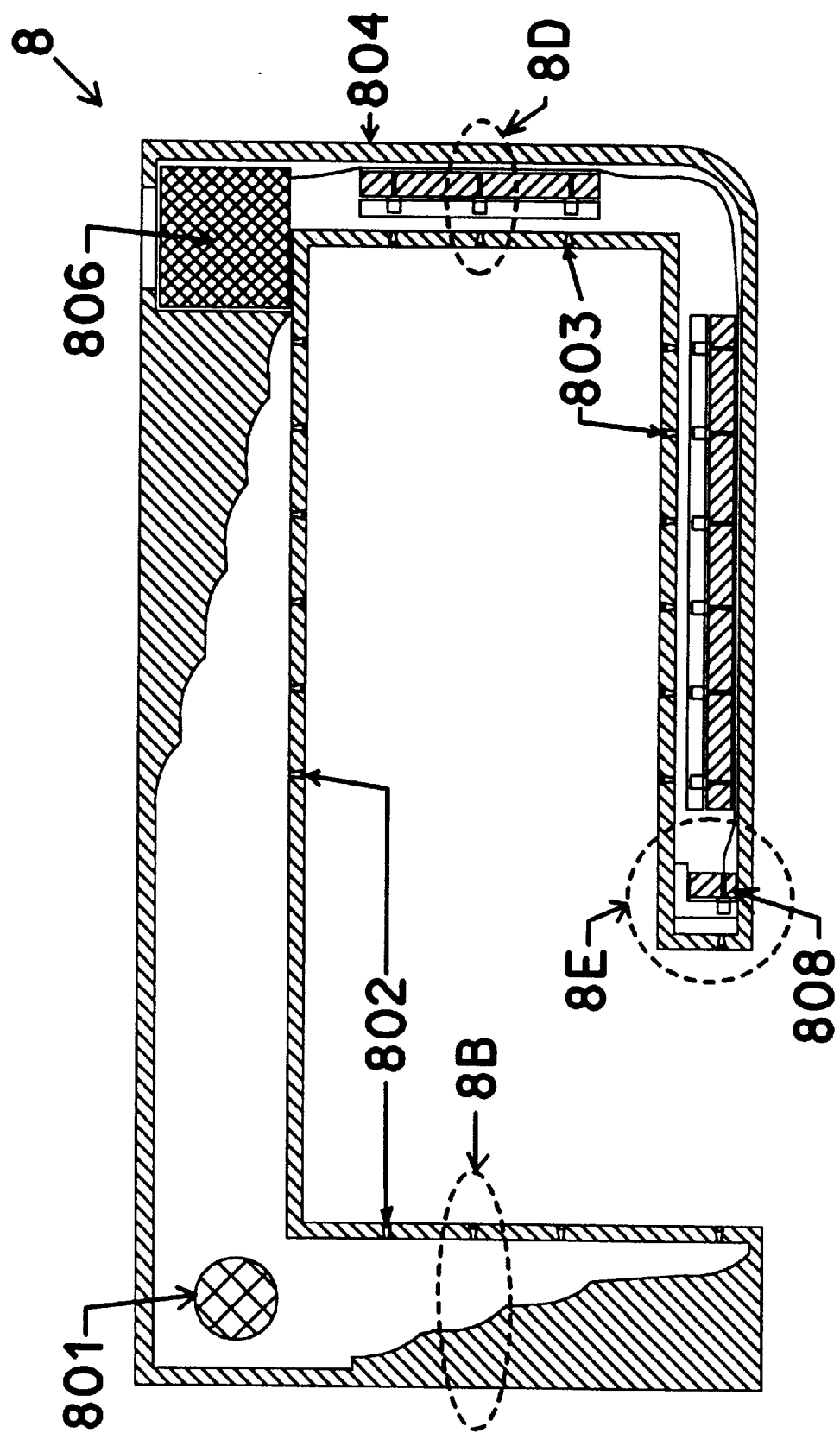
Figure 9D:
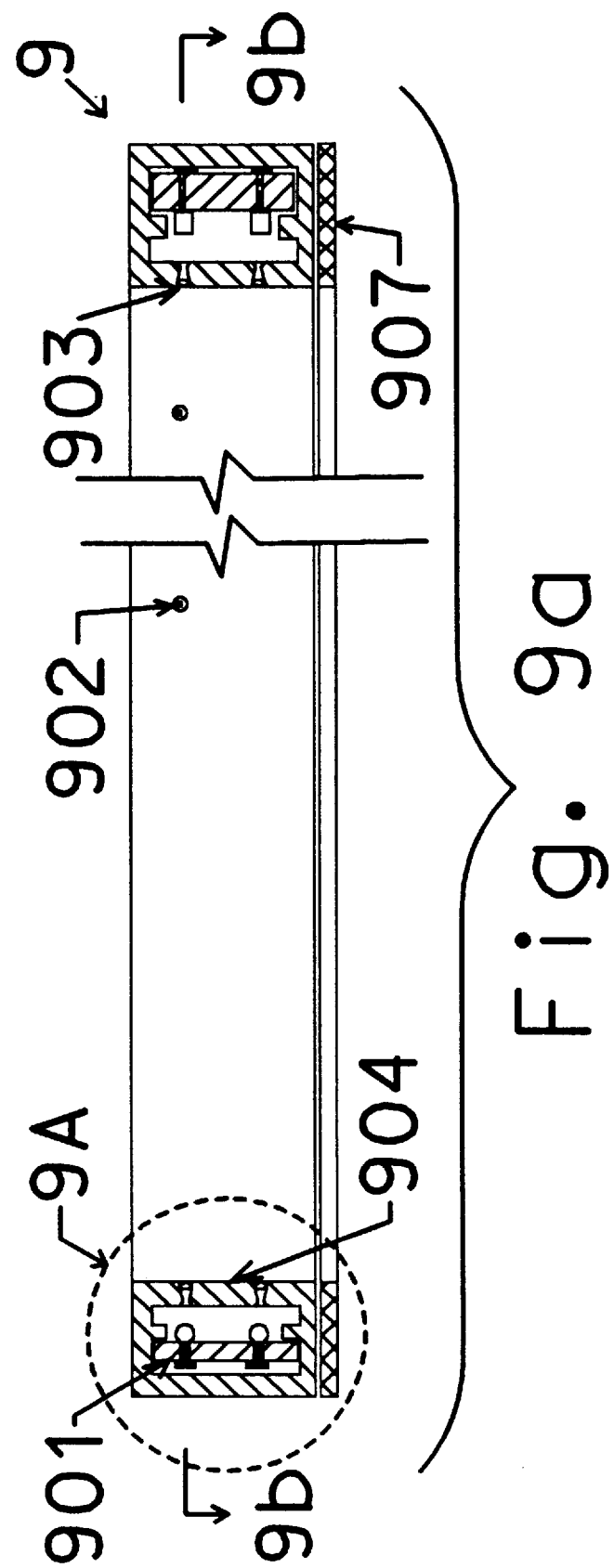
Figure 9B:
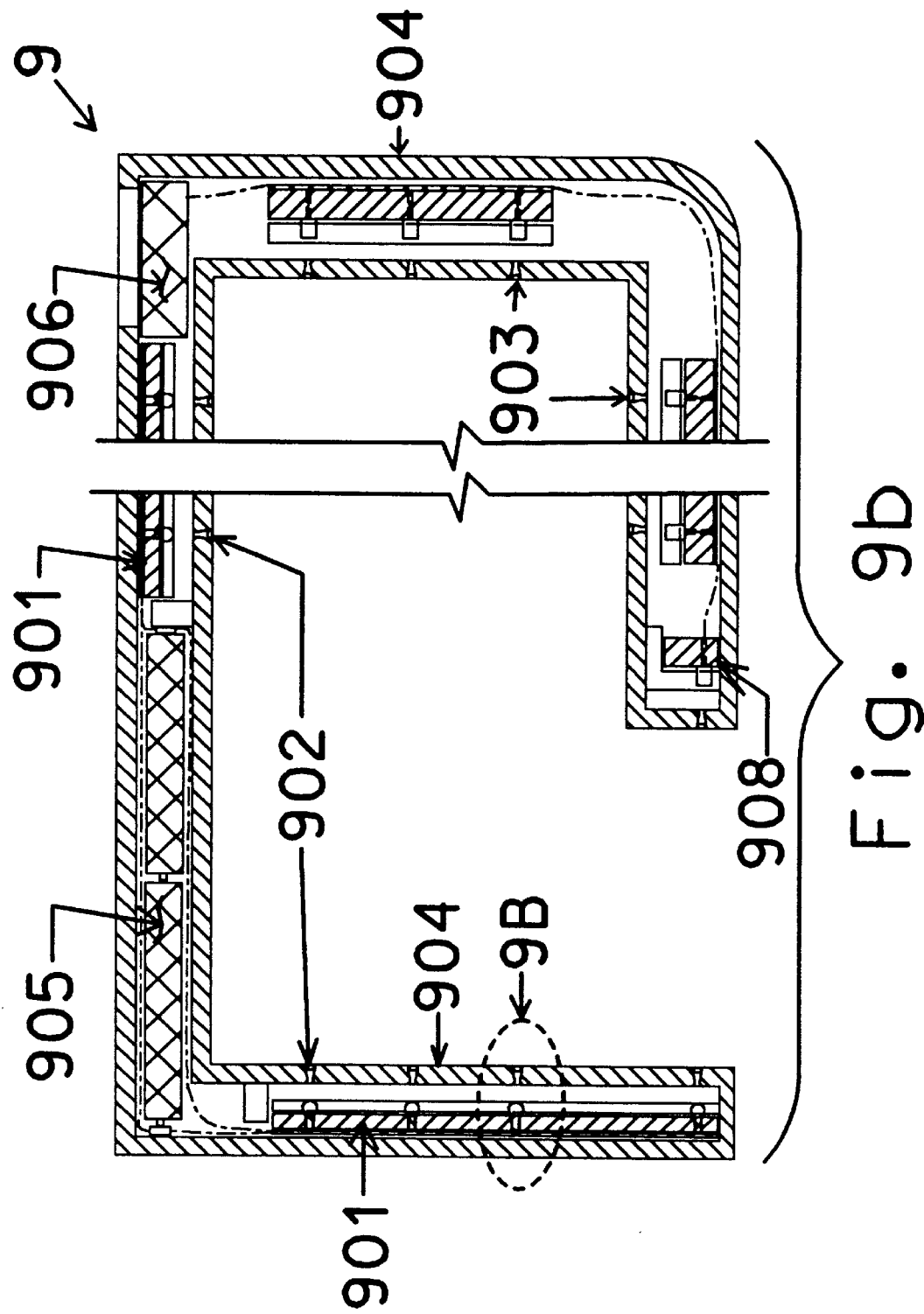
Figure 10B:
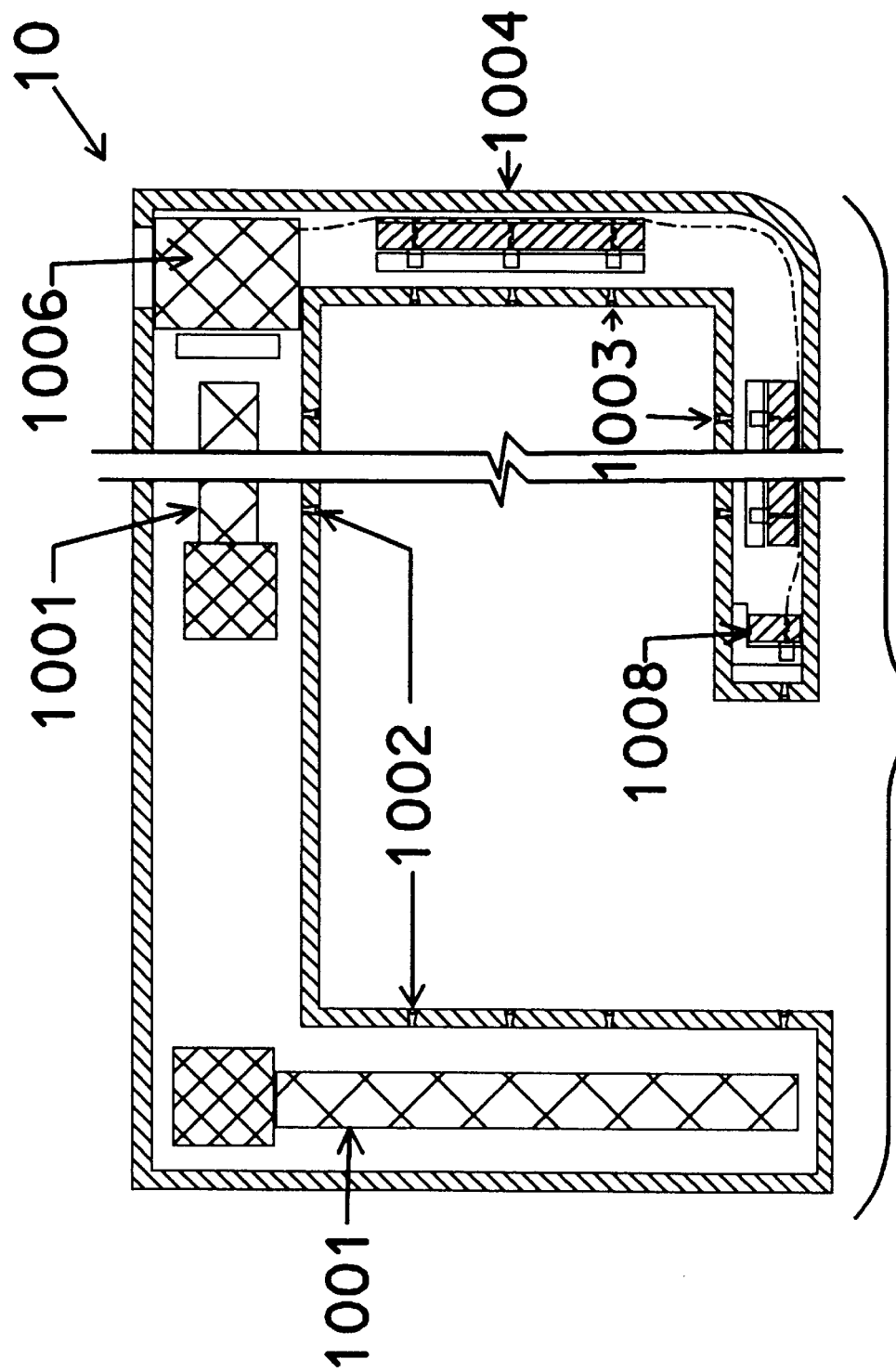
Figure 12A:
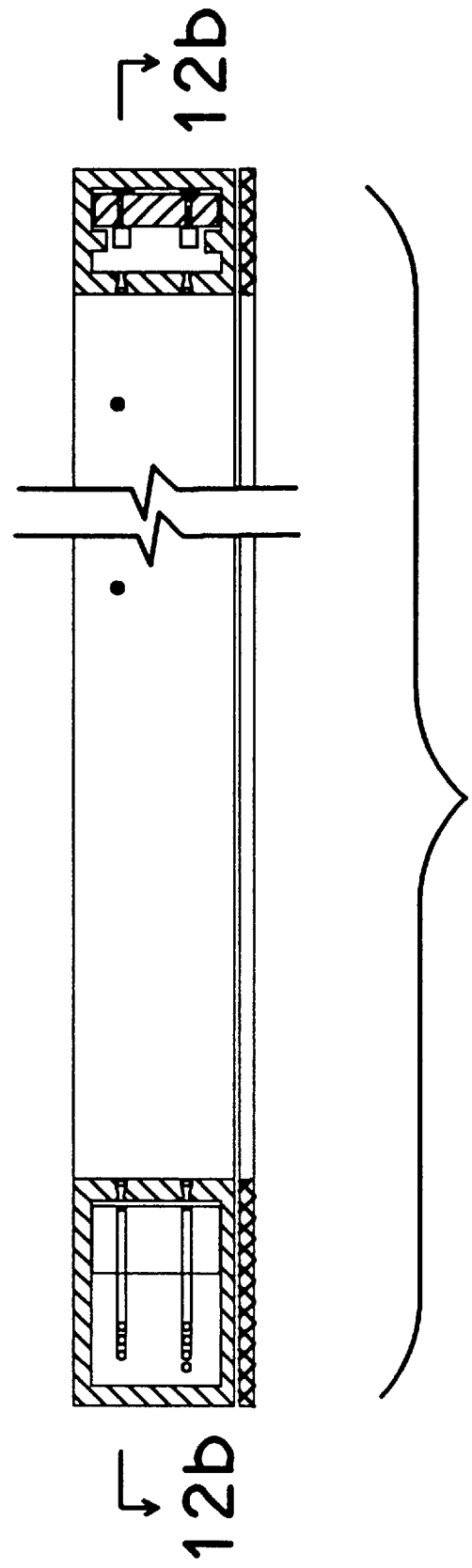
Figure 12B:
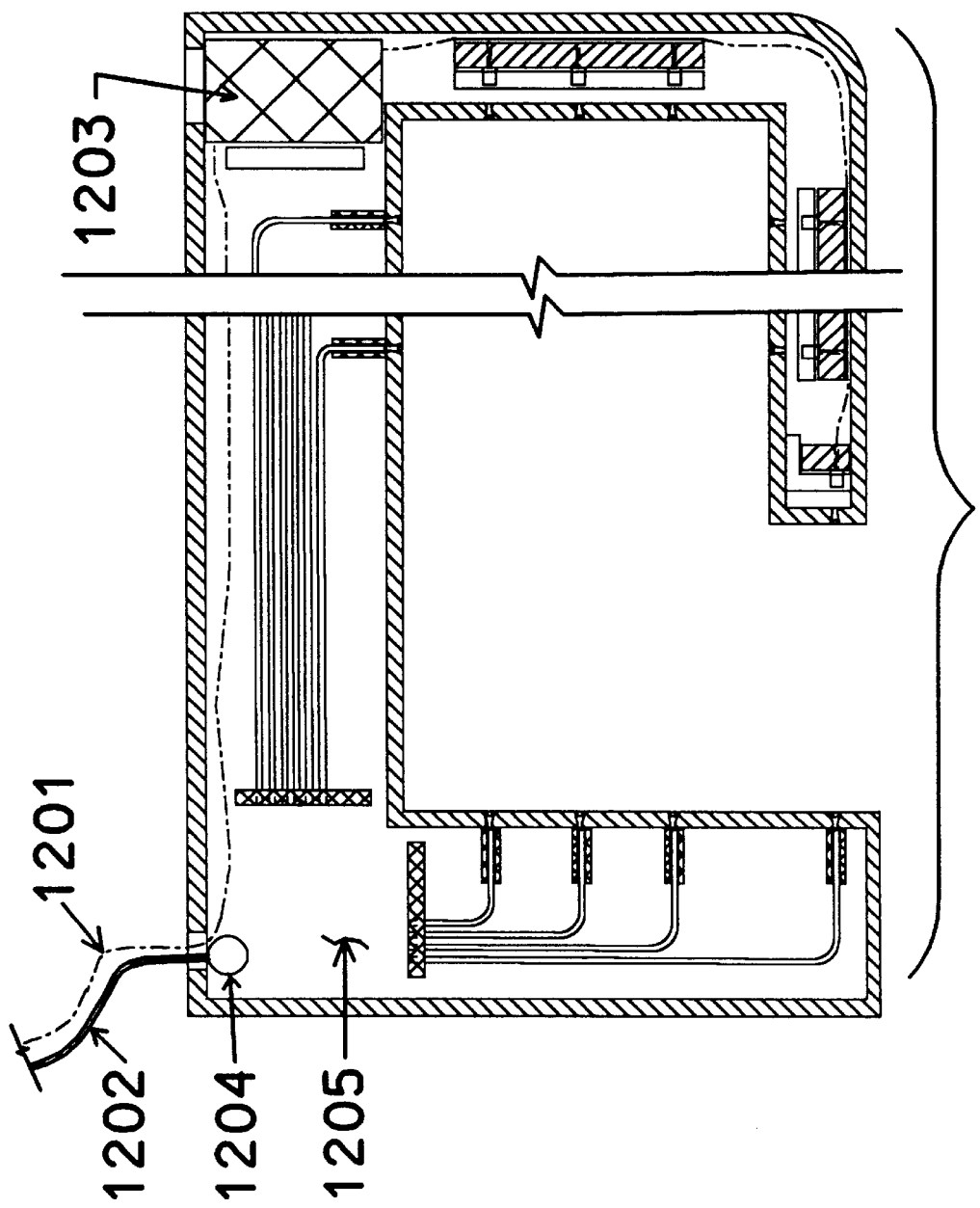
Figure 13A:
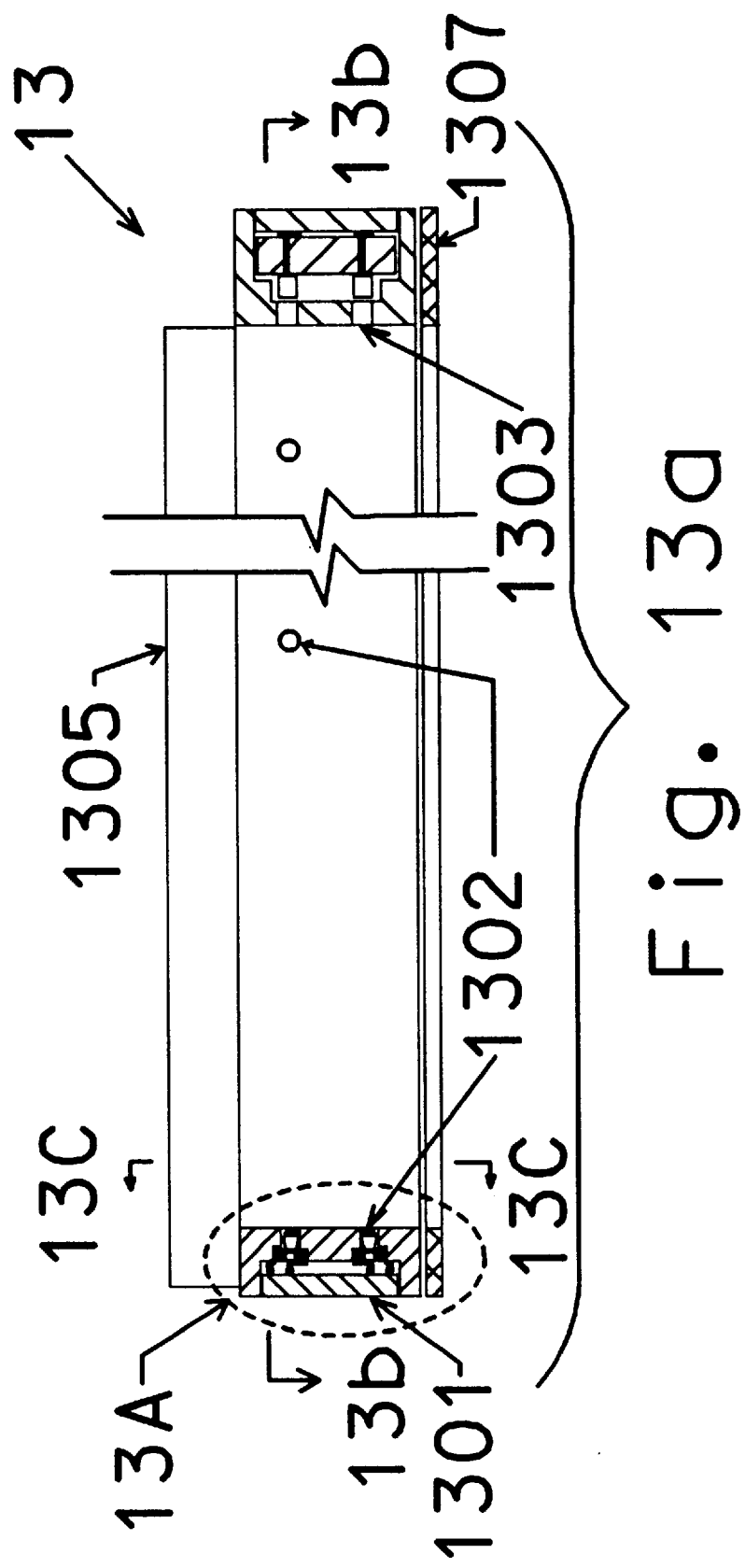
Figure 13B:
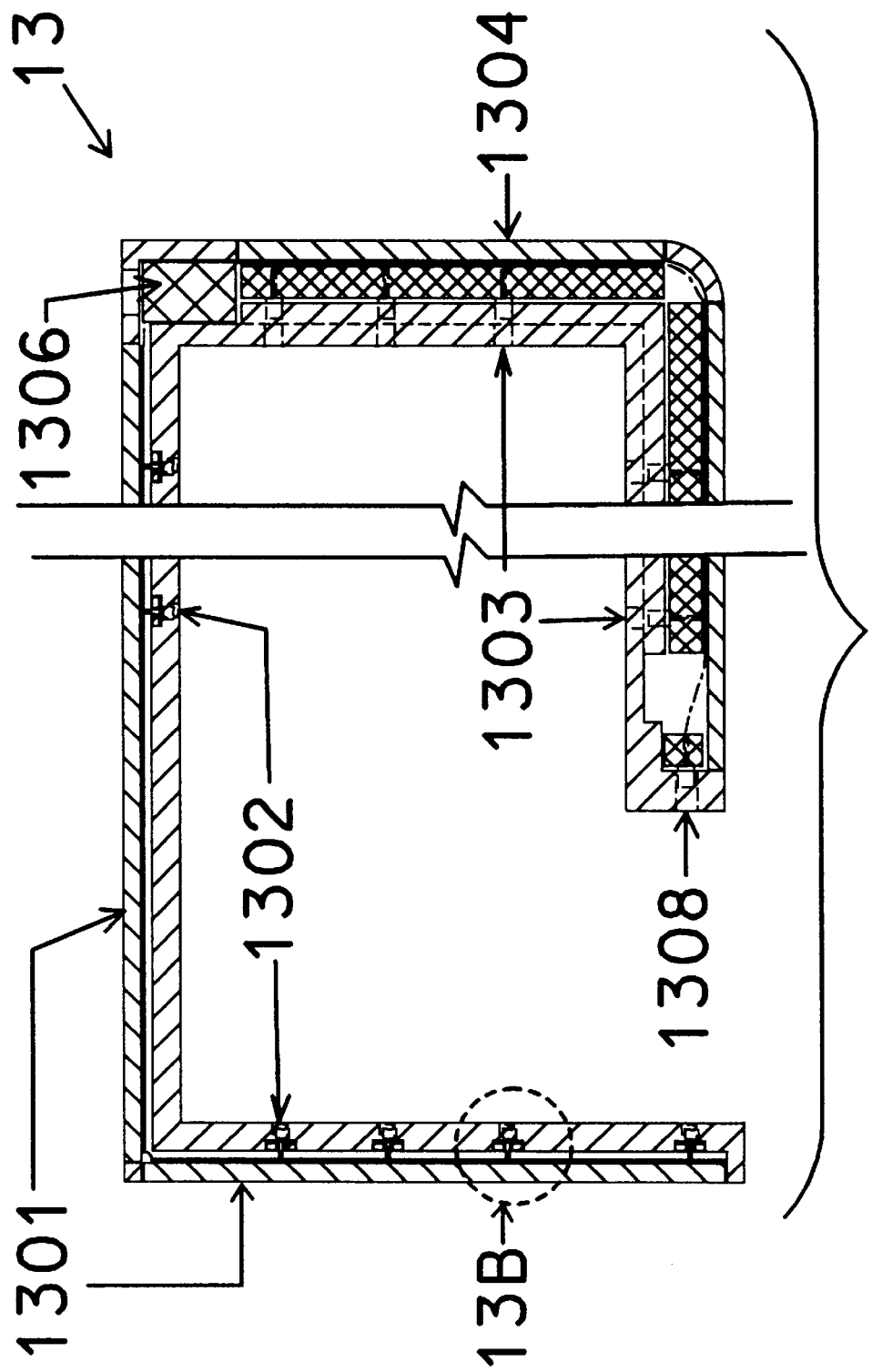

FIGS. 6, 6a and 6b are a plan view, a sectional elevation view and a sectional plan view, respectively, of another variation of the device, wherein the horizontal locations of the light-emitting elements and the photo-detecting elements can be slightly adjusted. For this device, only one light bulb is used as a light source for the light-emitting elements. Light is transmitted from the light source to each of the light-emitting elements by optical fiber glass tubes;

FIGS. 6A and 6C are cross sections;

FIGS. 7, 7a and 7b are a plan view, a sectional elevation view and a sectional plan view, respectively, of another variation of the device, wherein the horizontal locations of the light-emitting elements and the photo-detecting elements can be slightly adjusted. These Figures illustrate that an "umbilical" cord is used to connect the device to a computer. For this device, only one light bulb is used as a light source, for the light-emitting elements. Light is 30 transmitted from the light source to each of the light-emitting elements by optical fiber glass tubes;

FIGS. 8, 8*a* and 8*b* are a plan view, a sectional elevation view and a sectional plan view, respectively, of another variation of the device, wherein the horizontal locations of the light-emitting elements and the photo-detecting elements cannot be slightly adjusted. For this device, only one light bulb is used as a light source for the light-emitting elements;

FIGS. 8A and 8B as well as FIGS. 8C, 8D and 8E are cross sections;

FIGS. 9, 9*a* and 9*b* are a plan view, a sectional elevation view and a sectional plan view, respectively, of another variation of the device, wherein the horizontal locations of the light-emitting elements and the photo-detecting elements cannot be slightly adjusted. For this device, each light-emitting element has its own light source;

FIGS. 9A and 9B are cross sections;

FIGS. 10, 10*a* and 10*b* are a plan view, a sectional elevation view and a sectional plan view, respectively, of another variation of the device, wherein the horizontal locations of the light-emitting elements and the photo-detecting elements cannot be slightly adjusted. For this device, two light bulbs are used as light sources for the light-emitting elements;

FIG. 11, 11*a* and 11*b* are a plan view, a sectional elevation view and a sectional plan view, respectively, of another variation of the device, wherein the horizontal locations of the light-emitting elements and the photo-detecting elements cannot be slightly adjusted. For this device, only one light bulb is used as a light source, for the light-emitting elements. Light is transmitted from the light source to each of the light-emitting elements by optical fiber glass tubes;

FIGS. 12, 12*a* and 12*b* are a plan view, a sectional elevation view and a sectional plan view, respectively, of another variation of the device, wherein the horizontal locations of the light-emitting elements and the photo-detecting elements cannot be slightly adjusted. These Figures illustrate an "umbilical" cord is used to connect the device to a computer. For this device, only one light bulb is used as a light source for the light-emitting elements. Light is transmitted from the light source to each of the light-emitting elements by optical fiber glass tubes;

FIGS. 13, 13*a* and 13*b* are a plan view, a sectional elevation view and a sectional plan view, respectively, of another variation of the device, wherein the horizontal locations of the light-emitting elements and the photo-detecting elements cannot be slightly adjusted. For this device, each of the light-emitting elements has its own light source, and each light-emitting element has its own lens.

Figure 14:
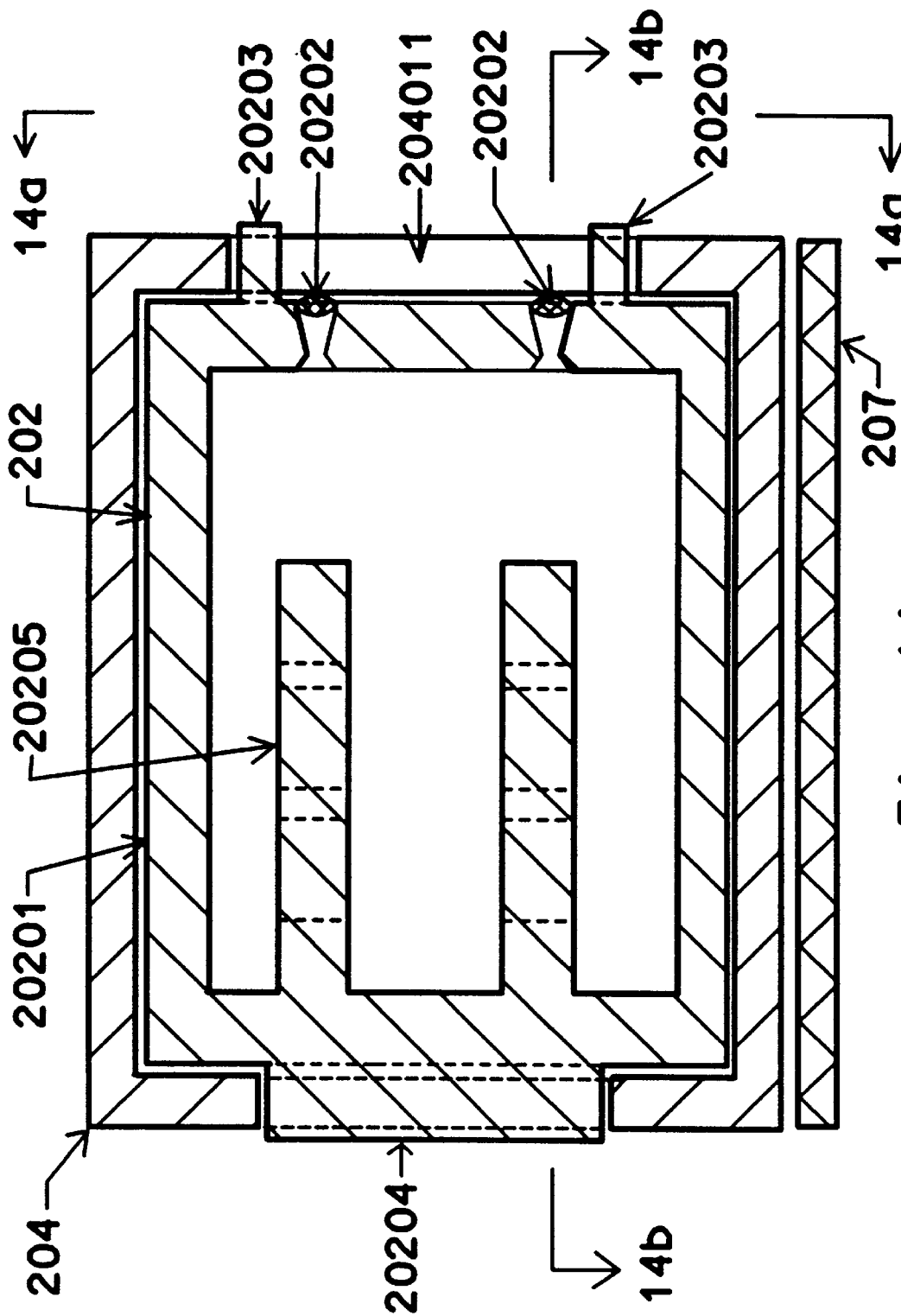
Figure 14A:
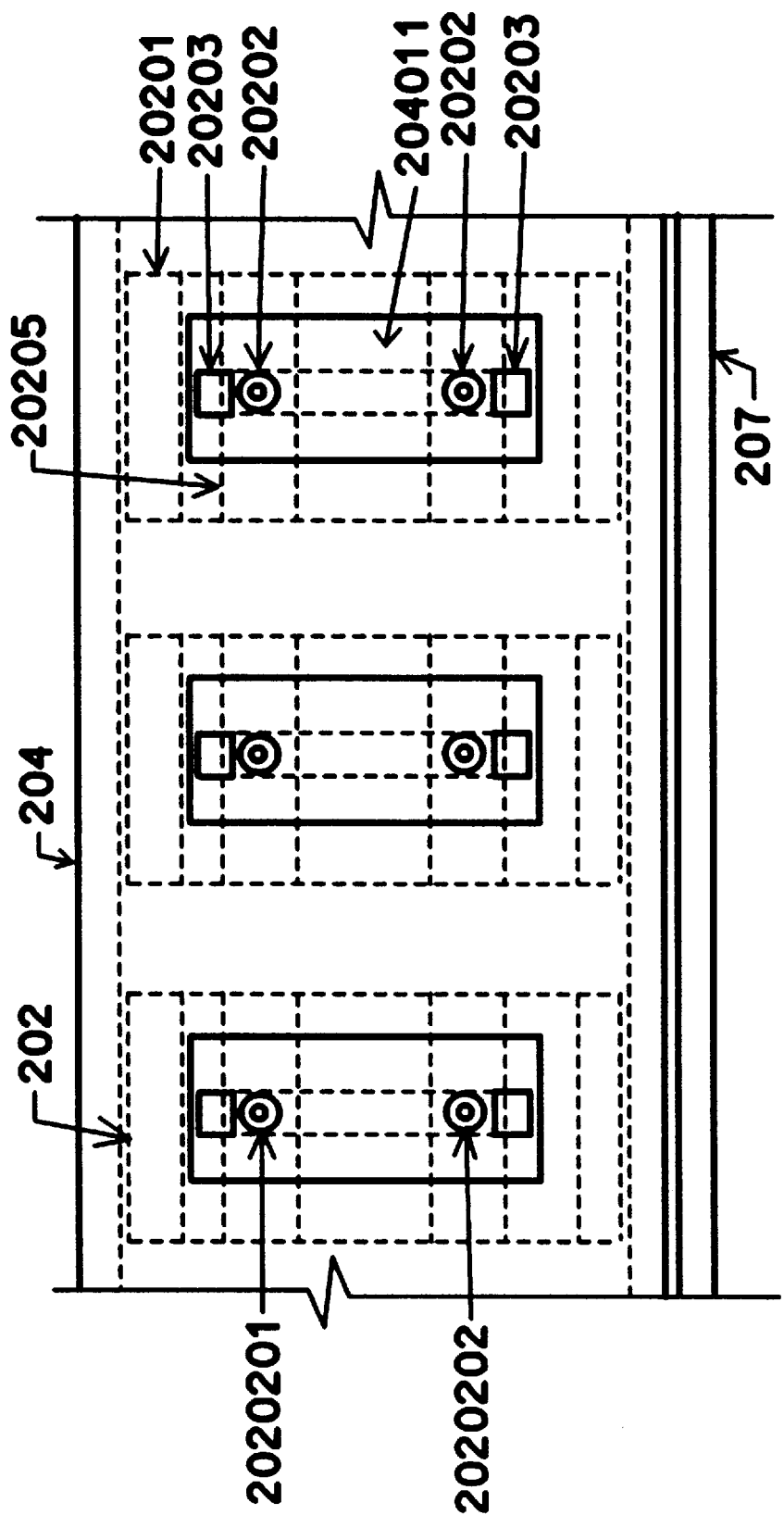
Figure 14B:
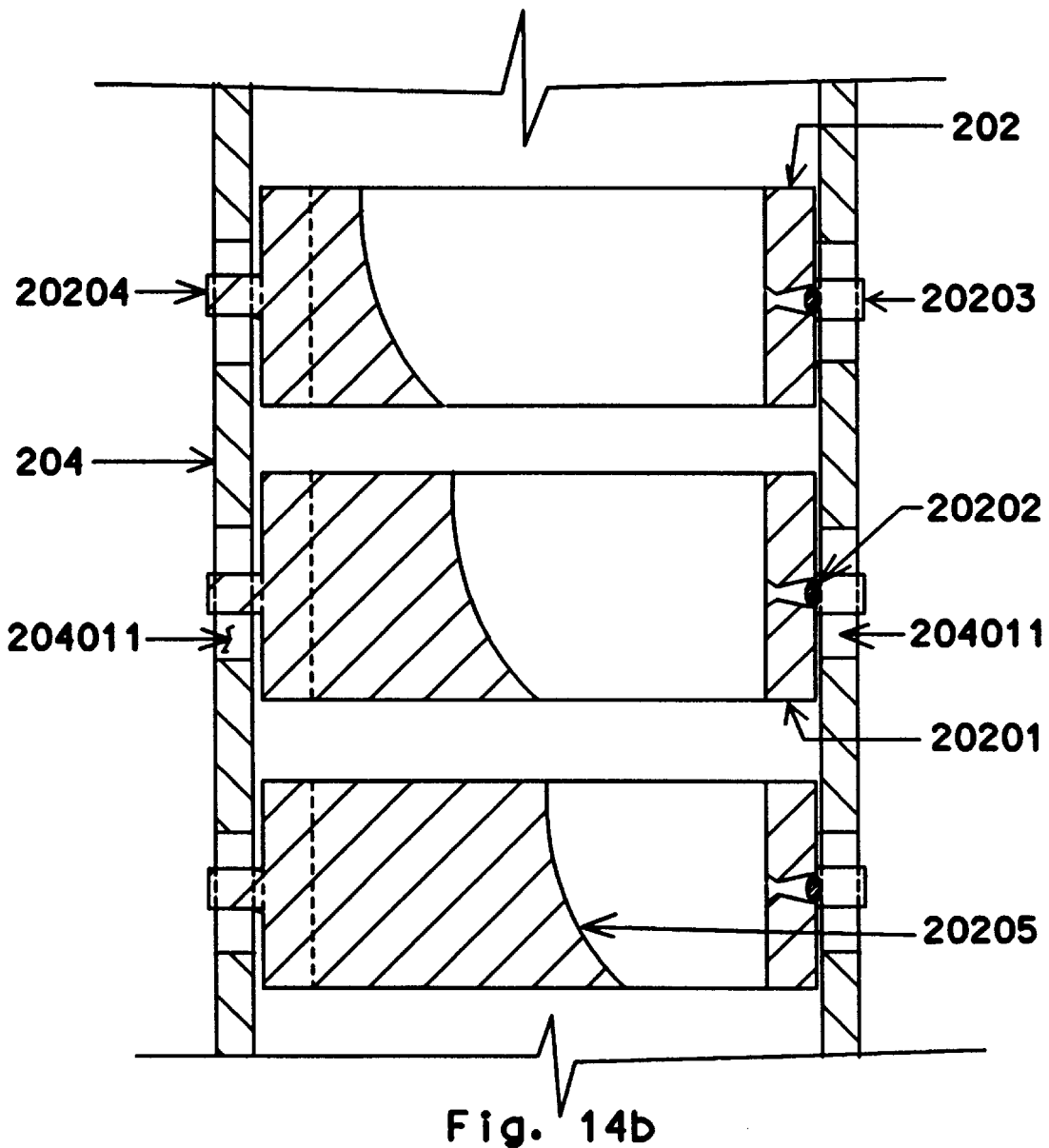
Figure 15:
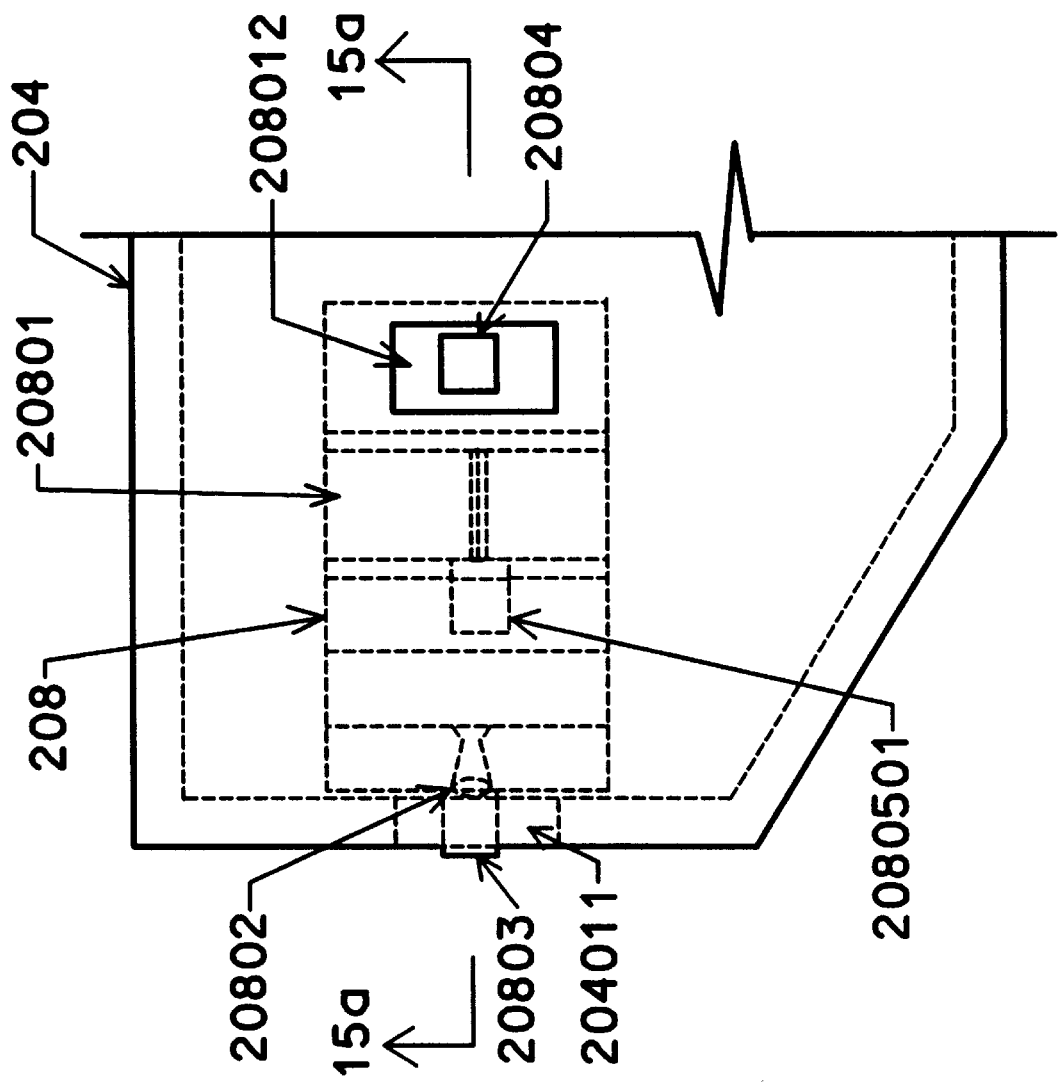
Figure 15A:
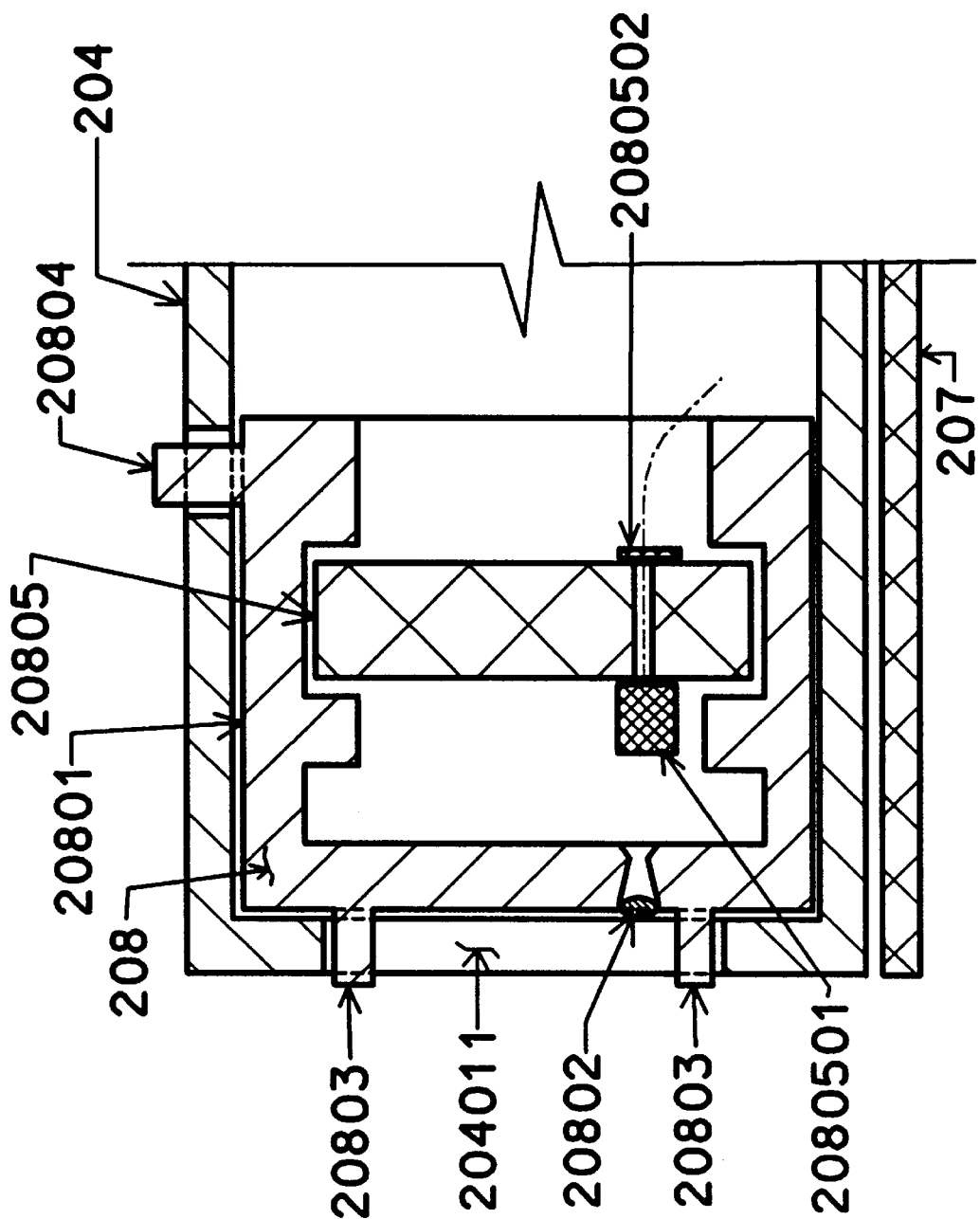
Figure 16:
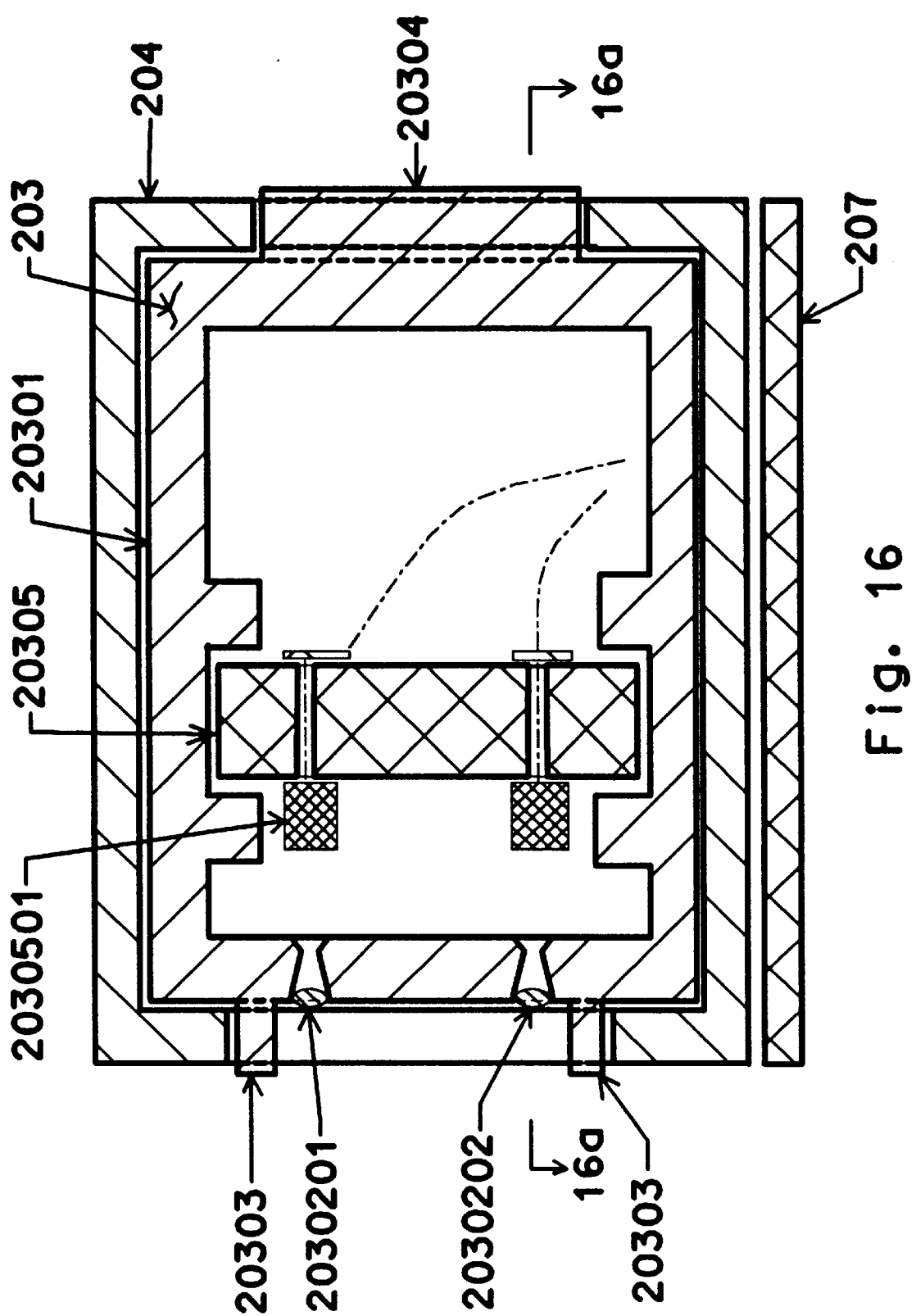
Figure 16A:
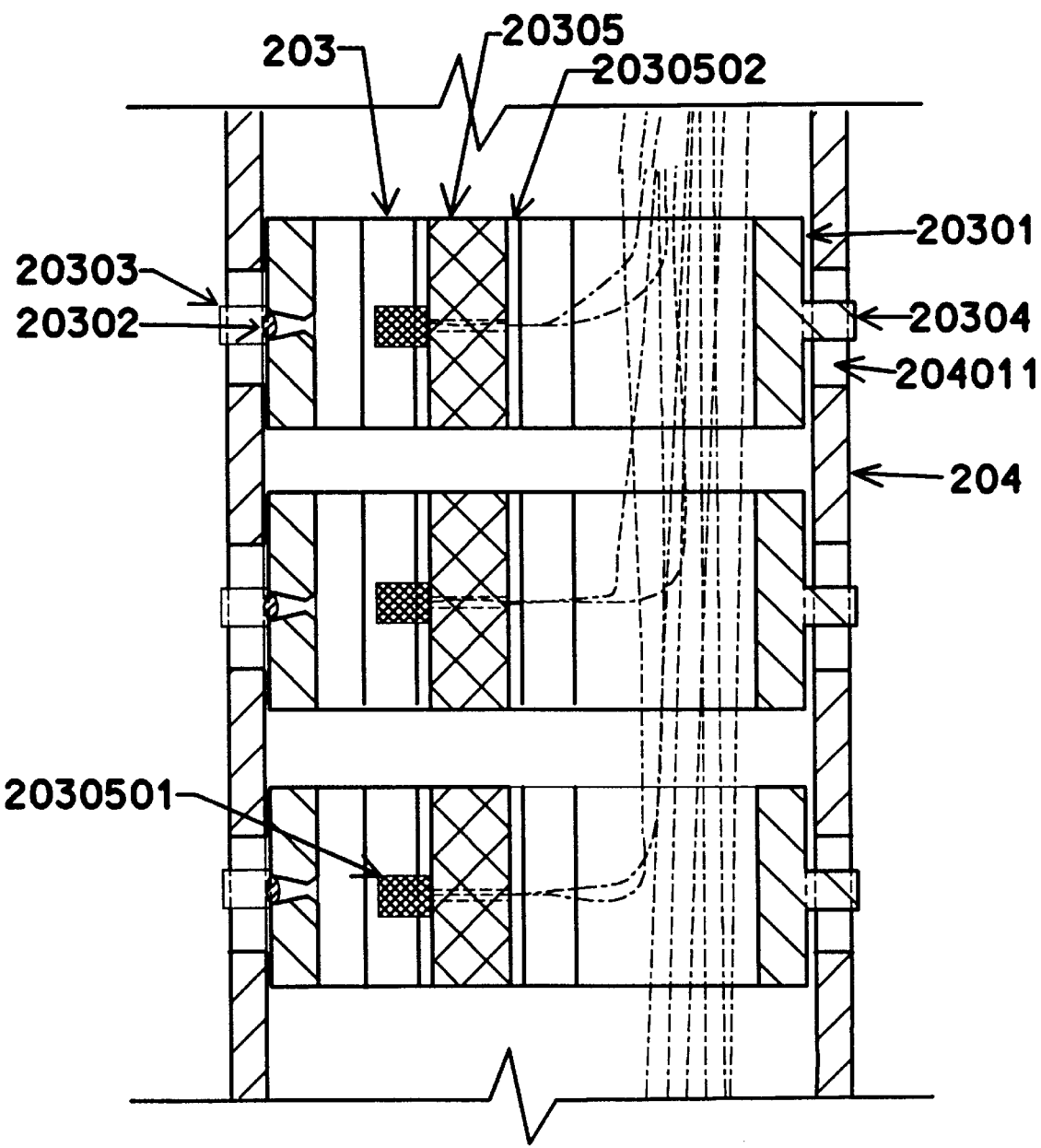
Figure 17B:
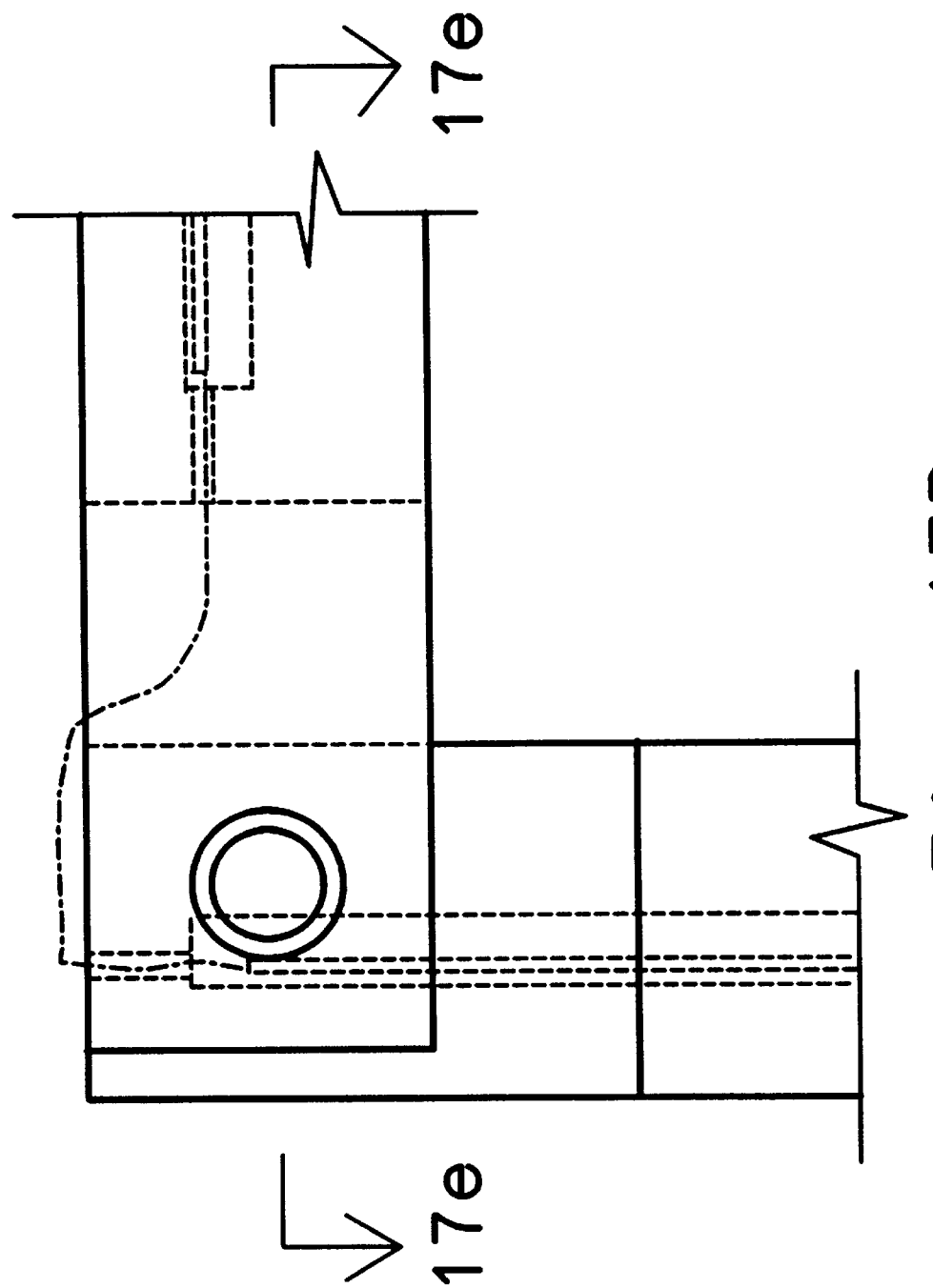
Figure 17D:
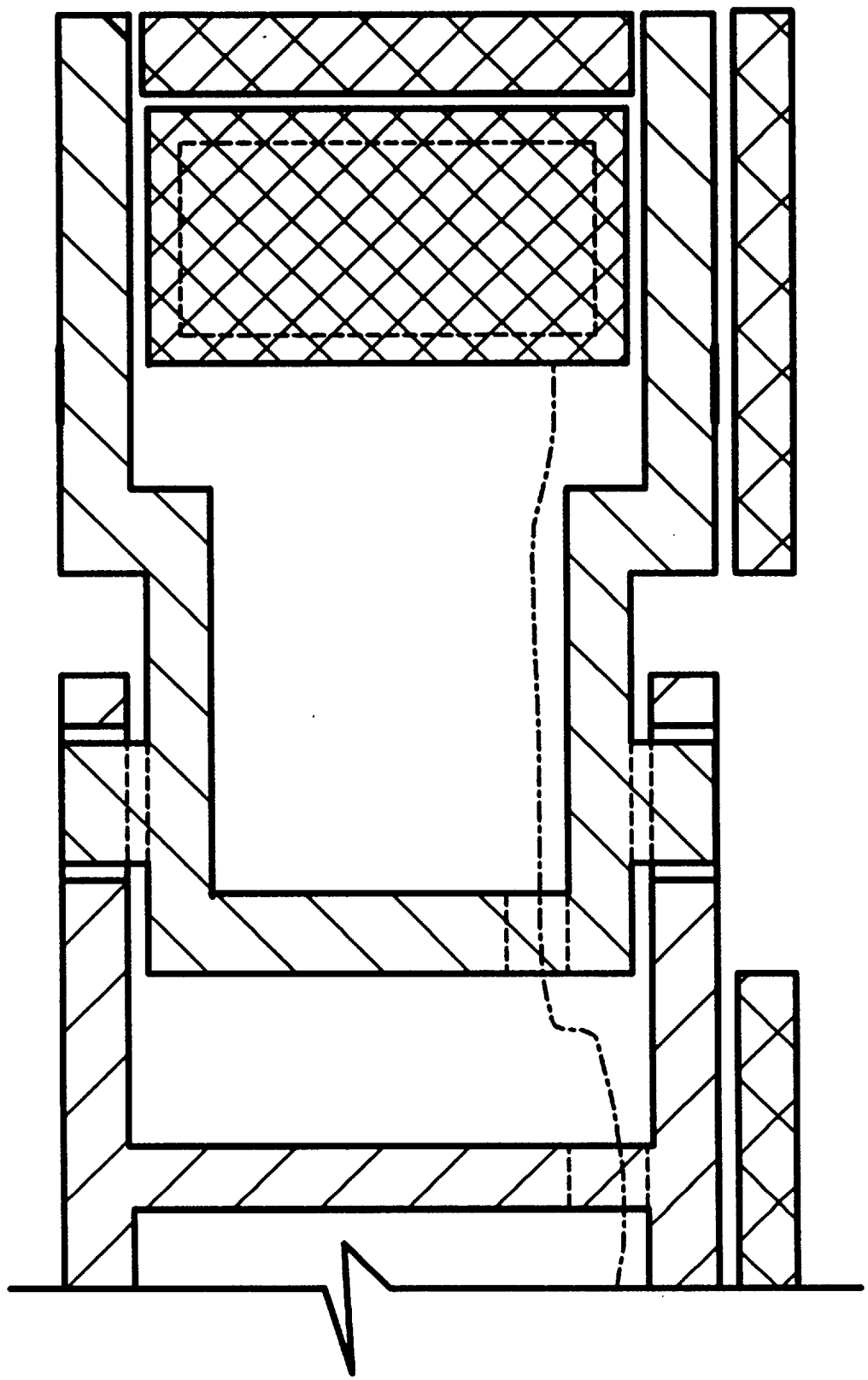
Figure 17E:
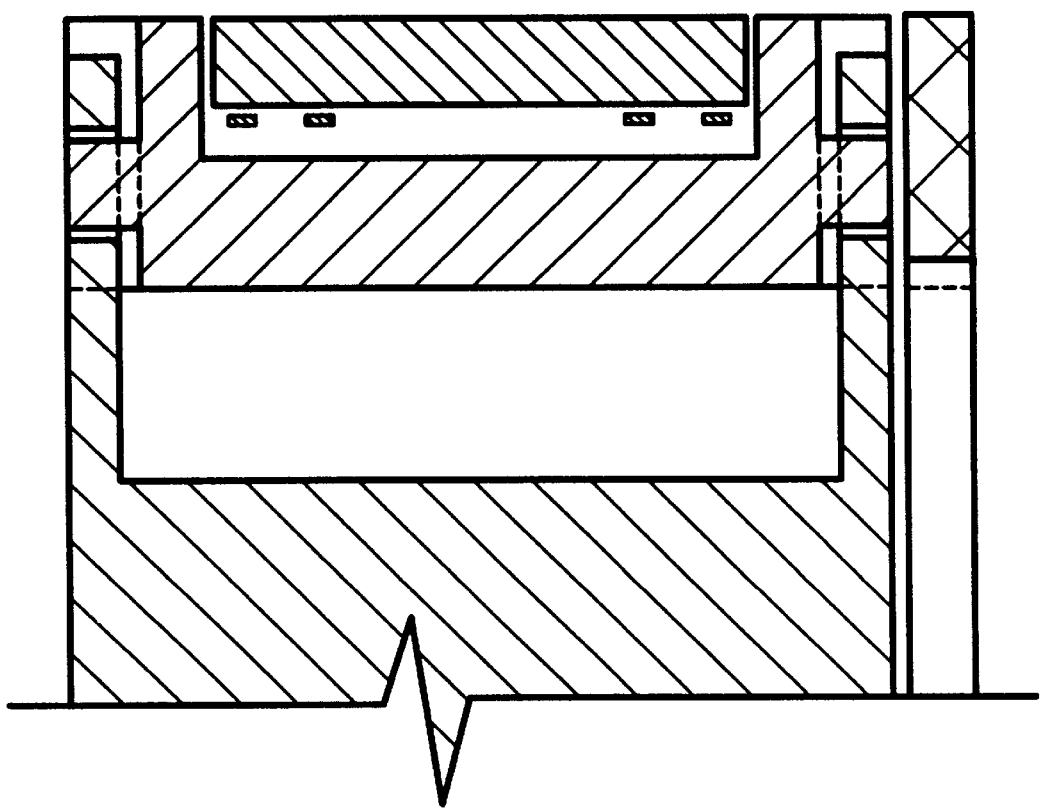
Figure 17F:
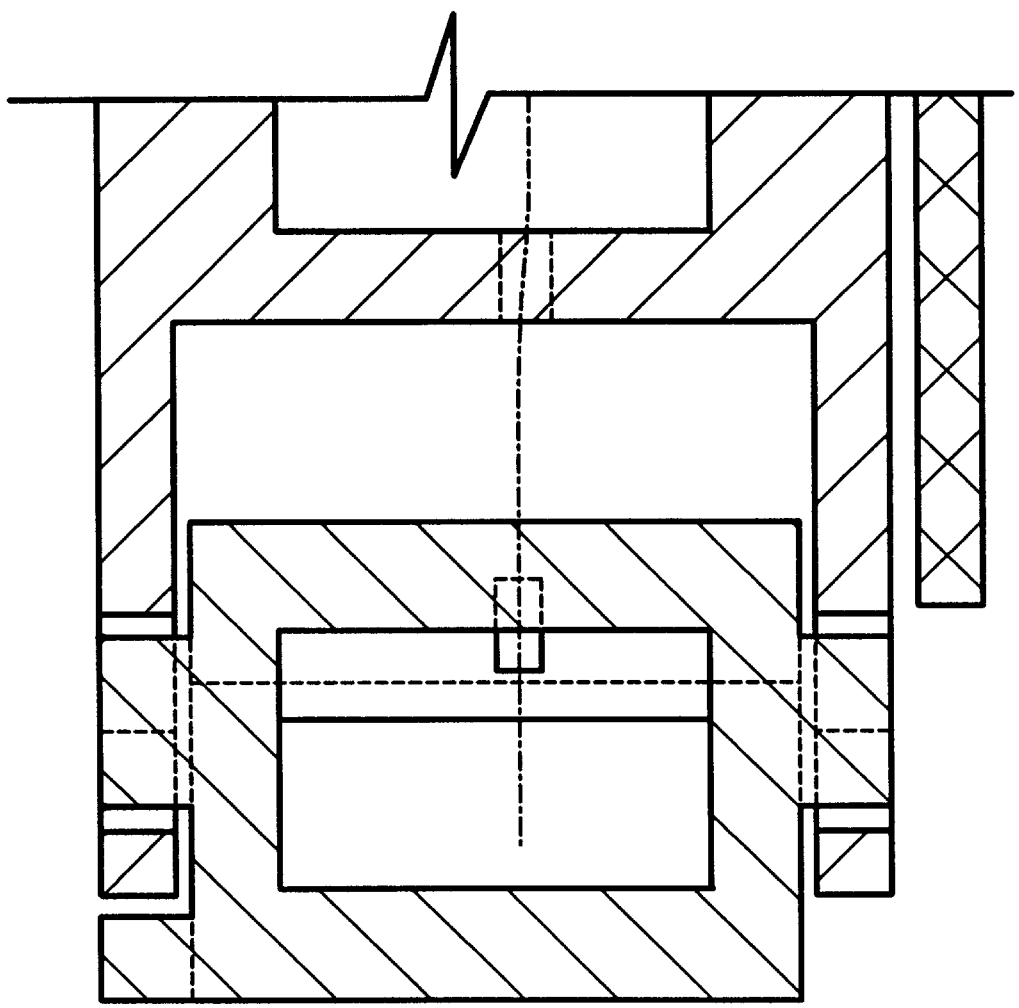
Figure 21:
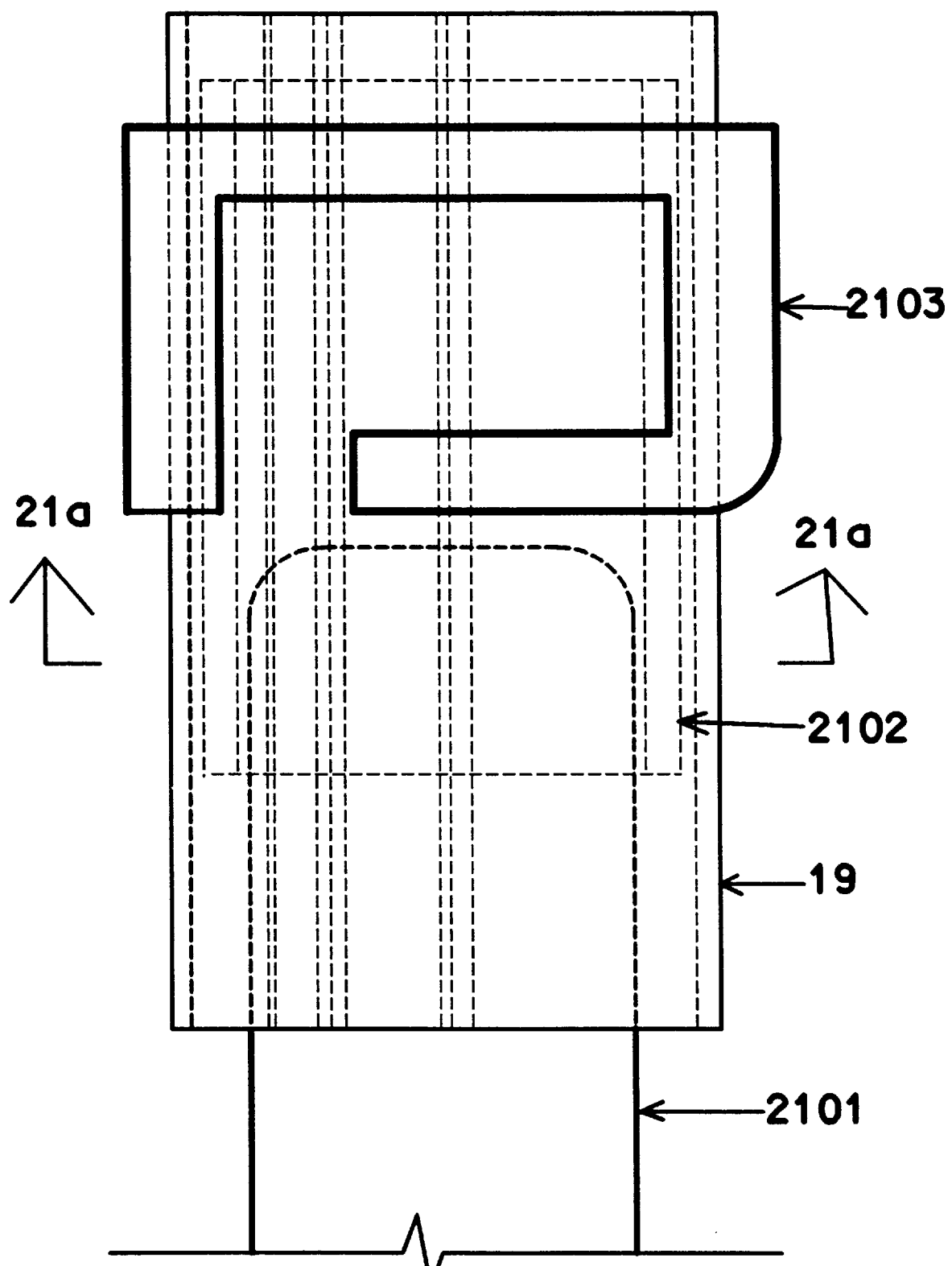
Figure 21A:
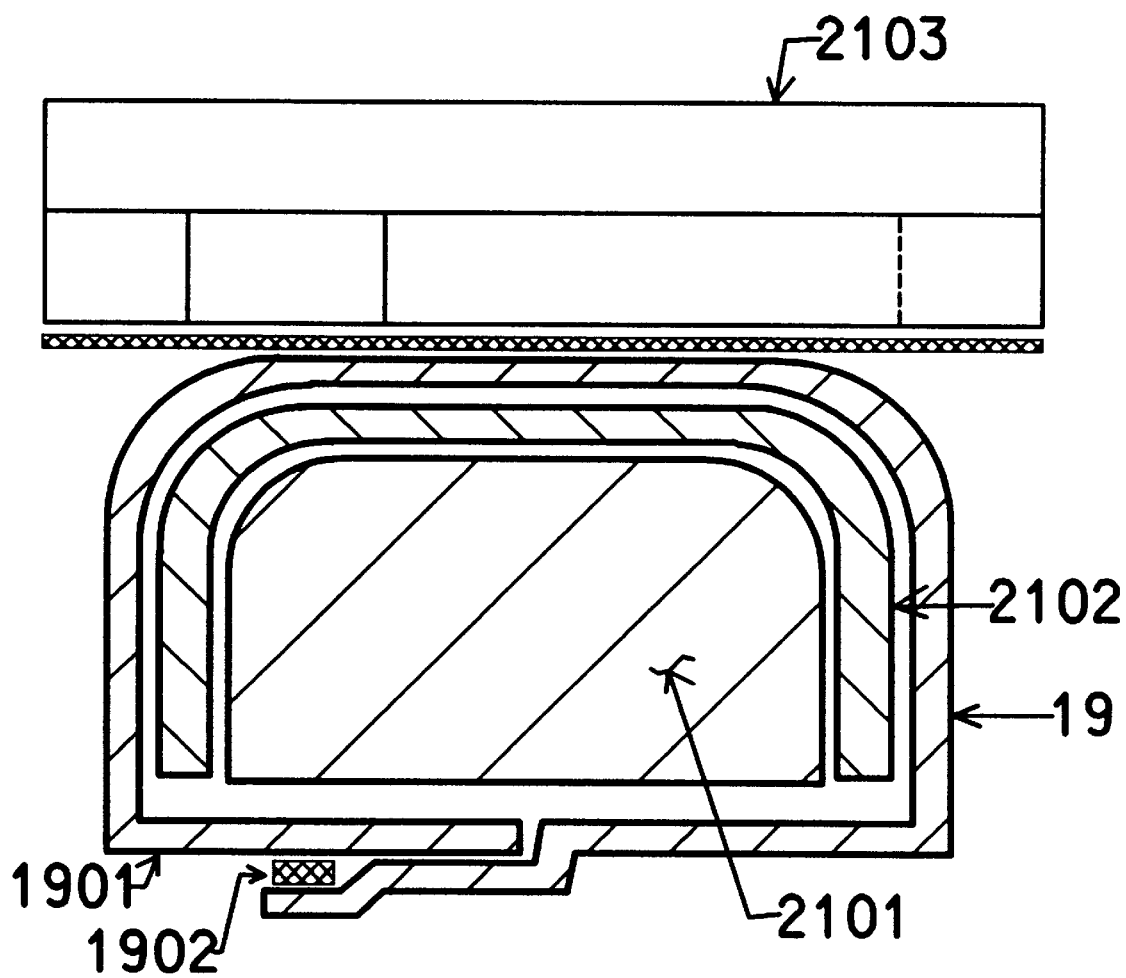
Figure 22:
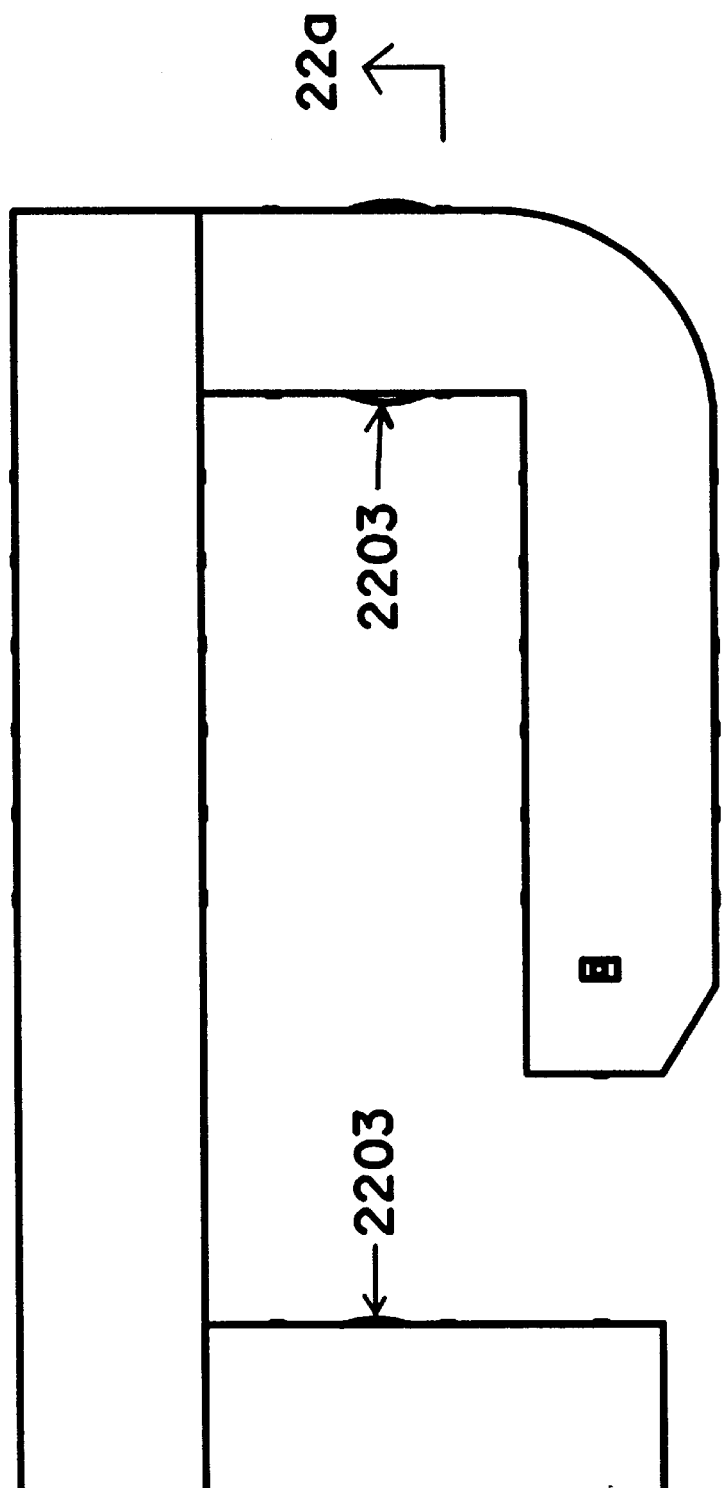
Figure 22A:
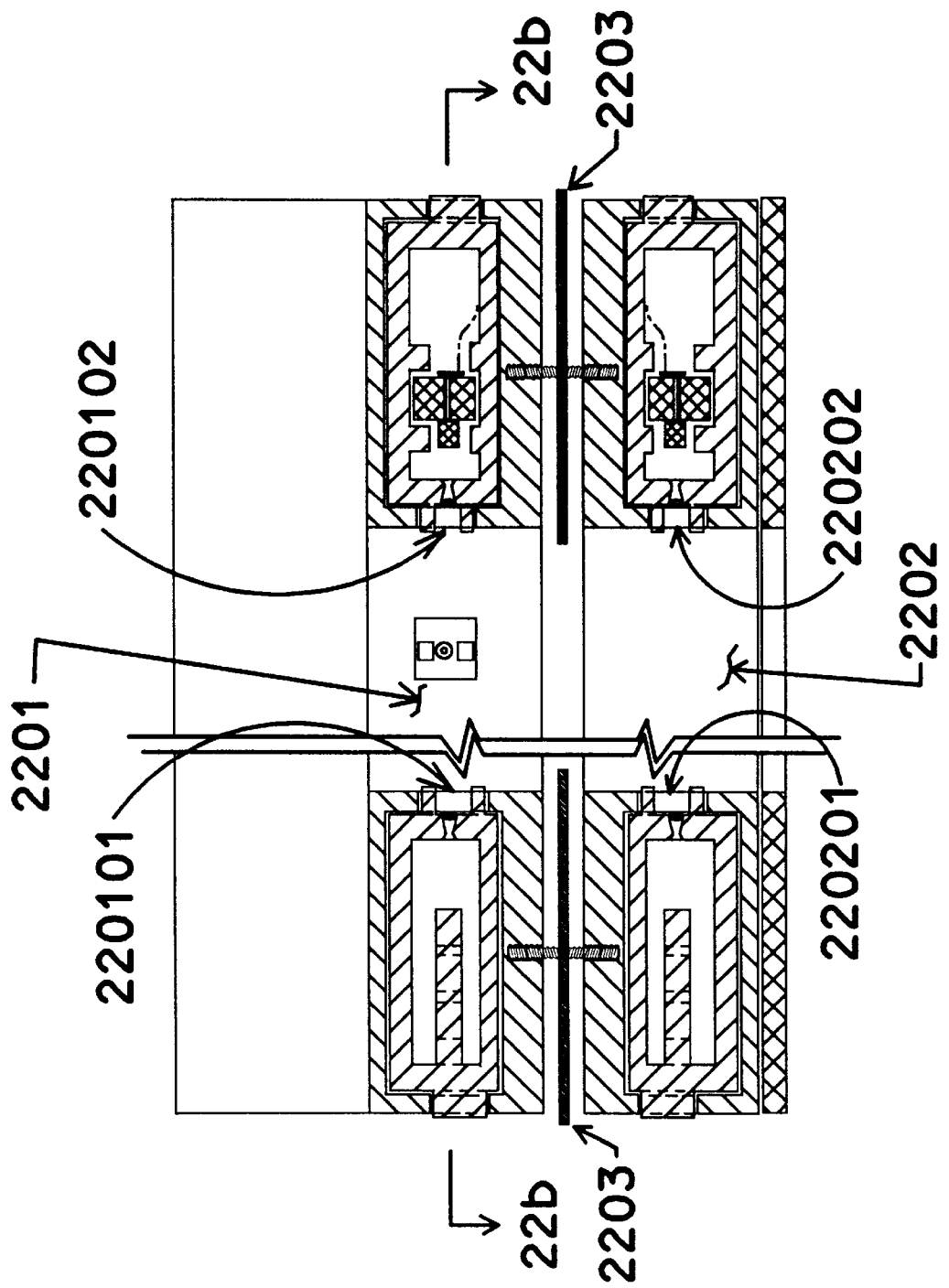
Figure 22B:
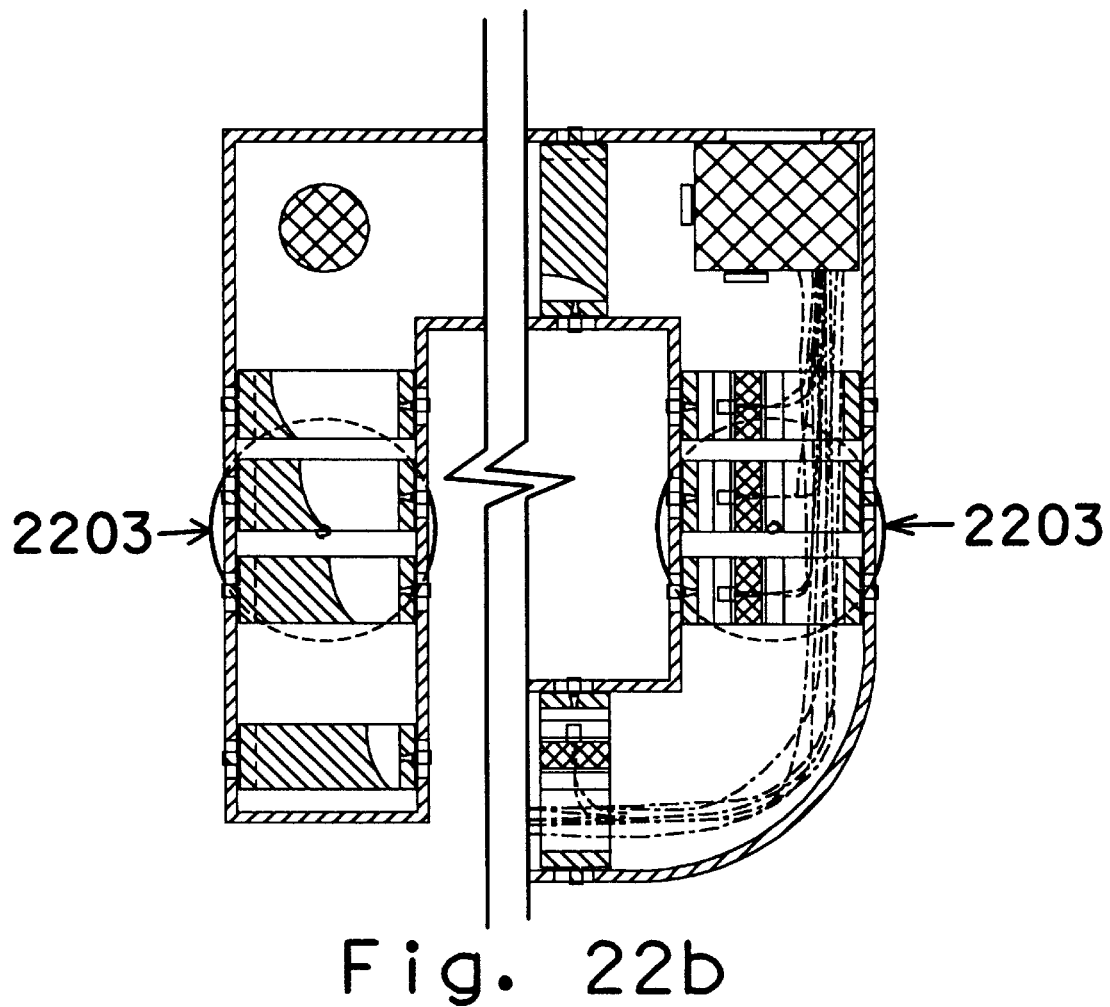
Figure 23:
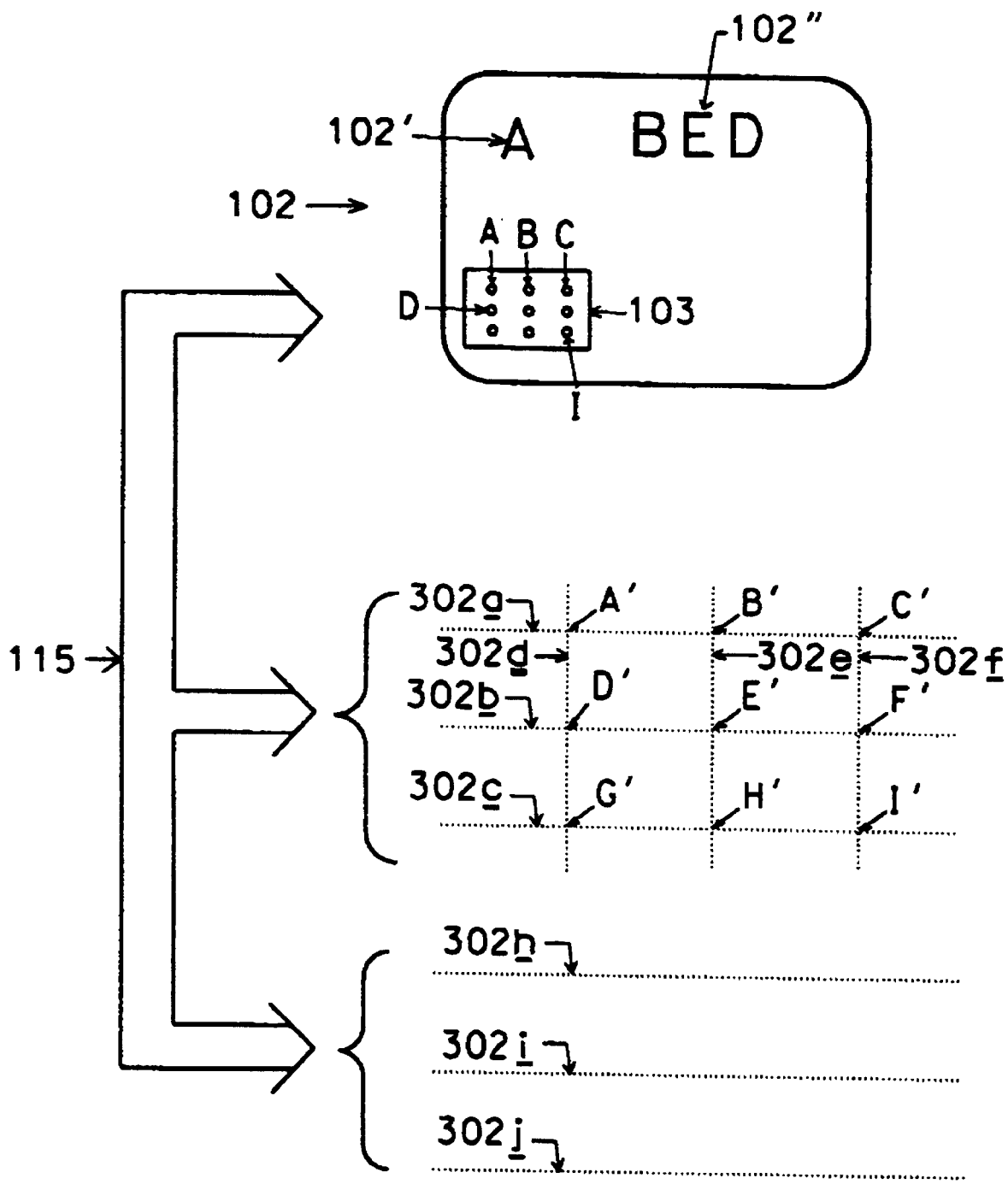

FIGS. 13A, 13B, and 13C are cross sections;

FIGS. 14, 14*a* and 14*b* are a sectional side view, an elevation view and a sectional plan view of the adjustable light-emitting elements shown in FIG. 2;

FIG. 15 and 15*a* are a plan view and a sectional side view of an adjustable photo-detecting element for the "space bar" slot shown in FIGS. 2 through 7;

FIGS. 16 and 16*a* are a sectional side view and a section view of the adjustable photo-detecting elements shown in FIGS. 2 through 7;

FIG. 17 is a plan view of a variation of the device, which can be bent or collapsed for storage;

FIG. 17*d*, 17*e*, and 17*f* and 17A', 17B' and 17C' are plan views and section views of varied pivoting joints for the device shown in FIG. 17;

FIG. 18 is a plan view which shows a bent or collapsed condition of the device, as shown in FIG. 17;

FIG. 19 is a plan view which illustrates a pair of the devices, as located on two pieces of VELCRO loop-type tapes or cloths or sheets, which are separated and put on a surface;

FIG. 20 is a plan view which illustrates a pair of the devices located on two pieces of VELCRO loop-type tape cloths or sheets, which are joined together and put on a surface;

FIGS. 21 and 21*a* are a plan view and a section view on lines 21*a*—21*a* which illustrate that the herein device can be located on a chair arm for convenient use;

FIGS. 22, 22*a* and 22*b* are a plan view, a sectional elevation view and a sectional plan view, respectively, of the improved device, in which light-emitting elements and photo-detecting elements can be adjusted vertically;

FIG. 23 is a schematic representation of apparatus operation; and

Figure 24:
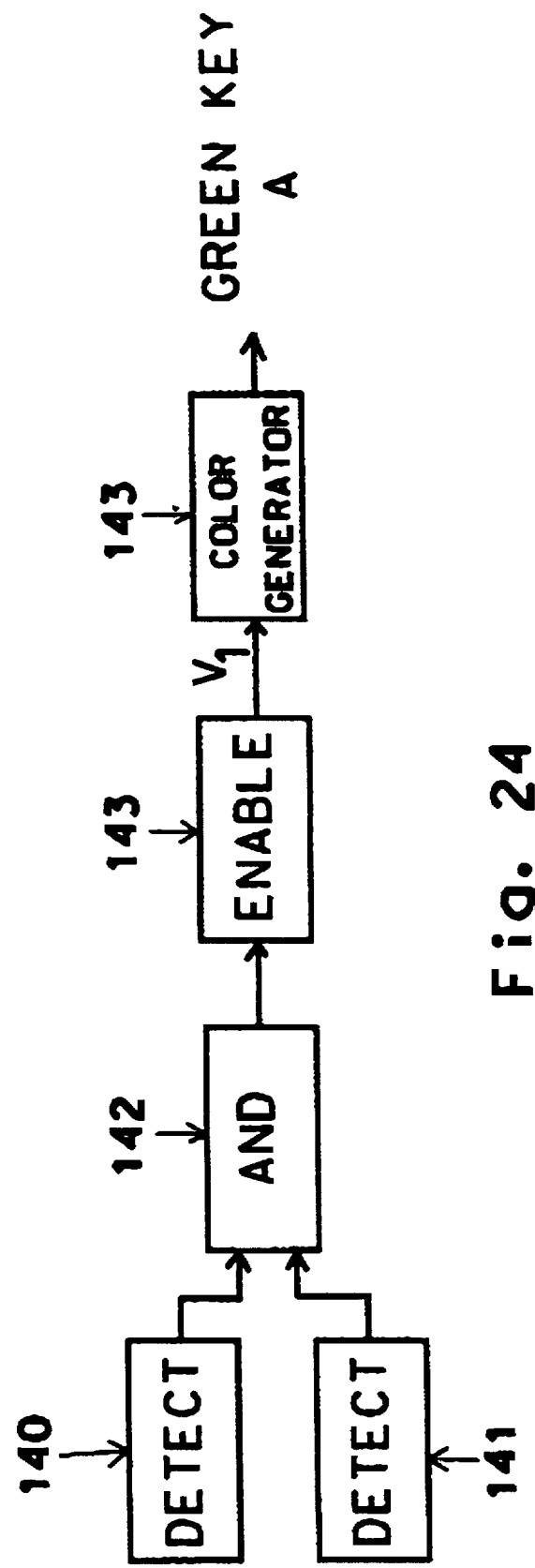

FIG. 24 is a circuit diagram.

DETAILED DESCRIPTION

Two forms of the improved photoelectric keyboard switches are described together herein. One form has light-emitting elements and photo-detecting elements, so situated that horizontal locations on a frame can be slightly adjusted. FIGS. 2, 4, 5, 6, and 7 illustrate this form of the device. The other form has light-emitting elements and photo-detecting elements characterized in that horizontal locations cannot be adjusted; and FIGS. 8 through 13 illustrate this form. The vertical locations of the light-emitting elements and photo-detecting, on a frame, of each form of the device, as illustrated in FIGS. 22, 22*a* and 22*b*, can optically be adjusted.

Each form of the device can have either battery packs to supply power for themselves, as for example those shown in FIGS. 2, 4, 5, 6, 8, 9, 10, 11, and 13; or "umbilical" cords, to supply them with power for lights, as shown in FIGS. 7 and 12, can be used. Communication between the device and host computers can be made with the umbilical cords for the latter form, and with infrared communicators for the former type.

Each embodiment of the device can have a pivoting joint or joints on which the device can be bent or collapsed for easy storage, as shown in FIGS. 17 and 18.

Except for FIGS. 1, 19, 20, and 21, only the photoelectric keyboard switches for use of the right hand are shown. Devices for use of the left hand are the mirror images of those shown for the right hand. They are not shown but are deemed embodied herein to be covered claims herein.

The source of light for the light-emitting elements of a device can be:

- a single light bulb, as those shown in FIGS. 2, 2*a*, 2*b*, 8, 8*a*, and 8*b*;
- from arrays of light bulbs, as those shown in FIGS. 4, 4*a*, 4*b*, 9, 9*a*, 9*b*, 13, 13*a*, and 13*b*;
- from two light bulbs, as those shown in FIGS. 5, 5*a*, 5*b*, 10, 10*a*, 10*b*, 22, 22*a*, and 22*b*;
- one single light bulb, but transmitted by a bundle of optical fiber glass tubes, as shown in FIGS. 6, 6*a*, 6*b*, 7, 7*a*, 7*b*, 11, 11*a*, 11*b*, 12, 12*a*, and 12*b*.

Figure 2B:
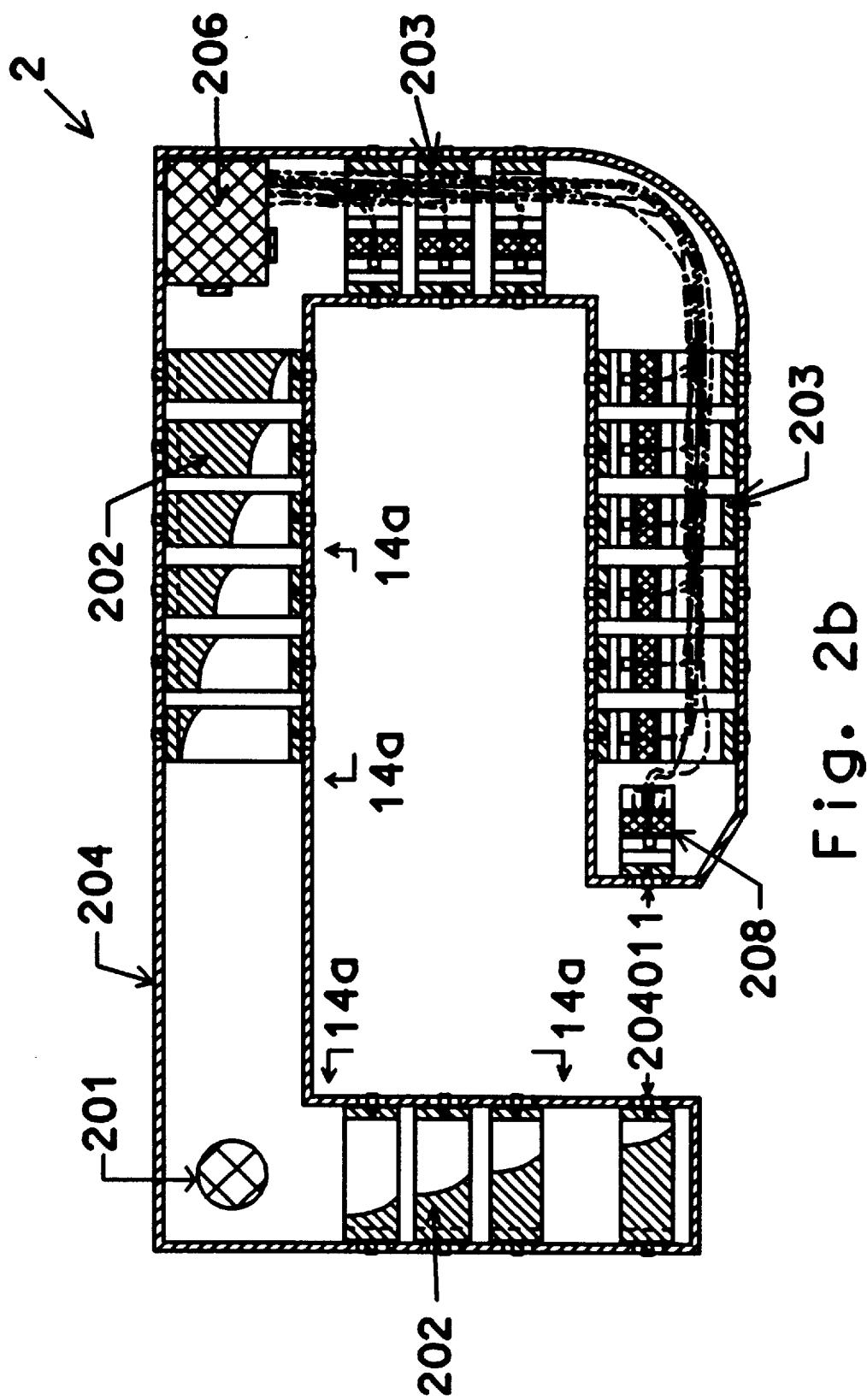

Referring to FIGS. 2, 2a and 2b, this variation of the photoelectric keyboard switch for the right hand 2 has a single light bulb as a light source, and has horizontally adjustable, light-emitting elements and photo-detecting elements, as shown by a light bulb 201, many light-emitting elements 202, many photo-detecting elements 203, a C-shaped case 204, a battery pack 205, a communicator 206, many strips of VELCRO hook tapes 207, and a photo-detecting end element 208.

The C-shaped case or frame is hollow inside, and has four bounding legs, i.e., legs 1, 2, 3, and 4 shown in FIG. 2, as 20401, 20402, 20403, and 20404, respectively. These four legs consist of four sides of the C-shaped case or frame. Leg 1 joins with leg 2. Leg 2 joins with leg 3. Leg 3 joins with the 4. Legs 1 and 3, as well as legs 2 and 4, are at opposite sides of the C-shaped case.

There are several "window" openings 204011 on the sides of the legs; and there is a window opening 208012 on the top side of leg 4 near its end. There is also another window opening 204011 on the end tip wall of leg 4. The battery pack can be on the top of any of the legs, although the Figures show it only on the top of leg 2. The VELCRO hook tapes are attached to the bottoms of the legs, with their hooks facing downward. Light-emitting elements are in legs 1 and 2. The photo-detecting end element is at the free end of leg 4.

The communicator is at the corner of legs 2 and 3, and is fixed in place by ears (lugs) and walls. The communicator is an infrared light signal-emitting device which can communicate signals produced by the device to a computer via infrared light. A light bulb is the light source for the device, and is on the interior corner of legs 1 and 2. As an option, the light-emitting element can be on legs 3 and 4.

The photo-detecting elements are in legs 1 and 2. The communicator can be on the corner of legs 1 and 2. The light bulb can be on the interior corner of legs 3 and 4. Furthermore, the locations of the light-emitting elements, the photo-detecting elements, the communicator, and the light bulb can be different from described, as long as the light-emitting elements and the photo-detecting elements are in pairs and are in opposite legs. A light-emitting element and a photo-detecting end element need to be paired prior or at the end tips of legs 1 and 4.

Referring to FIGS. 14, 14a and 14b, each of the light-emitting elements 202 needs or has an associated short tube 20201, one or two lens openings 20202, two short ears or lugs 20203, a long ear or lug 20204, and a reflective surface 20205. The short tube is fitted inside a leg of the C-shaped frame 204, cross sectional-wise. The interior of the short tube may be optionally gilded with light-reflective material. The two short ears, an upper, short ear and a lower, short ear are on one exterior wall of the short tube, while the long ear is on its opposite exterior wall. The upper, short ear is near the top of the wall, while the lower, short ear is near the bottom of the wall. The short ears and the long ears project from the surface of the short tube, and are confined by the top and bottom edges of window openings 204011 of the C-shaped case 204.

There are spaces between the side edges of a window opening and the edges of the short and long ears. The lens opening 20202 is a hole under and/or above the short ears. Except for the last light-emitting element in leg 1, the light-emitting elements in leg 1 of the C-shaped case have two lens openings: the upper openings 2020201, which are under the upper, short ears; and the lower lens openings 2020202, which are above the lower, short ears.

The last light-emitting element in leg 1 has only the lower lens openings. Each of the light-emitting elements in leg 2 has only one lens opening: the upper lens opening under the upper, short ears. The lens opening is a hole on the wall of the short tube. There is an optional, convex lens near the exterior rim of the lens openings. Behind the lens, the diameter of the lens hole optionally is reduced, and then enlarged to "smooth" the light paths of the lens from the interior of the short tube.

The reflective surface 20205 is a curved surface inside the short tube. The reflective surface reflects and focuses light from the light bulb to the lens hole, efficiently. The locations of the reflective surfaces for the light-emitting elements in series are so arranged that they will not block the light from each other, i.e., they will be in a "step-wise" mode. The reflective surface of the light-emitting element, which is the closest to the light bulb, will be the closest to the wall where the long ear is located. The reflective surface for the next in sequence, light-emitting element is more slightly spaced from the long ear wall than the surface of the previous in sequence, light-emitting element. Accordingly, the reflective surface of the light-emitting element, which is farthest from the light bulb, will be farthest from the wall where the long ear is located.

Referring to FIGS. 16 and 16a, each of the photo-detecting elements 203 includes a short tube 20301, one or two light path openings 20302, two short ears 20303, a long ear 20304, and a photo-detecting transistor board 20305. The short tube is fitted inside a leg of the C-shaped frame or case 204 cross sectional-wise. The two short ears, an upper, short ear, and a lower, short ear are located at one exterior wall of the short tube, while the long ear is at its opposite exterior wall. The upper, short ear is near the top of the wall, while the lower, short ear is near the bottom of the wall. The short ears or lugs, and the long ear, project from the surface of the short tube, and are confined by the top and bottom edges of window openings 204011 of the C-shaped case 204. Spaces are provided between the side edges of a window opening and the edges of the short and long ears. The light path opening 20302 is a hole under and/or above the short ears. The photo-detecting elements in leg 3 of the C-shaped case have two light path openings: the upper light path openings 2030201, which are under the upper, short ears; and the lower light path openings 2030202, which are above the lower, short ears.

The photo-detecting elements in leg 4 have only the upper light path openings, which are under the upper short ears. The photo-detecting transistor board 20305 is a circuit board which has one or two photo-detecting transistors matching with the number of the light path openings 2030501, mounted on one side of the board and wires/conductors 2030502, on the other side of the board. The photo-detecting transistor board is mounted inside the short tube. For example, it is fixed between ears 100 extending from the interior surfaces of the short tube, as shown in FIG. 16.

Referring to FIGS. 15 and 15a, the photo-detecting end element 208 includes a short tube 20801, a light path opening 20802, two short ears or lugs 20803, a top ear or lug 20804, and a photo-detecting transistor board 20805. The short tube can be located inside the end tip of leg 4 of the C-shaped case 204. The two short ears or lugs, an upper, short year and a lower, short year are at one exterior wall of the short tube. The upper, short ear is near the top of the wall, while the lower, short ear is near the bottom of the wall. The top ear is at the exterior wall adjacent to the upper, short ear. The short ears extend from the surface of the short tube and are confined by the top and bottom edges of a window opening 204011 at the end of leg 4 of the C-shaped case 204.

The horizontal ends of the top ear are confined by the edges of the window 28012. Spaces are provided between the side edges of a window opening, and the edges of the short and top ears. The lower light path opening 20802 is a hole above the lower, short ear. The photo-detecting transistor board 20805 has a photo-detecting transistor 2080501 mounted on one side of the board, and wires/conductors 2080502 on the opposite side of the board. The photo-detecting transistor board is mounted inside the short tube. One way of mounting is to have it fixed between ears 101' extending from the interior surfaces of the short tube, as shown in the Figures.

Referring to FIGS. 1 and 3, the light 301, emitted from the light bulb 201, is reflected and focused by the reflective surfaces 20205, to the lens openings 20202. The focused light beams 302 from the upper lens openings of legs 1 and 2 of the C-shaped case will form a usually invisible grid. Light beams passing through the upper light path openings 2020201 to the photo-detecting transistors 2030501 of the photo-detecting elements in legs 3 and 4 will be detected by the photo-detecting transistors. Therefore, the light beams 302 can form closed electric/photo loops.

Under this condition, the communicator 206 will send signals to a host computer 101, as via infrared light 303 or other electromagnetic radiation. The computer has a software or hardware program which will interpret the signals and present them on its monitor screen 102. The presented information shown as 103 will correspond to the grid of the described device and will occupy only a very small portion of the monitor screen.

When a light beam is blocked by a finger 105, its corresponding electric/photo loop will be open. Under this condition, the communicator will detect the openness and will send a signal about such openness to its host computer via light 303 again. The computer will interpret the signal, and then display the interpreted result on its monitor screen by changing its previous color or brightness. With this changed color or brightness on the monitor screen, the screen-observing user will know where finger 105 is and what it corresponds to.

Light beams emitted from the lower lens openings 2020202 of the light-emitting elements of the leg 1 will pass through the lower light path openings 2030202 of the photo-detecting elements of leg 3 and the photo-detecting element of leg 4. Under this condition, the communicator will send signals to the host computer indicating that the electric/photo loops are closed. The computer's software program will interpret the signals. When a light beam emitted from the lower lens opening is blocked by the user's finger, when the finger is further lowered or depressed from above, its corresponding electric/photo loop will be open. Under this condition, the communicator will detect the openness and will send a signal about the openness to its host computer. The computer will then interpret that signal and will take action, i.e., register the openness and display the result on its monitor screen by changing the previous color and/or light intensity. The computer may create a sound to announce that a character is registered. With this changed colors/brightness on the monitor screen and/or the generated sounds, the user will know where his/her finger is and what has just been "typed".

Leg gap 103, formed by the C-shaped case (see FIG. 3), allows a user's thumb to be located therein. When the light beam 302 in this gap is not blocked by the thumb, the closed condition of the electric/photo loop will be monitored, so that it can be recognized by the host computer, operating in a manner to that described above. When a thumb blocks the light beam 302, the open condition of the electric/photo loop and its corresponding signal will be transmitted, detected, interpreted, and registered by the host computer in a manner similar to that described in the last paragraph. Therefore, a command to produce a "space" will be executed by the computer.

The user may wish to adjust the spacings between adjacent light-emitting elements and adjacent photo-detecting elements, so that the grid created by the light beams can better fit his/her finger spacings. To adjust those spacings, the user needs only to put his/her fingers on the short ears and on the long ears, or the top ear for the end elements, and slide the light-emitting elements and/or the photo-detecting elements in the C-shaped case to their desired locations.

Referring to FIGS. 4, 4*a* and 4*b*, the shown variation of the photoelectric keyboard switch for the right hand has many light bulbs as light sources and has horizontally adjustable light-emitting elements and photo-detecting elements consisting of light bulbs 401, light-emitting elements 402, photo-detecting elements 403, a C-shaped case 404, a battery pack 405, a communicator 406, strips of VELCRO hook tapes 407, and a photo-detecting end element 408.

The constructions, locations and functions of the C-shaped case, the photo-detecting elements, the communicator, the VELCRO hook tapes, and the photo-detecting end element are the same as those devices, as described in FIGS. 2, 2*a* and 2*b*. The battery pack is, however, varied.

Referring to FIGS. 4A and 4A', each of the light-emitting elements 402 consists of a short tube 40201, one or two lens openings 40402, two short ears 40203, a long ear 40204, and a light bulb plate 40205. The constructions, locations and functions of the short tube, the lens opening, the short ears, and the long ears are the same as those described for FIGS. 2, 2*a* and 2*b*. A light bulb 4020502 is mounted on plate 40205 against each lens opening. That plate is mounted inside the short tube, as between ears extending from the interior surfaces of the short tube, as shown in the Figures. The wire 402051 connects a light bulb with the battery pack and provides power to the light bulb.

Figure 5:
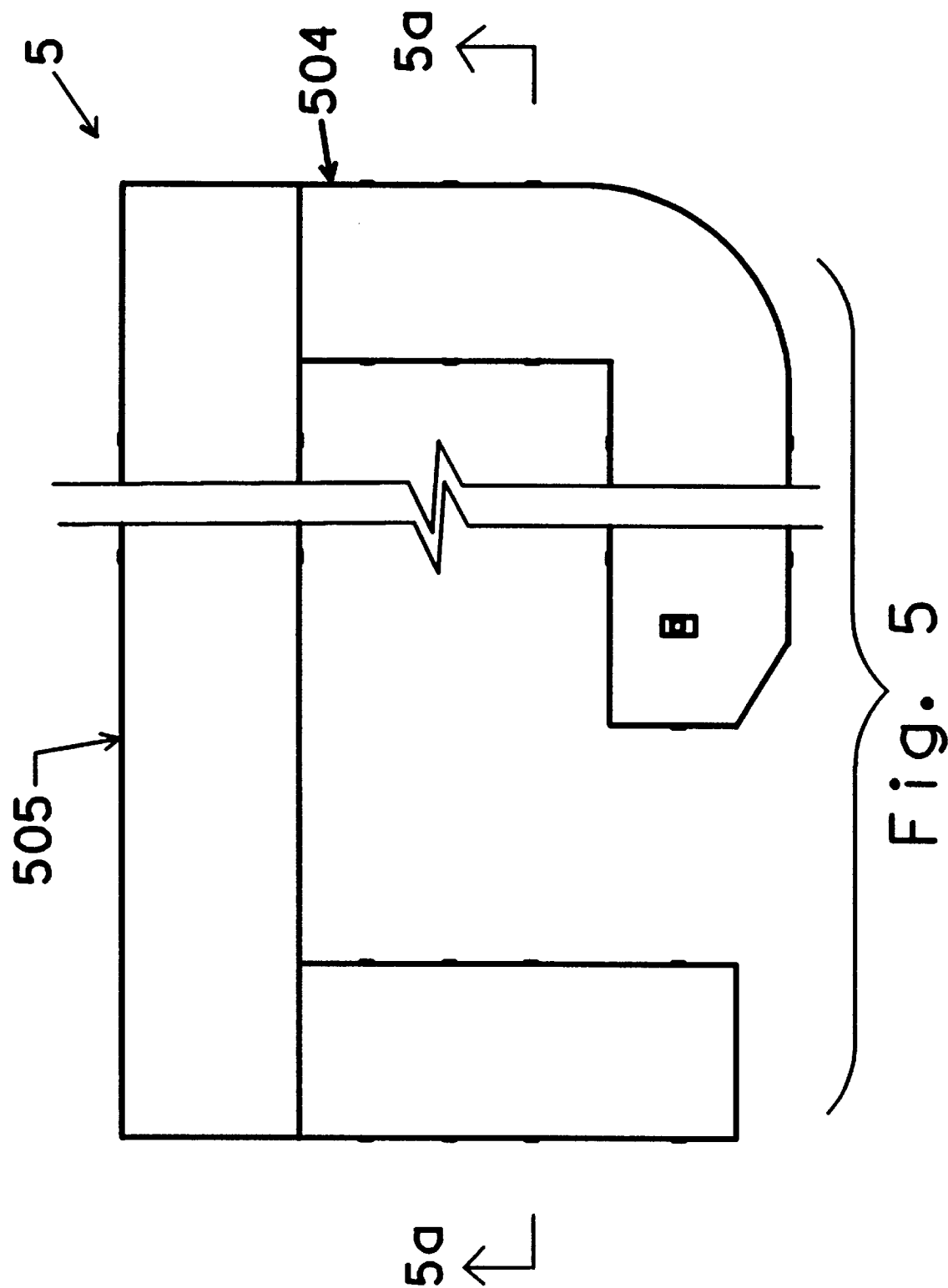
Figure 5B:
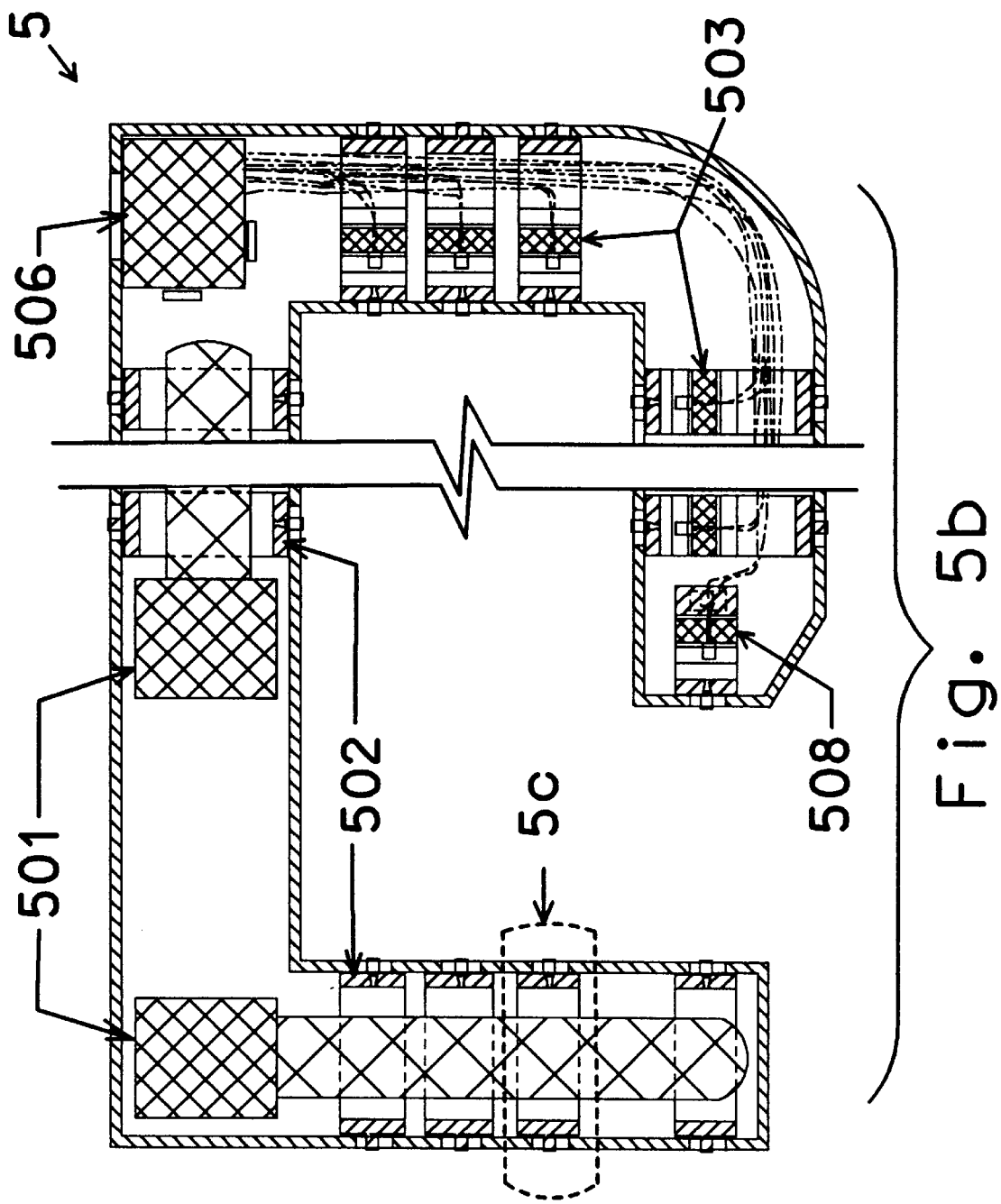

Referring to FIGS. 5, 5*a* and 5*b*, this variation 5 of photoelectric keyboard switch for the user's right hand (see thumb 50 and finger 51) has two light bulbs as light sources and has horizontally adjustable, light-emitting elements and photo-detecting elements, including two light bulbs and bases 501, light-emitting elements 502, photo-detecting elements 503, a C-shaped case 504, a battery pack 505, a communicator 506, strips of VELCRO hook tapes 507, and a photo-detecting end element 508. The constructions, locations and functions of the C-shaped case, the photo-detecting elements, the battery pack, the communicator, the VELCRO hook tapes, and the photo-detecting end element are the same as those aforementioned for FIGS. 2, 2*a* and 2*b*.

Referring to FIGS. 5A and 5A', each of the light-emitting elements 502 comprises a short tube 50201, one or two lens openings 50202, two short ears 50203, and a long ear 50204. The constructions, locations and functions of the short tube, the lens opening, the short ears, and the long ears are the same as those corresponding elements described for FIGS. 2, 2*a* and 2*b*. A section of the light bulb 501 is inside the short tube. A wire (not shown) connects the light bulb with the battery pack and provides peer to the light bulb.

Referring to FIGS. 6, 6*a* and 6*b*, this variation 6 of the photoelectric keyboard switch for the user's right hand has a light bulb as a light source and optical fiber glass tubes as light-transmitting means, and has horizontally adjustable, light-emitting elements and photo-detecting elements, including a light bulb 601, light emitting elements 602, photo-detecting elements 603, a C-shaped case 604, a battery pack 605, a communicator 606, strips of VELCRO hook tapes 607, and a photo-detecting end element 608. The constructions, locations and functions of the C-shaped case, the photo-detecting elements, the battery pack, the communicator, the VELCRO hook tapes, and the photo-detecting end element are the same as those aforementioned for FIGS. 2, 2a and 2b.

Referring to FIGS. 6A and 6A', each of the light-emitting elements 602 consists of a short tube 60201, one or two lens openings 60202, two short ears 60203, a long ear 60204, and an optical tube 60205. The constructions, locations and functions of the short tube, the lens opening, the short ears, and the long ears are the same as those corresponding elements described for FIGS. 2, 2a and 2b. The optical tube is an optical fiber glass tube. One end of each optical tube is mounted by ears on the wall of the short tube behind each lens opening. The other end of the optical tube is mounted near the light source. Light for the light-emitting element is transmitted from the light bulb via the optical tube. Wires (not shown) connect the light bulb with the battery pack and provides power to the light bulb.

The power sources for the light-emitting elements can be the battery packs, as illustrated and described, in or for the previous Figures; or, the power or light for the devices can be provided via umbilical cords. For an example, referring to FIGS. 7, 7a and 7b, the power pack and the light bulb, which are substantially identical to those shown in FIGS. 6, 6a and 6b, are replaced by umbilical cords 701 for power/communications, and 702 for light. The cord 701 is a cable, which can supply power and provide communications, if the communicator 703 is not used. The cord 702 can be a cable combined with the cord 701, if the light source for the device is a light bulb, as that for FIGS. 6, 6a and 6b; or, the cord 702 can be an optical fiber glass tube, which can convey light from a light source, not shown, to the light emitter 704, which is an enlarged surface at the end of the optical fiber glass tube. The light emitter can disperse the light transmitted through the optical fiber glass tube into the chamber 705, which is a small space in the corner of legs 1 and 2. Light will then be picked up by each optical fiber glass tube of each light-emitting element.

The principles, functions and uses of this device described in FIGS. 4, 4a, 4b, 5, 5a, 5b, 6, 6a, 6b, 7, 7a, and 7b are similar to the device aforementioned for the devices shown in FIGS. 2, 2a and 2b

Referring to FIGS. 8, 8a and 8b, this variation 8 of the photoelectric keyboard switch for the right hand has a single light bulb as a light source, and has horizontally non-adjustable, light-emitting elements and photo-detecting elements, including a light bulb 801, light-emitting elements 802, photo-detecting elements 803, a C-shaped case 804, a battery pack 805, a communicator 806, strips of VELCRO hook tapes 807, and a photo-detecting end element 808.

The c-shaped case defines or bounds an open typing area 106 and has four legs, i.e., legs 1, 2, 3, and 4, shown in FIG. 8 as 80401, 80402, 80403, and 80404, respectively. These four legs are located at the four sides of the C-shaped, generally rectangular, case or frame. Leg 1 joins with leg 2. Leg 2 joins with leg 3. Leg 3 joins with leg 4. Legs 1 and 3, as well as legs 2 and 4, are at the opposite sides of the C-shaped case. The battery pack can be on the top or tops of any of the legs, although the Figures show it only on the top of leg 2. The VELCRO hook tapes are attached to the bottom of the legs, with their hooks facing downward to attach to corresponding VELCRO tapes shown at 807" on a carrier 807A, such as the arm of a chair or a table.

The light-emitting elements are in legs 1 and 2. The photo-detecting elements are in legs 3 and 4. The photo-detecting end element is at the free end of leg 4. The communicator 806 is at the corner framed by legs 2 and 3. The communicator is an infrared light signal-emitting device, which can communicate produced signals to a computer via infrared light. The light bulb is the light source for the device and is on the interior corner of legs 1 and 2.

As an option, the light-emitting elements can be in legs 3 and 4. The photo-detecting elements can be in legs 1 and 2. The communicator can be on the corner of legs 1 and 2. The light bulb can be on the interior corner of legs 3 and 4. Furthermore, the locations of the light-emitting elements, the photo-detecting elements, the communicator, and the light bulb can have other locations or arrangements on the frame so long as the light-emitting elements and the photo-detecting elements are in pairs and are in opposed legs. A light-emitting element and a photo-detecting end element can be paired at or near the end tip of legs 1 and 4 that form the thumb gap.

Referring to FIGS. 8A and 8B, each of the light-emitting elements 802 includes a short tube 80201, one or two lens openings 80202, and a reflective surface 80203. The short tube is a portion of a leg of the C-shaped case 804. The interior of the short tube may be optionally gilded with light-reflective material. Except for the last light-emitting element in leg 1, the light-emitting elements in leg 1 of the C-shaped case have two lens openings, the upper lens openings 8020201 and the lower lens openings 8020202. The last light-emitting element in leg 1 has only lower lens opening.

Each of the light-emitting elements in leg 2 has only one lens opening—the upper lens opening. The lens opening is a hole on the wall of the short tube. There is an optional convex lens near the exterior rim of the lens opening. Behind the lens, the diameter of the lens hole optionally is reduced, then enlarged to "smooth" the light paths to the lens from the interior of the short tube.

The reflective surface 80203 is a curved surface inside the short tube. The reflective surface can reflect and focus the light from the light bulb to the lens opening, efficiently. The reflective surfaces for the light-emitting elements in series are in a "step-wise" mode.

The reflective surface of the light-emitting element, which is the closest to the light bulb, will be the closest to the wall opposite to the lens openings. The reflective surface for the next light-emitting element will be spaced more slightly away from that wall than for the previous light-emitting element. Therefore, the reflective surface of the light-emitting element, which is the farthest from the light bulb, will be the closest to the wall at which the lens openings are located.

Referring to FIGS. 8C and 8D, each of the photo-detecting elements 803 includes a short tube 80301, one or two light path openings 80302, and a photo-detecting transistor board 80304. The short tube is a portion of a leg of the C-shaped case 804. The light path opening 80302 is a hole on the wall of the short tube. The photo-detecting elements in leg 3 of the C-shaped case have two light path openings—the upper light path opening 8030201 and the lower light path opening 8030202. The photo-detecting elements in leg 4 have only the upper light path openings.

The photo-detecting transistor board 80304 is a circuit board which has one or two photo-detecting transistors, matching with the number of the light path openings 8030401, mounted on one side of the board and wires/conductors 8030402 on the other side of the board. The photo-detecting transistor board is mounted inside the short tube. One way of mounting is to have it fixed between ears extending from the interior surfaces of the short tube, as shown in the Figures.

Referring to FIG. 8E, the photo-detecting end element 808 consists of a short tube 80801, a light path opening 80802, and a photo-detecting transistor board 80804. The short tube is a portion of leg 4 of the C-shaped case 804, and is at the end of leg 4. The photo-detecting transistor board 80804 is a circuit board, which has a photo-detecting transistor 8080401 mounted on one side of the board and wires/conductors 8080402, on the other side of the board. The photo-detecting transistor board is mounted inside the short tube. One way of mounting is to have it fixed by ears, and the interior surfaces of the short tube, as shown in the Figures.

Referring to FIGS. 9, 9a and 9b, this variation 9 of the photoelectric keyboard switch for the right hand has multiple recessed light bulbs as light sources and has horizontally non-adjustable, light-emitting elements and photo-detecting elements, such as multiple light bulb boards 901, multiple light-emitting elements 902, multiple photo-detecting elements 903, a C-shaped case 904, a battery pack 905, a communicator 906, multiple stripes of VELCRO hook tapes 907, and a photo-detecting end element 908.

The constructions, locations and functions of the C-shaped case, the photo-detecting elements, the communicator, the VELCRO hook tapes, and the photo-detecting end element are the same as those aforementioned for FIGS., 8, 8a and 8b. A variation of the battery pack, which is different from that shown in FIGS. 8, 8a and 8b, is shown in FIGS. 9, 9a and 9b.

Referring to FIGS. 9A and 9B, each of the light-emitting elements 902 comprises a short tube 90201, and one or two lens openings 90202. The short tube is a portion of a leg of the C-shaped case 904. Except for the last light-emitting element in leg 1, the light-emitting elements in leg 1 of the C-shaped case have two lens openings—the upper lens opening 9020201 and the lower lens opening 9020202. The last light-emitting element in leg 1 has only lower lens openings. Each of the light-emitting elements in leg 2 has only one lens opening—the upper lens opening. The lens opening is a hole on the wall of the short tube. There is an optional convex lens near the exterior rim of the lens opening. Behind the lens, the diameter of the lens hole optionally is reduced, then enlarged, to smooth the light paths to the lens from the interior of the short tube. On light bulb board 901, a bulb 90101 is mounted facing each lens opening. Conductors or wires 90102 are mounted on the board to provide power for the light bulbs. The light bulb board is mounted inside the short tube. One way of mounting is to fix the light bulb board by ears and walls of the short tube, as shown in these Figures.

Referring to FIGS. 10, 10a and 10b, the variation 10 of the photoelectric keyboard switch for the right hand has two light bulbs as light sources and has horizontally non-adjustable, light-emitting elements and photo-detecting elements, including two light bulbs 1001, multiple light-emitting elements 1002, multiple photo-detecting elements 1003, a C-shaped case 1004, a battery pack 1005, a communicator 1006, multiple strips of VELCRO hook tapes 1007, and a photo-detecting end element 1008.

The constructions, locations and functions of the C-shaped case, the light-emitting elements, the photo-detecting elements, the battery pack, the communicator, the VELCRO hook tapes, and the photo-detecting end element are the same as those aforementioned for FIGS., 8, 8a and 8b. Light bulb 1001 is a slender electric bulb, which supplies light to each lens opening. Conductors or wires (not shown) connect the light bulbs to the battery pack. The light bulbs are inside legs 1 and 2 of the device, as shown in FIGS. 10' and 10".

Referring to FIGS. 11, 11a and 11b, this variation 11 of the photoelectric keyboard switch for the right hand has a light bulb as a light source, and many optical fiber glass tubes as light transmission means, and has horizontally non-adjustable (i.e., non-position adjustable), light-emitting elements and photo-detecting elements. See light bulb 1101, light-emitting elements 1102, photo-detecting elements 1103, a C-shaped case 1104, a battery pack 1105, a communicator 1106, strips of VELCRO hook tapes 1107, a photo-detecting end element 1108, and optical tubes 1109. The constructions, locations and functions of the C-shaped case, the light-emitting elements, the photo-detecting elements, the battery pack, the communicator, the VELCRO hook tapes, and the photo-detecting end element are the same as those aforementioned for FIGS. 8, 8a and 8b.

The optical tube 1109 is an optical fiber glass tube, one end of which is mounted by ears on the wall of the short tube behind each lens opening; the other end of the optical tube is mounted near the light source. Light for the light-emitting element is transmitted from the light bulb via the optical tube. Wires (not shown) connect the light bulb with the battery pack and provides power to the light bulb.

The power sources for the light-emitting elements can be the battery packs, as illustrated and described, in or for the previous Figures, or, the power or light for the devices can be provided by umbilical cords. For an example, referring to FIGS. 12, 12' and 12", the power pack and the light bulb are replaced by umbilical cords 1201 for power/communications and 1202 for light. The cord 1201 is a cable which can supply power and provide communications, if the communicator 1203 is not used for the device. The cord 1202 can be a cable, which can be combined with the cord 1201, if the light source for the device is a light bulb, as that for FIGS. 11, 11a and 11b; or, the cord 1202 can be an optical fiber glass tube, which can convey light from a light source, not shown, to the light emitter 1204, which has an enlarged surface at the end of the optical fiber glass tube. The light emitter can disperse light transmitted through the optical fiber glass tube into the chamber 1205, which is a small space in the corner of the legs 1 and 2. Light will then be picked up by each optical fiber glass tube of each light-emitting element.

Referring to FIGS. 13, 13a and 13b, this variation 13 of the photoelectric keyboard switch for the right hand has many light bulbs as light sources and has horizontally non-adjustable, light-emitting elements and photo-detecting elements, including multiple light bulb boards 1301, multiple light-emitting elements 1302, multiple photo-detecting elements 1303, a C-shaped case 1304, a battery pack 1305, a communicator 1306, strips of VELCRO hook tapes 1307, and a photo-detecting end element 1308. The constructions, locations and functions of the C-shaped case, the photo-detecting elements, the battery pack, the communicator, the VELCRO hook tapes, and the photo-detecting end element are similar to those aforementioned for FIGS. 8, 8a and 8b.

Referring to FIGS. 13A, 13B and 13C, each of the light-emitting elements 1302 consists of a short tube 130201, and one or two lens bulb openings 130202. The short tube is a portion of a leg of the C-shaped case 1304. Except for the last light-emitting element in leg 1, the light-emitting elements in leg 1 of the C-shaped case have two bulb openings—the upper bulb opening 13020201 and the lower bulb opening 13020202. The last light-emitting element in leg 1 has only a lower bulb opening.

Each of the light-emitting elements in leg 2 has only one bulb opening—the upper bulb opening. The bulb opening is a hole on the wall of the short tube. The light bulb board 1301 is a board on which a light bulb 130101 is mounted facing each bulb opening. There is a convex lens at the top of each light bulb. Conductors or wires 130102 are mounted on the board to provide power for the light bulbs. The light bulb board is mounted inside the short tube. One way of mounting is to fix the light bulb board by walls of the short tube, as shown in these Figures.

The uses of the devices illustrated in FIGS. 8, 8a, 8b, 9, 9a, 9b, 10, 10a, 10b, 11, 11a, 11b, 12, 12a, 12b, 13, 13a, and 13b are the same as those described for those shown in FIGS. 2, 2a and 2b, except that the horizontal locations of the light-emitting elements, the photo-detecting elements, and the photo-detecting end elements cannot be adjusted.

The principles of use of the devices are the same as those described for the device described in FIGS. 2, 2a and 2b.

In summary, when a computer and the typing device are turned on, a small block or blocks of symbols or keys, which resemble an ordinary keyboard, or portions of a keyboard, will be shown with certain color or certain brightness on the monitor screen of the computer. When a user's finger is placed inside of the C-shaped case and moved downward to block any two light beams (as may extend perpendicularly and intersect) emitted from two upper lens openings of two light-emitting elements in two different legs of the C-shaped case, the color or brightness of the corresponding character of the two blocked light beams will be changed on the computer monitor screen. The user will then know which character that finger is "placed" upon.

When that finger is further lowered and blocks the light beam emitted from the lower lens opening below, the color and/or the brightness of that character, which already has an outstanding color/brightness, will be further changed. A sound may also be generated by the computer. The sound and the changed color indicate that the character has been typed into the computer. The small block or blocks of symbols displayed on the monitor screen can be changed by an optional "key" in the C-shaped case(s), i.e., the blockage of certain two upper light beams and one lower light beam will give the computer a signal to change the meanings or representations of the light beam grids.

Therefore, there is no need to have many keys for the device. For example, if a user wants to switch from the alphabetical typing to a numerical input, he/she needs only to block a certain key in the device, so that the keyboard symbol block on the monitor screen will be changed to a number keyboard. Then, the user can use the same device to input the numbers. The use of a computer to interpret the signals and display on the monitor screen will enable a user to customarily design his/her own keyboards. This is another advantage of using the herein described devices.

Referring to FIGS. 17 and 18, the described devices can have a few pivoting joints enabling folding for storage. FIG. 17 shows an unfolded device, while FIG. 18 shows a folded device. Typically, such pivoting joints are at the joint of legs 1 and 2, referring to FIGS. 17B and 17e; at the joint of legs 3 and 4, referring to FIGS. 17C and 17f; and near the joint of legs 2 and 3, referring to FIGS. 17A and 17d, of the C-shaped case. The devices shown in FIGS. 13 are examples to illustrate the pivoting joints.

Referring to FIG. 19, a positioning cloth 19 is a cloth with VELCRO loop cloth 1901 on its front side, a VELCRO hook tape 1902 on its back side, and many optional rubber pads 1903 on its back side.

Referring to FIGS. 19 and 20, when using the device, the user first lays down two pieces of the position cloths 19 on top of a flat surface 20, such as on a desk. The position cloths can be put at any convenient locations for the user, as shown in FIG. 19. The position cloths can be joined together to form a larger cloth, as shown in FIG. 20. The function of the position cloths is to create locating places on which the typing devices can be placed and fixed. The rubber pads help the position cloths to resist sliding on the flat surface. The user next puts the devices on top of the position cloths. The VELCRO hoop tapes on the bottoms of the frames of the devices will hook onto the loops of the VELCRO elements in the position cloths. This provides relatively firm locations for the typing devices. The user can then turn devices "ON" for use.

Referring to FIGS. 21 and 21a, a user may wrap a position cloth 19 on a chair arm 2101, then fix the device 2103 on the position cloth, so that he/she can sit comfortably to type. The user wraps the position cloth on the chair arm to hook tape 1902 on the back of the position cloth, to engage with its VELCRO loop cloth 1901. If a chair arm is not long enough to provide for comfortable use of the typing device, an arm chair extension board 2102, shown in FIGS. 21 and 21a, can be used. The arm chair extension board is a board of suitable shape and about the width of the arm chair, and strong enough to support partial weight of a hand and an arm.

The user may wrap a positioning cloth on his/her own leg, then place the device on the position cloth to enable typing as long as communications between the device and the host computer can be maintained.

The user may wish to adjust the vertical distance between the upper beam plane and the lower beam plane. Referring to FIGS. 22, 22a and 22b, the upper plane 2201 is formed by the light beams emitted from the upper lens openings 220101, to the upper light path openings 220102. The lower plane 2202 is formed by the light beams emitted from the lower lens openings 220201 to the lower light path openings 220202. To adjust the distance or distances between such planes, two small turning plates 2203 are used. A male screw extends from each surface of a turning plate. Each of the male screws will engage with a female screw at the top or the bottom of the C-shaped case. The screws are so arranged that when the turning plate is turned in one direction, the distance between the upper plane and the lower plane will be shortened, or vice versa.

Referring to FIG. 23, it illustrates the operation of the apparatus. Local area 103 of the computer screen is dedicated to showing of "keys" A–I, as for example in orange color. The virtual typing zone, as seen in FIG. 1, is represented by longitudinal light beams 302a–302c, and lateral light beams 302d–302f, all at an upper level (and intersecting at nodes A'–I' as shown); and by longitudinal light beams 302h–302j, and lateral light beams 302k–302m, all at a lower level (and intersecting at nodes A"–I" as shown).

Nodes A', B' and C' are directly above beam 302h; nodes D', E' and F' are directly above beam 302i; and nodes G', H' and I' are directly above beam 302j. Visually seen key A corresponds to virtual keys (nodes) A' and 302h; visually seen key B corresponds to virtual keys (nodes) B' and 302h; and so on, ending with visually seen key I corresponding to virtual keys I' and 302j.

When the user's finger 105 is lowered into the beam intersection node A', both beams 303a and 302d are interrupted, whereby this is detected by the described sensors, and the resultant signal or signals transmitted, as by bus or path 115 to the computer 102, causing the color of observable key A to change from orange to green, for example (i.e., there is a color change, or some other indicator change occurs, that the user can detect with his senses). This means to the user that his finger has correct position to "type" an A character. If he then further lowers his finger 105 to the lower level, and to interrupt beam 302h, consequent interruption of beams 302h is sensed, and signal or signals transmitted via bus 115 to 102, causes the color of "key" A to change again, as to yellow for example.

At the same time, an "A" character is registered in the computer and projected onto the screen at location 102' shown. A row of characters may thus be typed onto the screen, as at "BED" shown at 102", the circuitry for this being known, as in conventional word processing equipment. Therefore, a user can carry out word processing without having to strike physical keys with his/her fingers. Key color change circuitry is known, as in color television circuitry.

FIG. 24 is a simple representation of a circuit to effect color change at key A. Detectors for beams 302a and 302d are shown at 140 and 141. If both detectors operate, to sense interruption of both beams 302a and 302d, as at node A', their outputs are passed to AND gate 142, the output of which enables at 143 transmission of a voltage level $V_1$ to a green color generator 143, to produce a green key A. However, if the user's finger interrupts neither or only one of the beams 302a and 302d, the AND gate is not activated, and voltage $V_1$ transmission is not enabled, and key A remains orange in color. A similar circuit may be provided for the lower level light beams, to effect key color change to yellow, as referred to above. In FIG. 3, a thumb gap appears at 301.

I claim:

1. A photoelectric keyboard switch apparatus, comprising in combination:
    a) first means to produce and detect laterally directed and longitudinally spaced first light beams at a first level in a simulated keyboard area, which is open,
    b) second means to produce and detect longitudinally directed, laterally spaced second light beams at or proximate to said first level, in said area, whereby said first and second light beams produce a grid-like pattern having cross-over nodes,
    c) third means to produce and detect third light beams at a second level or levels, whereby user's finger interruption of a third beam occurs in conjunction with finger interruption of said first and second beams at or near one or more nodes,
    d) a frame defining and bounding said keying area which is generally rectangular,
    e) there being a gap through the frame extending between said open keying area and the exterior of the frame, and proximate a corner of said generally rectangular area,
    f) said gap located at both said first and second levels,
    g) said first, second and third means including light beam sources and light beam detectors carried by the frame to produce light beams crossing said area and said gap, for impingement on the detectors, whereby interruption of said beams by a user's finger reception in said area or a user's thumb reception in said gap may be detected by said detectors.

2. The combination of claim 1 including means to record said beam interruption.

3. The combination of claim 1 wherein said gap is sized to receive up and down motion of the user's thumb.

4. The combination of claim 3 wherein at least one of said light beams is provided at said gap.

5. The combination of claim 2 wherein said means to record beam interruption includes a computer having a display screen to display beam interruption.

6. The combination of claim 4 wherein said means to record beam interruption includes a computer having a display screen.

7. The combination of claim 1 wherein said frame has legs carrying said first, second and third means to produce and detect light beams, and there being other means to accommodate shifting of the positions of said first, second and third means relative to said legs, to adjust the positions of said light beams to the user's finger spacings.

8. The combination of claim 1 including VELCRO attachment means on the frame.

9. The combination of claim 1 wherein the frame has legs which have pivoted interconnection.

10. The combination of claim 1 including means to adjust the spacing between said levels.

11. The apparatus of claim 1 wherein said area has four corners, the gap located proximate one of said corners.

12. The combination of claim 1 wherein said beams include first lateral and longitudinal beams at a first level, in said area, and second longitudinal beams located generally beneath the first longitudinal beams and at a second level in said area.

13. The combination of claim 12 wherein said beam sources and beam detectors are carried to be relatively shiftable in at least one of the following modes:
    i) generally parallel to a plane defined by said first beams,
    ii) generally perpendicular to a plane defined by said first beams.

14. The combination of claim 5 wherein said screen has a local area to display keys corresponding to said nodes.

15. The combination of claim 14 including key color change means responsive to user's finger interruption of said beams at said nodes.

16. The combination of claim 15 wherein said local area has associated observable keys A, B, C, . . . ; said nodes include nodes A', B', C', . . . , at an upper level and corresponding to said respective keys A, B, C, . . . ; and said second longitudinal beams pass under nodes A', B' and C' corresponding to said respective keys A, B, C.

17. The combination of claim 12 including sound change means responsive to user's finger interruption of said beams at said second level.

18. The combination of claim 12 including light intensity change means responsive to user's finger interruptions of said beams at said nodes.

* * * * *